(12) United States Patent
Liaw

(10) Patent No.: US 12,457,796 B2
(45) Date of Patent: Oct. 28, 2025

(54) MANUFACTURING METHOD OF SEMICONDUCTOR DEVICE HAVING FRONTSIDE AND BACKSIDE CONTACTS

(71) Applicant: TAIWAN SEMICONDUCTOR MANUFACTURING COMPANY, LTD., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 635 days.

(21) Appl. No.: 17/745,251

(22) Filed: May 16, 2022

(65) Prior Publication Data

US 2023/0369133 A1 Nov. 16, 2023

(51) Int. Cl.
| | |
|---|---|
| *H10D 84/03* | (2025.01) |
| *H10D 30/01* | (2025.01) |
| *H10D 30/67* | (2025.01) |
| *H10D 62/10* | (2025.01) |
| *H10D 64/01* | (2025.01) |
| *H10D 64/23* | (2025.01) |
| *H10D 84/01* | (2025.01) |
| *H10D 84/85* | (2025.01) |

(52) U.S. Cl.
CPC ......... *H10D 84/038* (2025.01); *H10D 30/014* (2025.01); *H10D 30/031* (2025.01); *H10D 30/6729* (2025.01); *H10D 30/6735* (2025.01); *H10D 62/121* (2025.01); *H10D 64/01* (2025.01); *H10D 64/017* (2025.01); *H10D 64/258* (2025.01); *H10D 84/017* (2025.01); *H10D 84/0184* (2025.01); *H10D 84/0186* (2025.01); *H10D 84/85* (2025.01); *H10D 30/6757* (2025.01)

(58) Field of Classification Search
CPC .. H10D 84/038; H10D 84/0186; H10D 84/85; H10D 84/0184; H10D 84/017; H10D 30/014; H10D 30/6729; H10D 30/031; H10D 30/6735; H10D 30/6757; H10D 64/258; H10D 64/01; H10D 64/017; H10D 62/121
USPC ........................................................ 257/288
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Eric W Jones
(74) *Attorney, Agent, or Firm* — Cooper Legal Group, LLC

(57) ABSTRACT

A method includes forming a first transistor comprising a first channel region, a first gate structure surrounding the first channel region, and first source/drain regions on opposite sides of the first gate structure; forming a second transistor comprising a second channel region, a second gate structure surrounding the second channel region, and second source/drain regions on opposite sides of the second gate structure; forming a front-side contact on a top end of a first one of the first source/drain regions of the first transistor; forming a first back-side contact extending from a bottom end of the first one of the first source/drain regions of the first transistor to a bottom end of a first one of the second source/drain regions of the second transistor.

20 Claims, 88 Drawing Sheets

(56)  References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,613,953 B2 | 4/2017 | Liaw |
| 9,793,273 B2 | 10/2017 | Liaw |
| 9,805,985 B2 | 10/2017 | Liaw |
| 2018/0277542 A1* | 9/2018 | Liaw .................... H10D 84/853 |
| 2020/0105752 A1* | 4/2020 | Liaw .................. H10D 30/6757 |
| 2022/0093594 A1* | 3/2022 | Song ..................... H10D 84/85 |

* cited by examiner

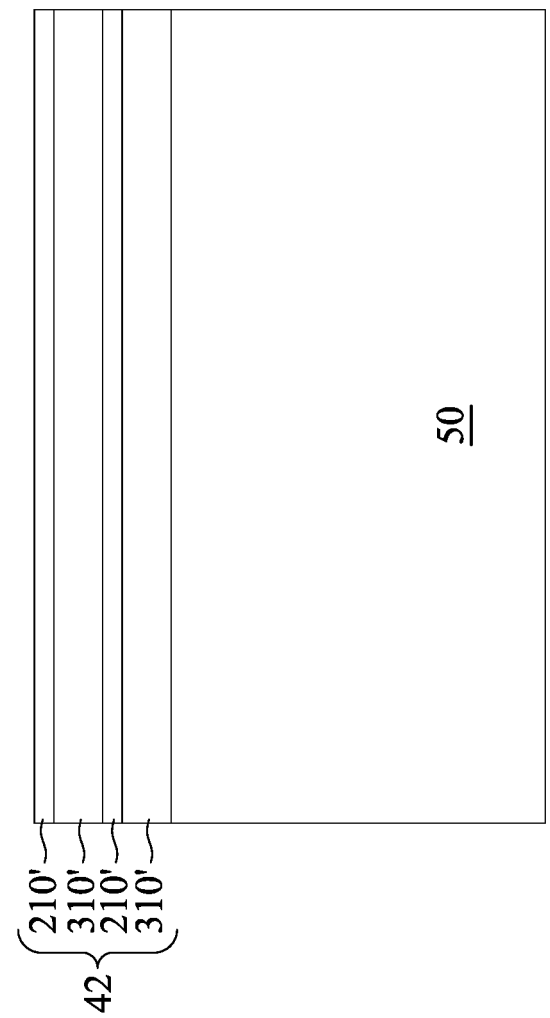

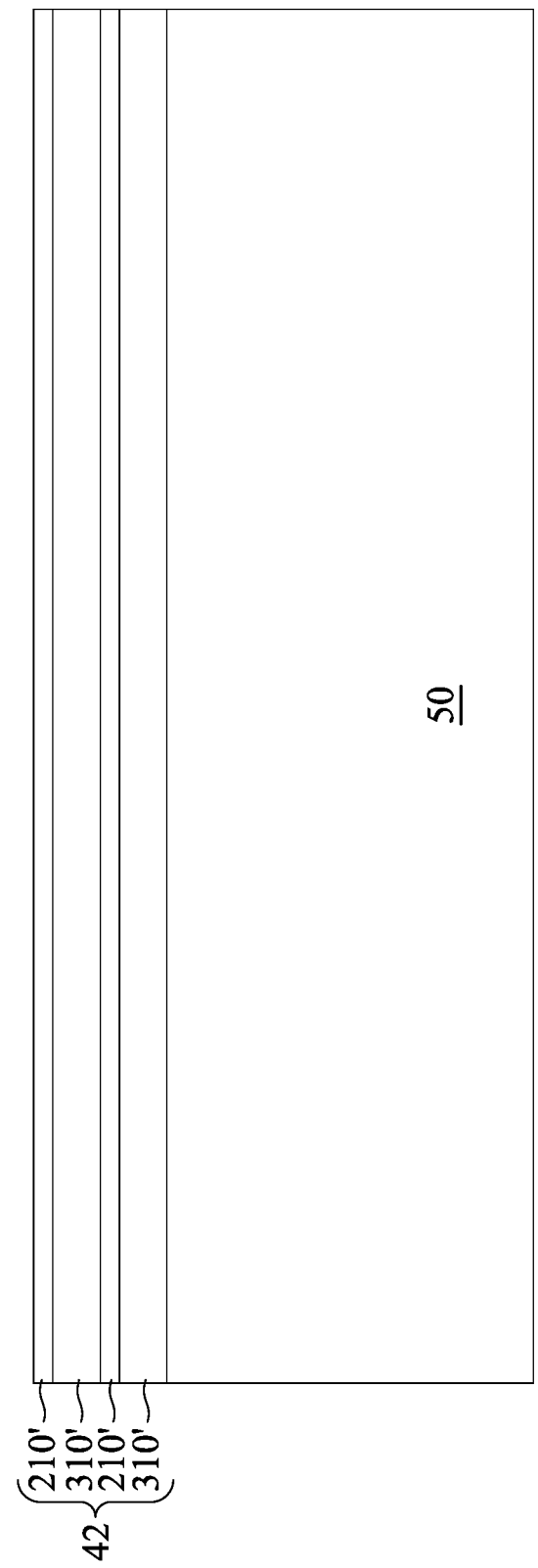

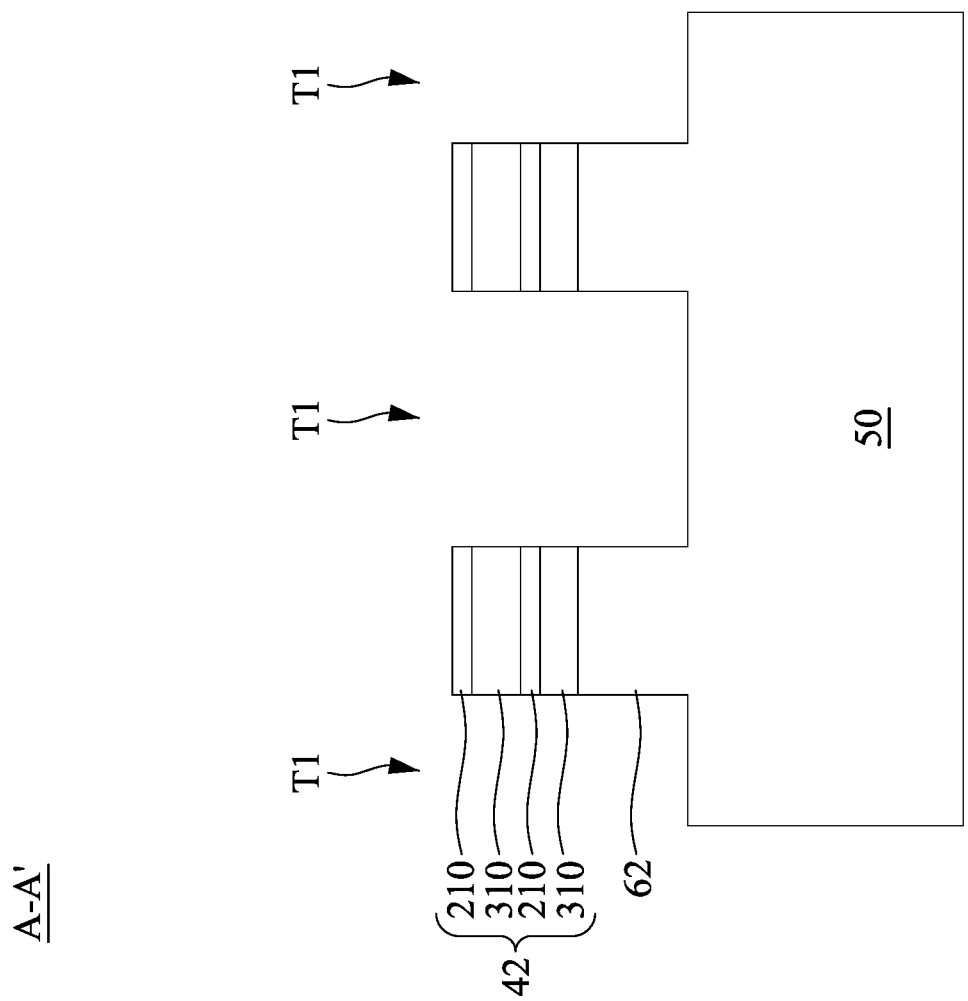

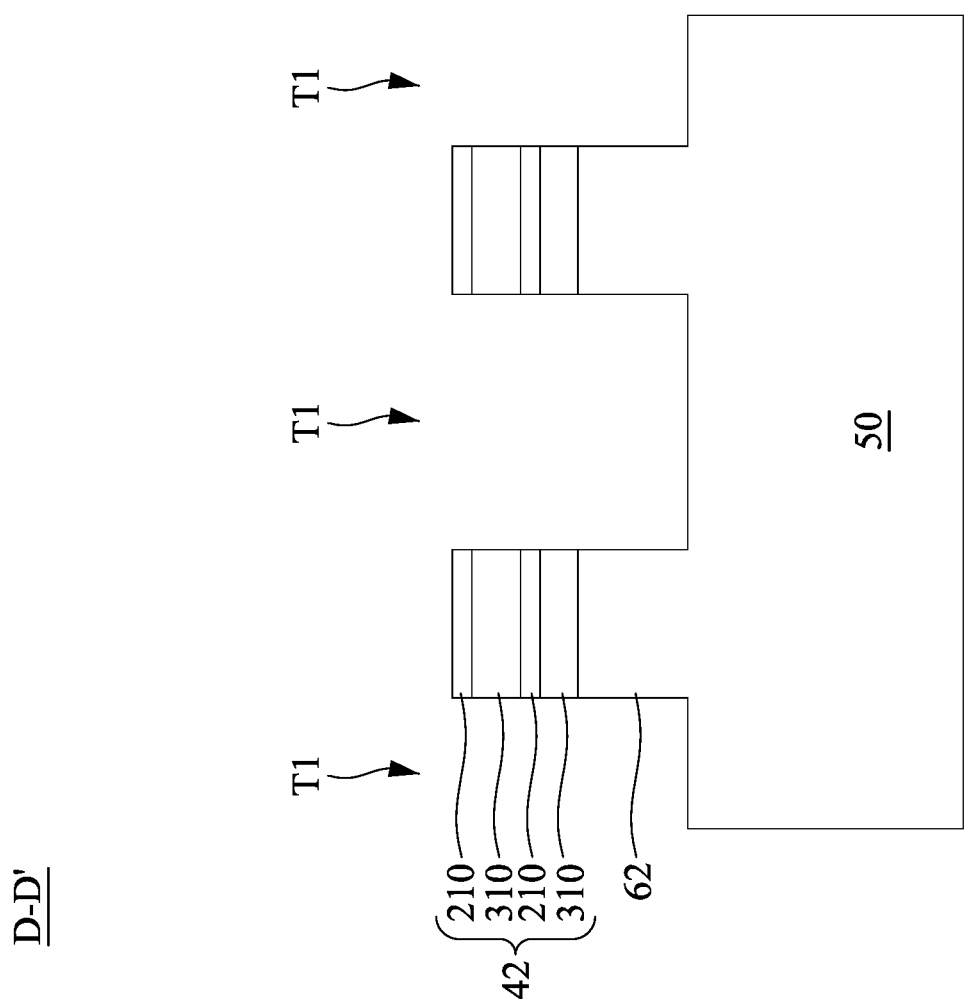

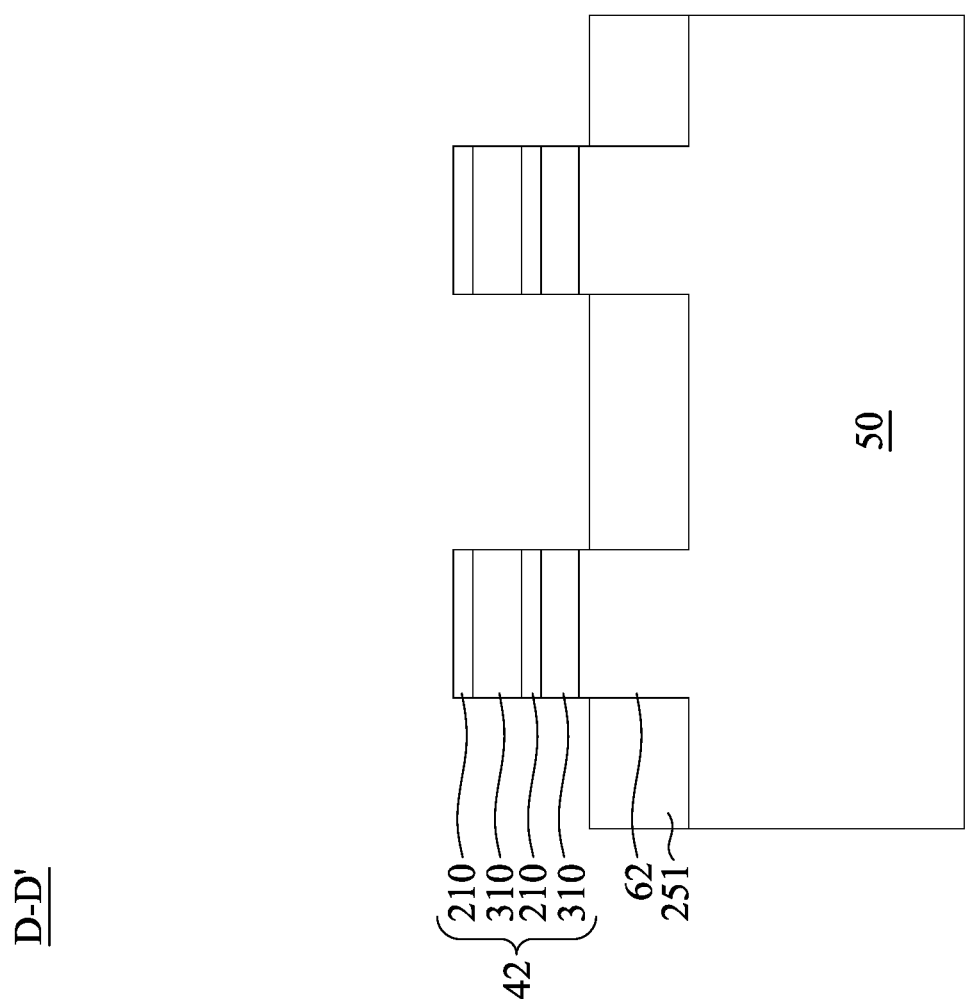

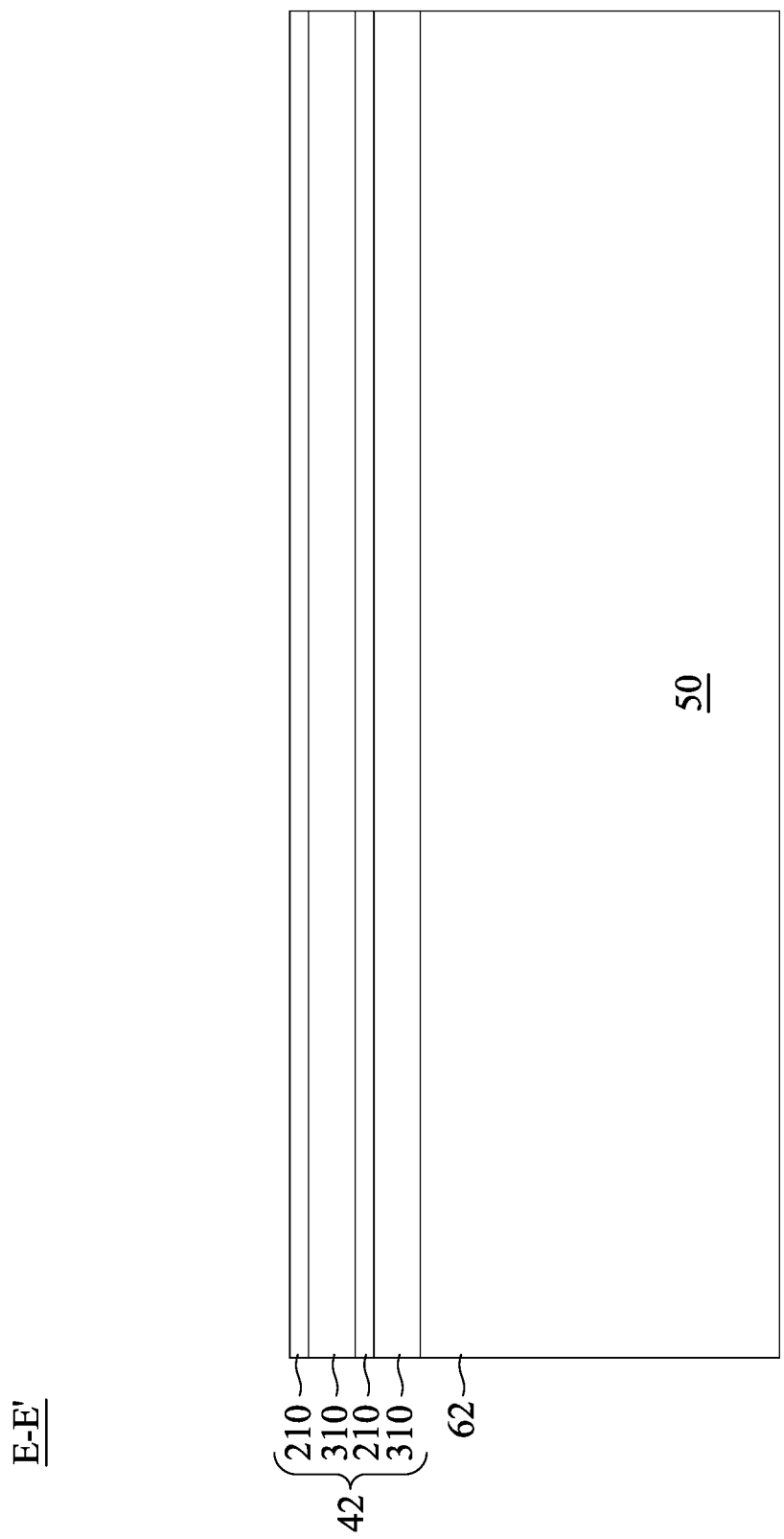

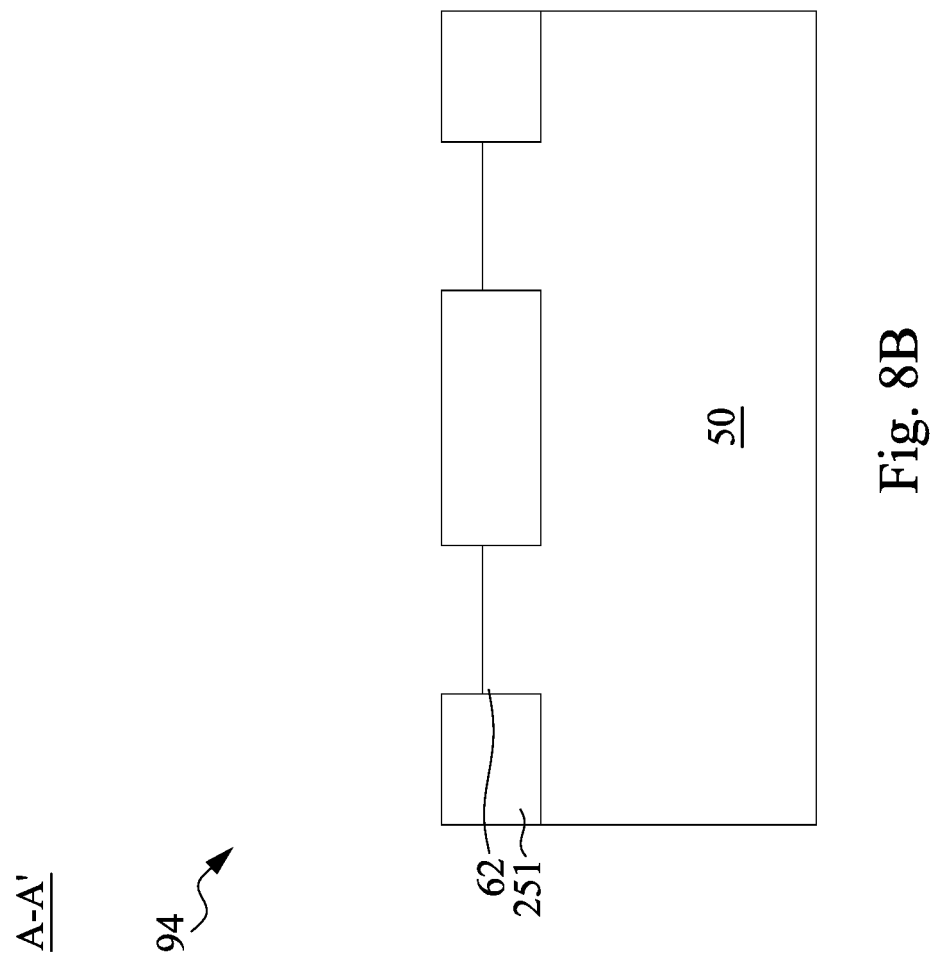

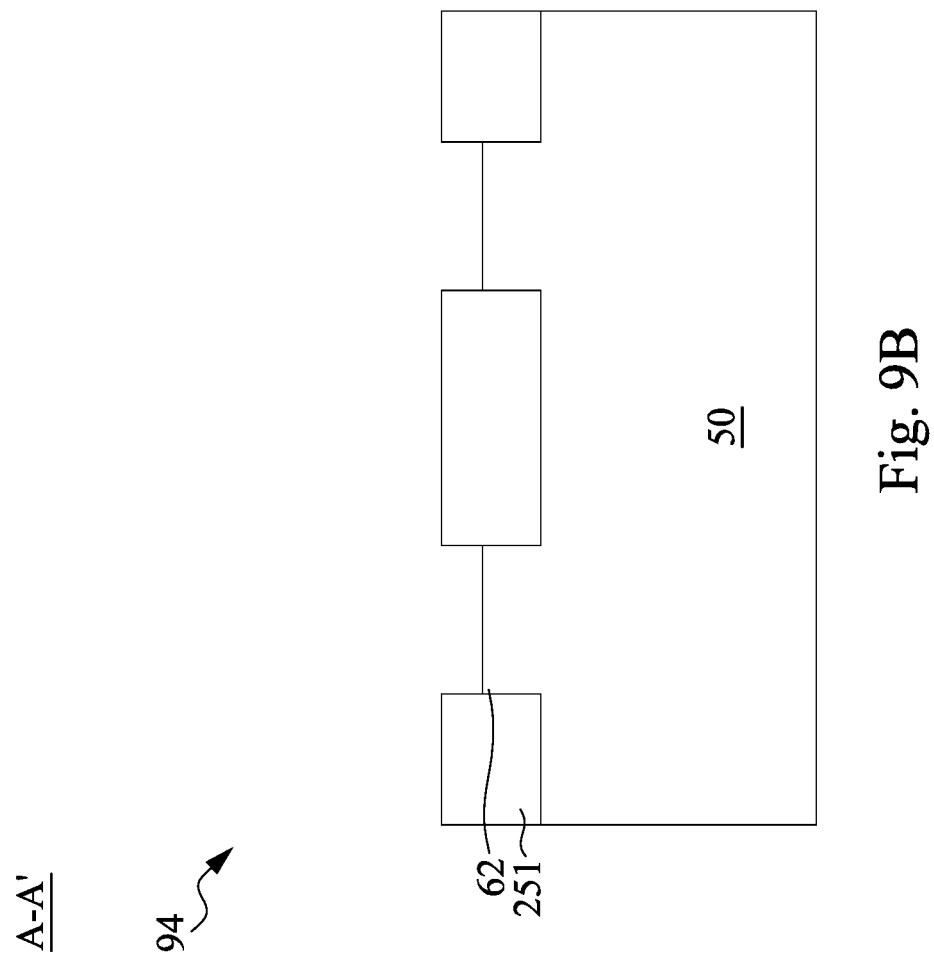

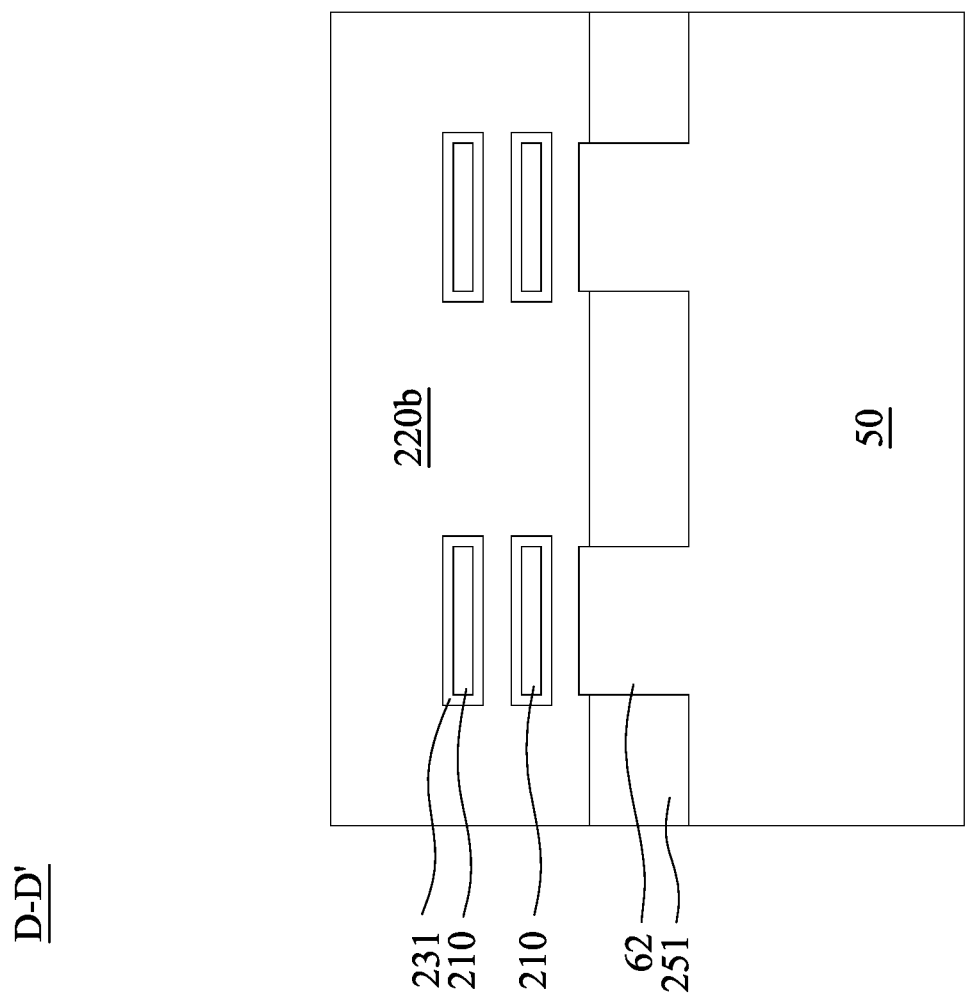

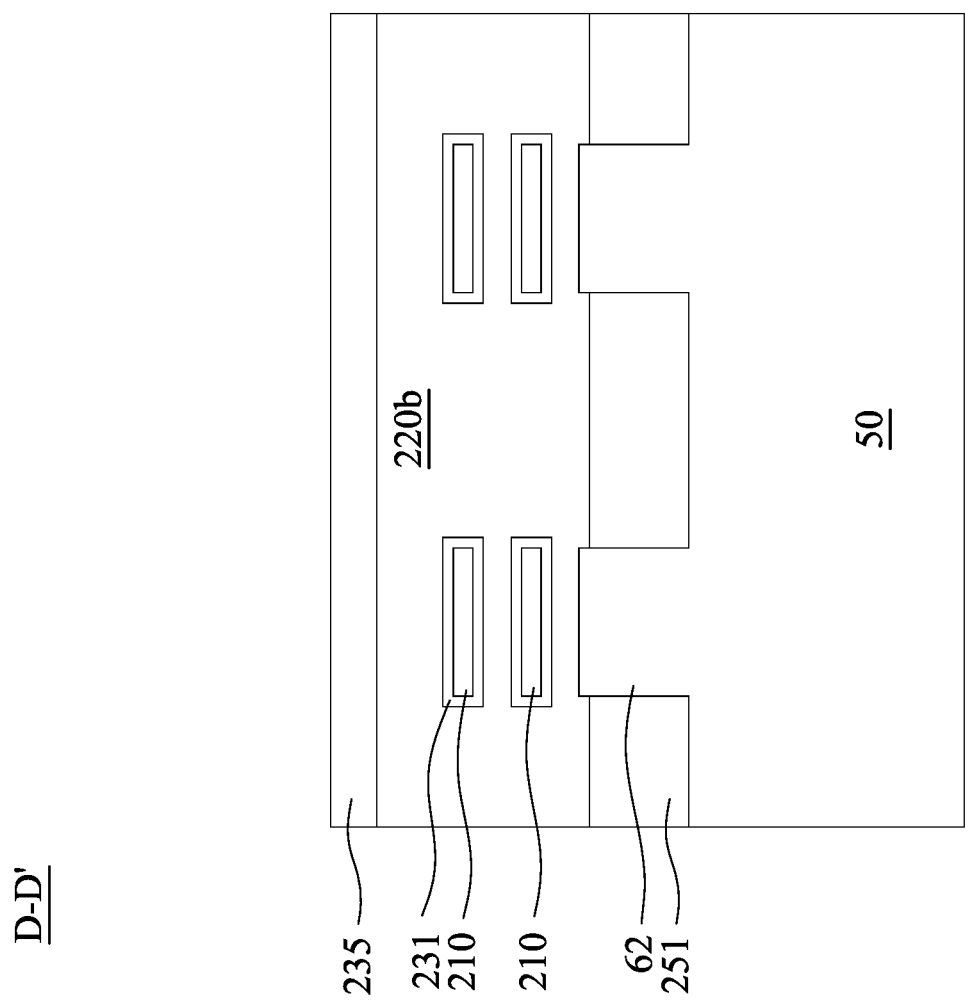

MANUFACTURING METHOD OF SEMICONDUCTOR DEVICE HAVING FRONTSIDE AND BACKSIDE CONTACTS

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4B, 5A, 6B, 7B, 8B, 9B, 10B, 11C, 12B, 13B, 14B, 15B, 16B, 17B, 18B, 19C, and 20C illustrate cross-sectional views obtained from reference cross-section A-A' in FIGS. 4A, 5A, 6A, 7A, 8A, 9A, 10A, 11A, 12A, 13A, 14A, 15A, 16A, 17A, 18A, 19A, and 20A, respectively.

FIGS. 4C, 5C, 6C, 7C, 8C, 9C, 10C, 11C, 12C, 13C, 14C, 15C, 16C, 17C, 18C, 19C, and 20C illustrate cross-sectional views obtained from reference cross-section D-D' in FIGS. 4A, 5A, 6A, 7A, 8A, 9A, 10A, 11A, 12A, 13A, 14A, 15A, 16A, 17A, 18A, 19A, and 20A, respectively.

FIGS. 4D, 5D, 6D, 7D, 8D, 9D, 10D, 11D, 12D, 13D, 14D, 15D, 16D, 17D, 18D, 19D, and 20D illustrate cross-sectional views obtained from reference cross-section E-E' in FIGS. 4A, 5A, 6A, 7A, 8A, 9A, 10A, 11A, 12A, 13A, 14A, 15A, 16A, 17A, 18A, 19A, and 20A, respectively.

DETAILED DESCRIPTION

Figure 1A:
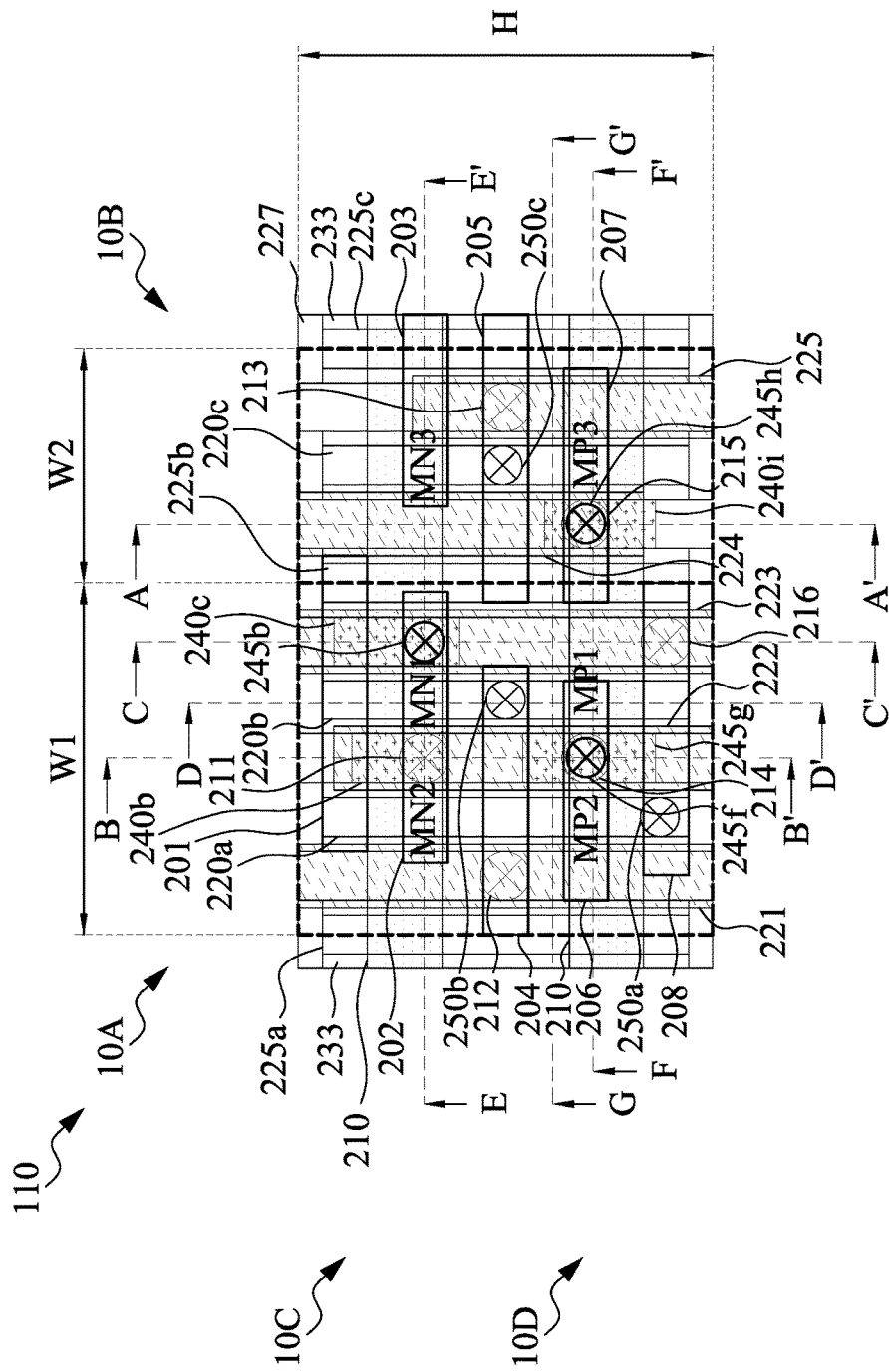
FIGS. 1A and 1B illustrate a cell array layout diagram of a logic circuit on a front side and a back side of a semiconductor structure, respectively, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography, processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, Vdd and Vss power routing may occupy too many routing resources and therefore impact the cell scaling as well as the performance of the IC structure (e.g., RC delay or IR drop).

Therefore, the present disclosure in various embodiments provides a metal line routing method to improve the functional density and operation performance on the IC structure. That is, a part of metal layers is transferred to the wafer back-side, so as to reduce the routing loading and improve the circuit density in a same chip area. In addition, the less metal tracks in the same chip area benefits the metal conductor RC performance. For example, the present disclosure provides a metal line routing method to move a common rectangular drain contact between two transistors from the wafer front-side to the wafer backside and to have a drain contact on a single drain region among the two transistors on the front-side and further electrically connected to the front side metal layers to receive data/signal. Therefore, a lateral overlapping area between the contact on the drain region and the gate structure can be reduced, which in turn improves capacitance between the contact and the gate structure and reduces the circuit density in a same chip area, and thereby achieving both high functional density and high speed applications in the IC structure.

Figure 1B:
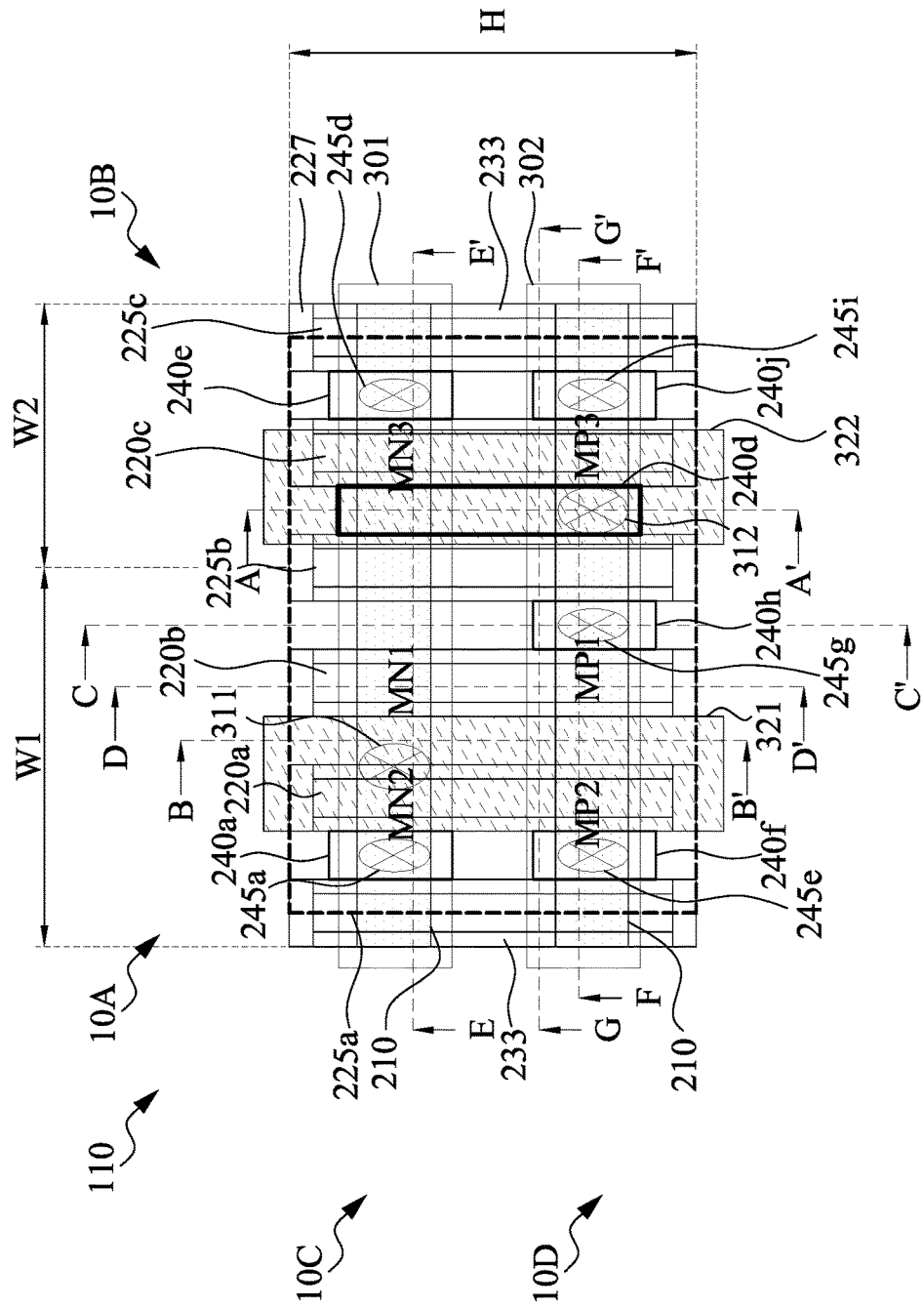

Reference is made to FIGS. 1A and 1B. FIGS. 1A and 1B illustrate a cell array layout diagram of a logic circuit 110 on a front side and a back side of the semiconductor structure, respectively, according to some embodiments of the present disclosure. As shown in FIGS. 1A and 1B, a first logic cell 10A and a second logic cell 10B in the logic circuit 110 are arranged in the same row. The outer boundary of each of the first logic cell 10A and the second logic cell 10B is illustrated using dashed lines. In some embodiments, the first logic cell 10A and the second logic cell 10B may have the same cell height H. In some embodiments, the cell width W1 of the first logic cell 10A may be wider than the cell width W2 of the second logic cell 10B. In FIGS. 1A and 1B, it should be noted that the configuration of the first logic cell 10A and the second logic cell 10B in the logic circuit 110 is used as an illustration, and not to limit the disclosure. In some embodiments, the row in the cell array of the logic circuit 110 may include more logic cells or fewer logic cells than the layout shown in FIGS. 1A and 1B. In some embodiments, the cell array of the logic circuit 110 may include more rows or fewer rows and more columns or fewer columns than the layout shown in FIGS. 1A and 1B. Each logic cell provides a circuit or portion thereof, exemplary functionality provided by the cells includes, but are not limited to NAND, NOR, AND, XOR, XNOR, SACN, inverter, Flip-Flop, latch, and/or other suitable logic or storage functions.

In some embodiments, the logic circuit 110 may include transistors MN1, MN2, and MN3 in a first conductivity type device region 10C and transistors MP1, MP2, and MP3 in a second conductivity type device region 10D. In some embodiments, the transistors MN1, MN2, MP1 and MP2 are in the first logic cell 10A, and the transistors MN3 and MP3 are in the second logic cell 10B. In some embodiments, the transistors MN1, MN2, and MN3 may be NMOS transistors with silicon channel regions, and the transistor MP1, MP2, and MP3 may be PMOS transistors with silicon channel regions. In some embodiments, the transistors MN1, MN2, MN3, MP1, MP2, and MP3 may be GAA FETs. The silicon channel regions of the NMOS and PMOS transistors are formed by semiconductor sheets 210. The semiconductor sheets 210 are stacked along the Z-direction (not shown) and are wrapped by the gate electrode, and the Z-direction is perpendicular to the plane formed by the X-direction and Y-direction.

As shown in FIGS. 1A and 1B, the first logic cell 10A includes dielectric-base gates 225a and 225b extending in the Y-direction and being dummy gates. The first logic cell 10A further includes gate electrodes 220a and 220b extending in the Y-direction and being arranged between the dielectric-base dummy gates 225a and 225b. The transistors MN1, MN2, MP1, and MP2 are surrounded by the dielectric-base dummy gates 225a and 225b. In other words, the dielectric-base dummy gates 225a and 225b are formed in the boundary of the first logic cell 10A. The material of the dielectric-base dummy gates 225a and 225b is different from that of the gate electrodes 220a and 220b. In some embodiments, the dielectric-base dummy gates 225a through 225b can be interchangeably referred to isolation structures/dielectric gates serving as circuit boundaries.

As shown in FIGS. 1A and 1B, the second logic cell 10B includes the dielectric-base gates 225b and 225c extending in the Y-direction and being dummy gates. The second logic cell 10B further includes a gate electrode 220c extending in the Y-direction and being arranged between the dielectric-base dummy gates 225b and 225c. The transistors MN3 and MP3 are surrounded by the dielectric-base dummy gates 225b and 225c. In other words, the dielectric-base dummy gates 225b and 225c are arranged in the boundary of the second logic cell 10B. Moreover, the dielectric-base dummy gate 225b is shared by the first logic cell 10A and the second logic cell 10B, i.e., the first logic cell 10A and the second logic cell 10B in the same row are isolated (or separated) from each other by the dielectric-base dummy gate 225b. The spacers 233 are formed on sidewalls of the dielectric-base gates 225a through 225c and the gate electrodes 220a through 220c.

As shown in FIG. 1A illustrating the logic circuit 110 on the front side of the semiconductor structure, the gate electrode 220a in the first logic cell 10A is connected to an overlying level (e.g., conductive line 208) through a gate via 250a. The gate electrode 220b in the first logic cell 10A is connected to an overlying level (e.g., conductive line 204) through a gate via 250b. The gate electrode 220c in the second logic cell 10B is connected to an overlying level (e.g., conductive line 205) through the gate via 250c. For the transistor MN1, the source/drain region 218c (see FIG. 2E) between the gate electrode 220b and the dielectric-base dummy gates 225b is coupled to an overlying level (e.g., conductive line 202) through a source drain contact 240c and a source/drain via 245b. The share source/drain region 218b (see FIG. 2E) of the transistors MN1 and MN2 are coupled to an overlying level (e.g., conductive line 202) through a source/drain contact 240b. The share source/drain region 218g (see FIG. 2F) of the transistors MP1 and MP2 are coupled to an overlying level (e.g., conductive line 206) through a source/drain contact 240g and a source drain via 245f. For the transistor MP3, the source/drain region 218i (see FIG. 2F) between the gate electrode 220c and the dielectric-base dummy gates 225b is coupled to an overlying level (e.g., conductive line 207) through a source/drain contact 240i and a source/drain via 245h.

In FIG. 1A, the logic circuit 110 on the front side of the semiconductor structure further includes conductive lines 201, 202, 203, 204, 205, 206, 207, and 208 extending in the X direction. In some embodiments, the conductive lines 201, 202, 203, 204, 205, 206, 207, and 208 are in a first interconnection layer of the logic circuit 110, such as a first metal layer on the front side of the semiconductor structure. The conductive lines 202, 206, and 207 overlap and are electrically connected to the source/drain contacts 240c, 240g, and 240i through the source/drain vias 245b, 245f, and 245h, respectively. The conductive lines 204, 205, and 208 are electrically connected to the gate electrodes 220b, 220c, and 220a through the gate vias 250b, 250c, and 250a, respectively. The logic circuit 110 on the front side of the semiconductor structure further includes conductive vias 211, 212, 213, 214, 215, and 216. In some embodiments, the conductive vias 211, 212, 213, 214, 215, and 216 are connected between the first interconnection layer and a second interconnection layer over the first interconnection layer. The logic circuit 110 on the front side of the semiconductor structure further includes conductive lines 221, 222, 223, 224, and 225 extending in the Y direction. In some embodiments, the conductive lines 221, 222, 223, 224, and 225 are in a second interconnection layer of the logic circuit 110, such as a second metal layer over the first metal layer on the front side of the semiconductor structure. The conductive lines 221, 223, 224, and 225 overlap and are electrically connected to the underlying conductive lines 204, 208, 207, and 205 through the conductive vias 212, 216, 215, and 213, respectively. The conductive line 222 overlaps and is electrically connected to the underlying conductive lines 202 and 206 through the conductive vias 211 and 214. In some embodiments, materials of the conductive lines 201, 202, 205, 206, 207, 208, 221, 222, 223, 224, and 225 and conductive vias 211, 212, 213, 214, 215, and 216 on the front side of the semiconductor structure may include Cu, Co, Ru, Pt, Al, W, Ti, TaN, TiN, or any combinations thereof.

As shown in FIG. 1B illustrating the logic circuit 110 on the back side of the semiconductor structure, for the transistor MN2, the source/drain region 218a (see FIG. 2E) between the gate electrode 220a and the dielectric-base dummy gates 225a is coupled to an underlying level (e.g., conductive line 301) through the source/drain contact 240a and a source/drain via 245a. For the transistor MP1, the source/drain region 218h (see FIG. 2F) between the gate electrode 220b and the dielectric-base dummy gates 225b is coupled to an underlying level (e.g., conductive line 302) through a source/drain contact 240h and a source/drain via 245g. In some embodiments, the conductive line 301 and the conductive line 302 can be interchangeably referred to a back-side Vss conductor and a back-side Vdd conductor, respectively. For the transistor MP2, the source/drain region 218f (see FIG. 2F) between the gate electrode 220a and the dielectric-base dummy gates 225a is coupled to an underlying level (e.g., conductive line 302) through a source/drain contact 240f and a source/drain via 245e. For the transistor MN3, the source/drain region 218e (see FIG. 2E) between the gate electrode 220c and the dielectric-base dummy gates 225c is coupled to an underlying level (e.g., conductive line 301) through the a source/drain contact 240e and a source/drain via 245d. For the transistor MP3, the source/drain region 218j (see FIG. 2F) between the gate electrode 220c and the dielectric-base dummy gates 225c is coupled to an underlying level (e.g., conductive line 302) through the a source/drain contact 240j and a source/drain via 245i. In some embodiments, the source/drain contacts 240e and 240j can be interchangeably referred to source node contact layers electrically connected to the back-side Vss conductor (e.g., the conductive line 301) and the to the back-side Vdd conductor (e.g., the conductive line 302).

For the transistors MN3 and MP3, the source/drain regions 218d and 218i (see FIGS. 2E and 2F) between the gate electrode 220c and the dielectric-base dummy gates 225b are coupled to an underlying level (e.g., conductive line 302) through a common source/drain contact 240d and a source/drain via 245c. Therefore, the source/drain region 218i has both front-side contact (e.g., contact 240i) and back-side contact (e.g., contact 240d) landed upon. The common source/drain contact 240d is in a position lower than the gate structures of the transistors MN3 and MP3

(e.g., gate electrode 220c), and therefore an lateral overlapping area therebetween can be reduced or omitted, which in turn improves capacitance between the common source/drain contact and the gate structure. In some embodiments, the common source/drain contact 240d can be interchangeably referred to a common drain contact, a common drain node, or a local connection back-side contact. The common source/drain contact 240d may have a rectangular profile from a top view and have a longitudinal axis in parallel with a longitudinal axis of the gate electrode 220c from a top view. In some embodiments, the source/drain regions 218d and 218i can be interchangeably referred to drain regions, and the source/drain contact 240i overlying the common drain contact 240d can be interchangeably referred to an extra drain contact. The source/drain contact 240i non-overlaps the source/drain region 218d.

The present disclosure provides a metal line routing method to move the common rectangular source/drain contact 240d between two transistors MN3 and MP3 from the front-side to the back side of the wafer and to have the drain contact 240i on a single source/drain region 218i among the two transistors MN3 and MP3 on the wafer front-side and further electrically connected to the front side metal layers (e.g., conductive line 224) to receive data/signal. The source/drain contact 240d is in a position lower than the gate electrode 220c and has a longer length than the source/drain contact 240i in a lengthwise direction of the gate electrode 220c from the top view. Therefore, a lateral overlapping area between the contact on the source/drain region 218i and the gate structure (e.g., gate electrode 220c) can be reduced, which in turn improves capacitance between the contact and the gate structure (e.g., gate electrode 220c) and reduces the circuit density in a same chip area, and thereby achieving both high functional density and high speed applications in the IC structure.

In some embodiments, the source/drain regions 218f, 218g, 218h, 218i, and 218j (see FIG. 2F) of the transistors MP1 through MP3 may include boron-doped SiGe, boron-doped SiGeC, boron-doped Ge, boron-doped Si, or combinations thereof. In some embodiments, the boron atomic concentration of the source/drain regions 218f, 218g, 218h, 218i, and/or 218j may be within a range of 1E19/cm$^3$ to about 6E20/cm$^3$. In some embodiments, the Ge atomic concentration of the source/drain regions is within a range of about 36% to about 85%. In some embodiments, the source/drain regions 218a, 218b, 218c, 218d, and 218e (see FIG. 2E) of the transistors MN1 through MN3 may include SiP, SiC, SiPC, SiAs, Si, or a combination thereof. In some embodiments, the phosphorus atomic concentration (or arsenic, or both) of the source/drain regions 218f, 218g, 218h, 218i, and/or 218j may be within a range of 2E19/cm$^3$ to about 3E21/cm$^3$.

In FIG. 1B, the logic circuit 110 on the back side of the semiconductor structure further includes conductive lines 301 and 302 extending in the X direction. In some embodiments, the conductive lines 301 and 302 are in a third interconnection layer of the logic circuit 110, such as a first metal layer on the back side of the semiconductor structure. The conductive line 301 overlaps and is electrically connected to the source/drain contacts 240a and 240e respectively through the source/drain vias 245a and 245d. The conductive line 302 overlaps and is electrically connected to the source/drain contacts 240f, 240h, and 240j respective (through the source/drain vias 245f, 245g, and 245i. The logic circuit 110 on the back side of the semiconductor structure further includes conductive vias 311 and 312. In some embodiments, the conductive vias 311 and 312 are connected between the third interconnection layer and a fourth interconnection layer over the third interconnection layer. The logic circuit 110 on the back side of the semiconductor structure further includes conductive lines 321 and 322 extending in the Y direction. In some embodiments, the conductive lines 321 and 322 are in the fourth interconnection layer of the logic circuit 110, such as a second metal layer over the first metal layer on the back side of the semiconductor structure. The conductive lines 321 and 322 overlap and are electrically connected to the conductive lines 301 and 302 through the conductive vias 311 and 312, respectively. In some embodiments, materials of the conductive lines 301, 302, 321, and 322 and conductive vias 311 and 312 on the back side of the semiconductor structure may include Cu, Co, Ru, Pt, Al, W, Ti, TaN, TiN, or any combinations thereof.

In some embodiments, the layouts as shown in FIGS. 1A and 1B are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 2A:
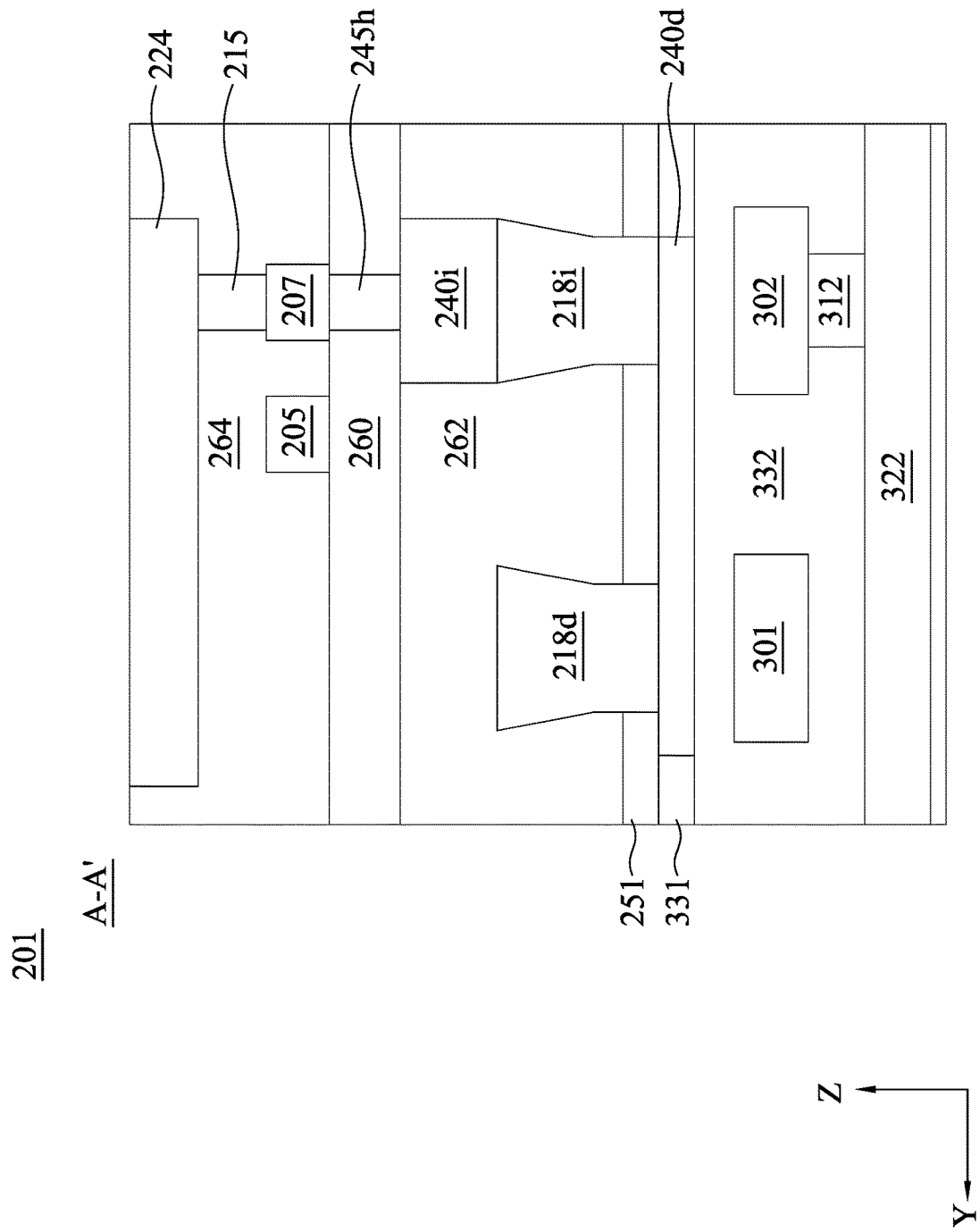
FIGS. 2A, 2B, 2C, 2D, 2E, 2F, and 2G illustrate cross-sectional views obtained from reference cross-section A-A', B-B', C-C', D-D', E-E', F-F', G-G' in FIGS. 1A and 1B, respectively.
Figure 2B:
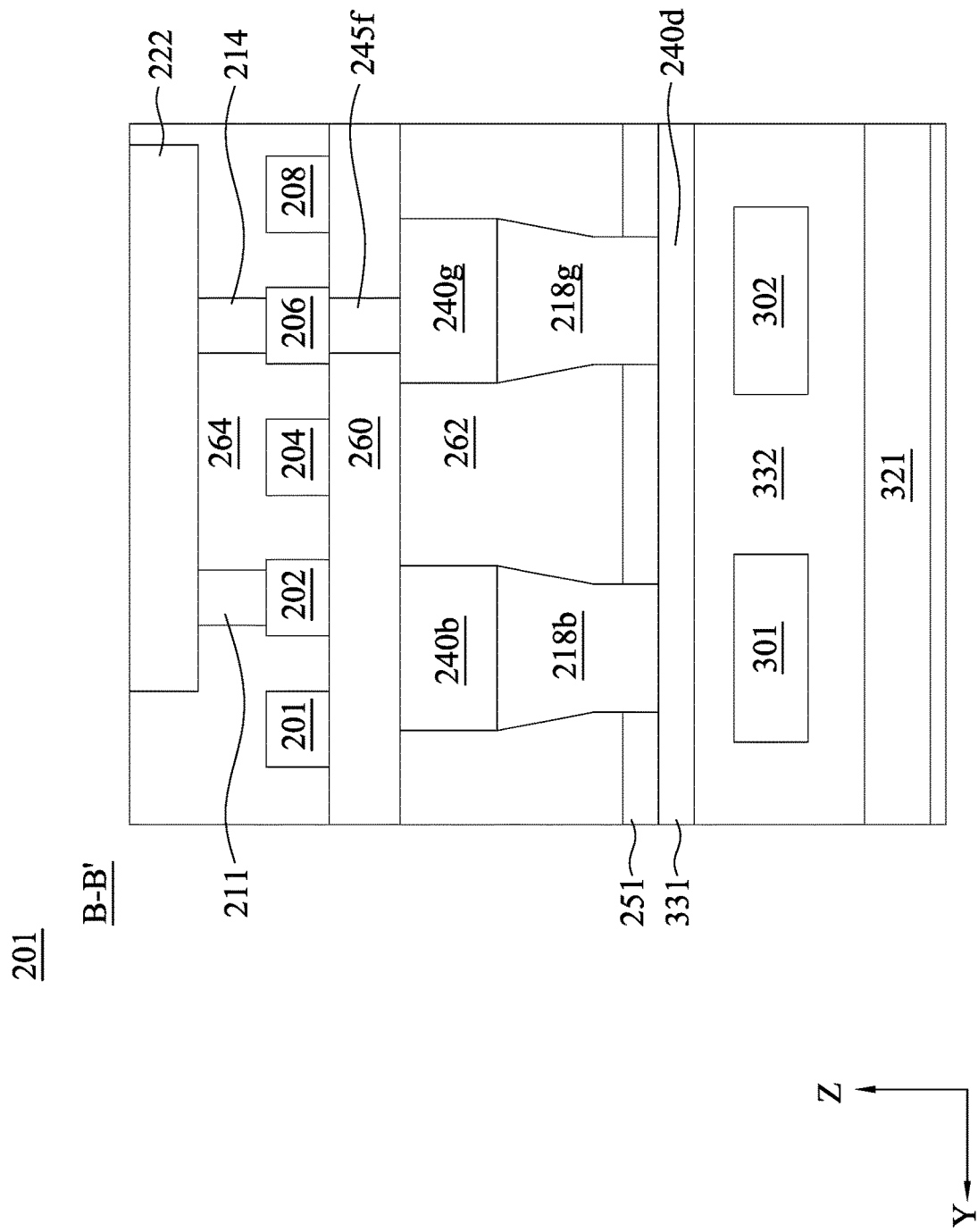
Figure 2C:
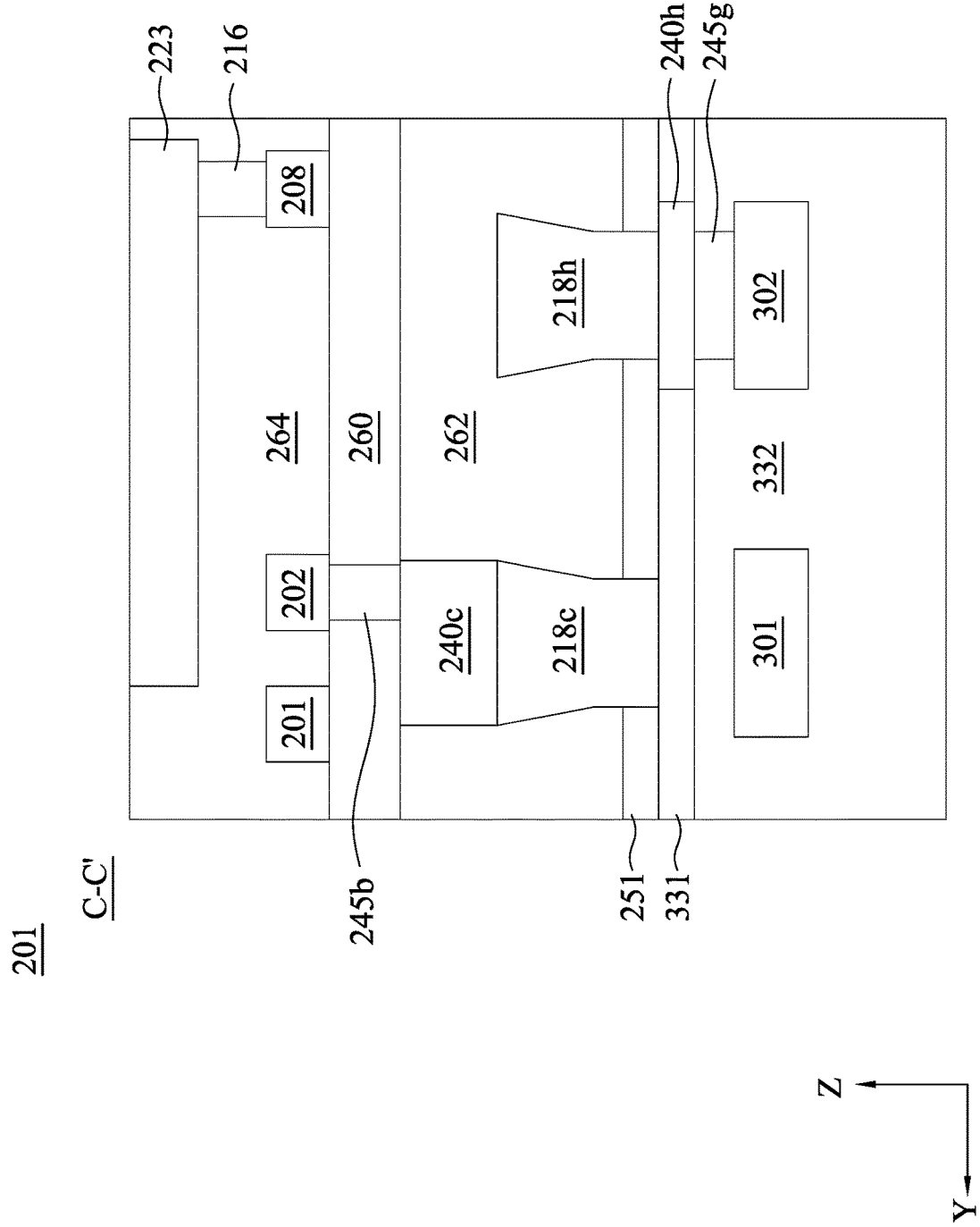

Reference is made to FIGS. 2A, 2B, and 2C. FIGS. 2A, 2B, and 2C illustrate cross-sectional views obtained from reference cross-section A-A', B-B', C-C' in FIGS. 1A and 1B, respectively. As shown in FIGS. 2A, 2B, and 2C, the source/drain regions 218d, 218i (see FIG. 2A), the source/drain regions 218b, 218g (see FIG. 2B), and the source/drain regions 218c, 218h (see FIG. 2C) are formed over the back-side dielectric 331 and lower portions thereof are laterally surrounded by a shallow trench isolation (STI) structure 251. In some embodiments, the source/drain regions 218b, 218c, 218d are doped with dopants having a opposite conductivity type from the source/drain regions 218g, 218h, 218i. For example, the source/drain regions 218b, 218c, 218d are doped with N-type dopants, and the source/drain regions 218g, 218h, 218i are doped with P-type dopants. In some embodiments, the source/drain regions 218b, 218c, 218d, 218g, 218h, 218i may include materials and/or dopants that achieve desired tensile stress and/or compressive stress in the channel region. In some embodiments, the source/drain regions 218f, 218g, 218h, 218i and 218j include Si with Boron (e.g., $B_{11}$) content. For example, the source drain regions 218f, 218g, 218h, 218i and 218j may be formed by epitaxially growing Boron in Si material. In some embodiments, the source/drain regions 218a through 218j can be interchangeably referred to epitaxial structures or source/drain patterns. For example, the source/drain regions 218d and 218i can be interchangeably referred to drain patterns, and the source/drain regions 218e and 218j can be interchangeably referred to source patterns. In some embodiments, the source/drain regions 218b, 218c, 218d, 218g, 218h, 218i are formed over the STI structure 251 after a fin recess process (for example, an etch back process), such that the source/drain regions 218b, 218c, 218d, 218g, 218h, 218i are grown from recessed fins (not shown).

As shown in FIGS. 2A, 2B, and 2C, on the front side of the semiconductor structure, inter-layer dielectric (ILD) layers 262, 260 and an inter-metal dielectric (IMD) layer 264 are deposited over the source/gain regions 218b, 218c, 218d, 218g, 218h, 218i in sequence. In FIG. 2A, the conductive lines 205 and 207 are formed over the source/drain regions 218*d*, 218*i* and in the IMD layer 264. The source/drain region 218*i* is electrically connected to an overlying level (e.g., conductive line 207) through the source/drain contact 240*i* and the source/drain via 245*h*. The conductive line 207 is electrically connected to an overlying level (e.g., conductive line 224) through a conductive via 215. In FIG. 2B, the conductive lines 201, 202, 204, 206, 208 are formed over the source/drain regions 218*b*, 218*g*. The source/drain region 218*g* is electrically connected to an overlying level (e.g., conductive line 206) through the source/drain contact 240*g* and the source/drain via 245*f*. The source/drain contact 240*b* lands on a top of the source/drain regions 218*b*. The conductive lines 202, 206 are electrically connected to an overlying level (e.g., conductive line 222) through a conductive vias 211, 214, respectively. In FIG. 2C the conductive lines 201, 202, 208 are formed over the source/drain regions 218*c*, 218*h*. The source/drain region 218*c* is electrically connected to an overlying level (e.g., conductive line 202) through the source/drain contact 240*c* and the source/drain via 245*b*. The conductive line 208 is electrically connected to an overlying level (e.g., conductive line 223) through a conductive via 216.

As shown in FIGS. 2A, 2B, and 2C, on the back side of the semiconductor structure, the back-side dielectric 331 and an IMD layer 332 are deposited over the source/drain regions 218*b*, 218*c*, 218*d*, 218*g*, 218*h*, 218*i* in sequence. The conductive lines 301 and 302 are formed in the IMD layer 332. In FIG. 2A, the source/drain regions 218*d* and 218*i* are in connection with each other through the source/drain contact 240*d*. In some embodiments, the source/drain contact 240*d* can be interchangeably referred to as a common drain node or a local connection contact. The conductive line 302 is electrically connected to an underlying level (e.g., conductive line 322) through a conductive via 312. In FIG. 2C, the source/drain region 218*h* is electrically connected to an underlying level (e.g., conductive line 302) through the source/drain contact 240*h* and the source/drain via 245*g*.

Figure 2D:
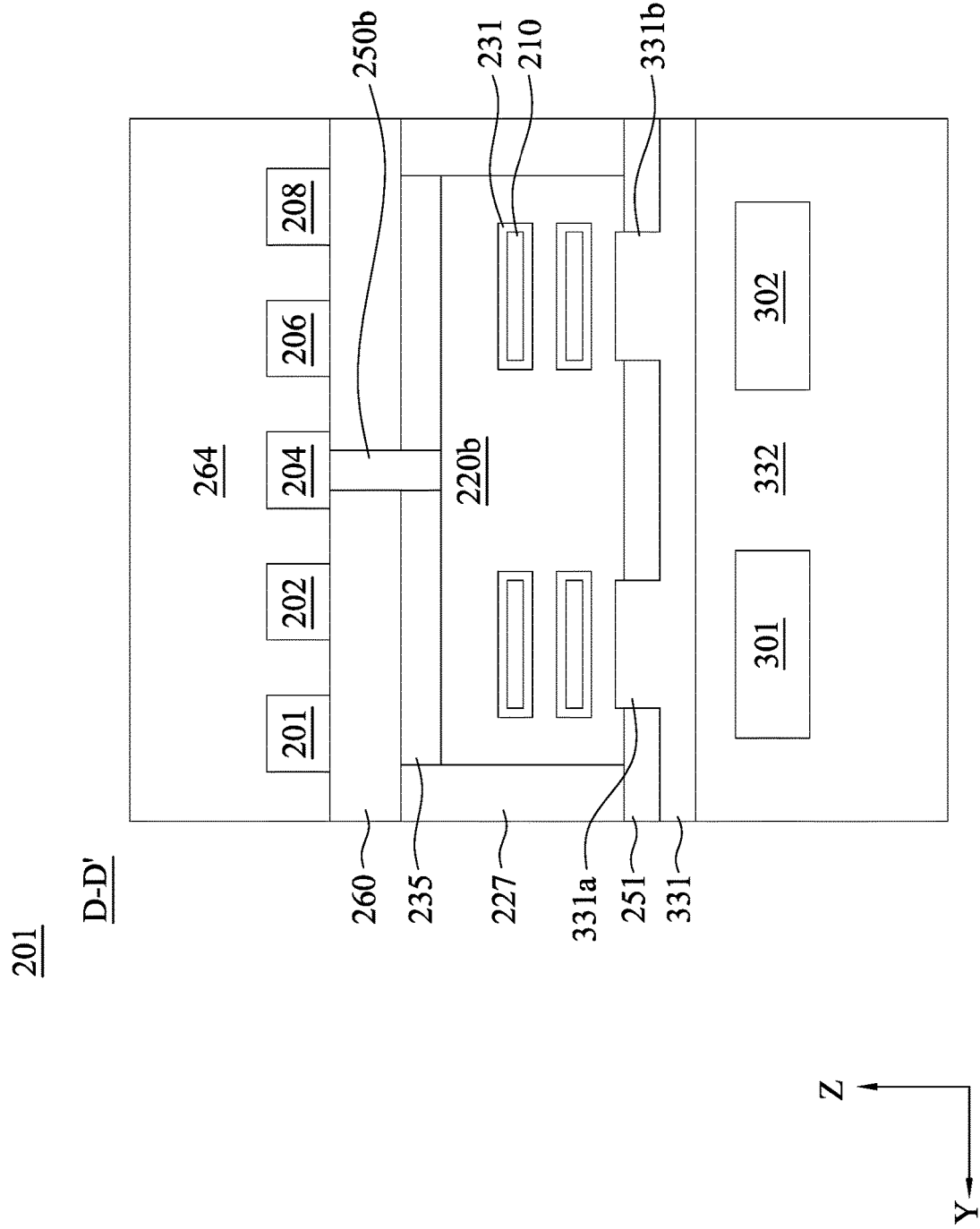

Reference is made to FIG. 2D. FIG. 2D illustrates a cross-sectional view obtained from reference cross-section D-D' in FIGS. 1A and 1B. The semiconductor sheets 210 are formed to be stacked along the Z-direction over the back-side dielectric 331 and are surrounded by the gate electrode 220*b*. A gate dielectric layer 231 is formed between the semiconductor sheets 210 and the gate electrode 220*b*. In some embodiments, the gate dielectric layer 231 may be also formed over the back-side dielectric 331. In some embodiments, the thickness of the semiconductor sheets 210 may be within a range about 3 nm to about 10 nm. In some embodiments, the semiconductor sheets 210 may be Si-base nanowire.

In some embodiments, the gate electrode 220*b* may be made of conductive material, such as aluminum (Al), copper (Cu), tungsten (W), titanium (Ti), tantalum (Ta), or other applicable materials. In some embodiments, the gate structure of the gate electrode 220*b* may include multiple material structure selected from a group consisting of poly gate/SiON structure, metals/high-K dielectric structure, Al/refractory metals/high-K dielectric structure, silicide/high-K dielectric structure, or combination. In some embodiments, the gate electrode 220*b* is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). In some embodiments, the gate dielectric layer 231 is made of silicon oxide ($SiO_x$), silicon nitride ($Si_xN_y$), silicon oxynitride (SiON), dielectric material(s) with high dielectric constant (high-k), or a combination thereof. In some embodiments, the gate dielectric layer 231 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 231 includes Lanthanum (La) dopant.

One or more work-function layers (not shown) are formed between the gate dielectric layer 231 and the gate-electrode 220*b*. In some embodiments the work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The dielectric regions 227 are formed on opposite ends of the dielectric-base gates 225*a* through 225*c* and the gate electrodes 220*a* through 220*c*. As described above, the gate electrode 220*b* extends in the Y-direction between the dielectric regions 227. In some embodiments, each dielectric region 227 is a gate-cut structure for the gate structure corresponding to the gate electrode 220*b*, and the gate-cut structure is formed by a cut metal gate (CMG) process.

A hard mask layer 235 is formed over the gate electrode 220*b* and between the dielectric regions 227. In some embodiments, the hard mask layer 235 can be interchangeably referred to a gate top dielectric. In some embodiments, the hard mask layer 235 may be made of dielectric material. The ILD layer 260 is deposited over the hard mask layer 235 and the dielectric regions 227, and then the IMD layer 264 is deposited over 260. In some embodiments, the ILD layer 260 or 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The gate via 250*b* is formed in the ILD layer 260 and the hard mask layer 235. The conductive lines 201, 202, 204, 206, 208 are formed in IMD layer 264. The gate electrode 220*b* is electrically connected to an overlying level (e.g., conductive line 204) through the gate via 250*b* for receiving the input signal of the standard cell corresponding to the first logic cell 10A. On the back side of the semiconductor structure, the back-side dielectric 331 and an IMD layer 332 are deposited over the gate electrode 220*b* in sequence. The conductive lines 301 and 302 are formed in the IMD layer 332 and overlap the semiconductor sheets 210. The back-side dielectric 331 have protruding strips that protrude toward the semiconductor sheets 210.

Figure 2E:
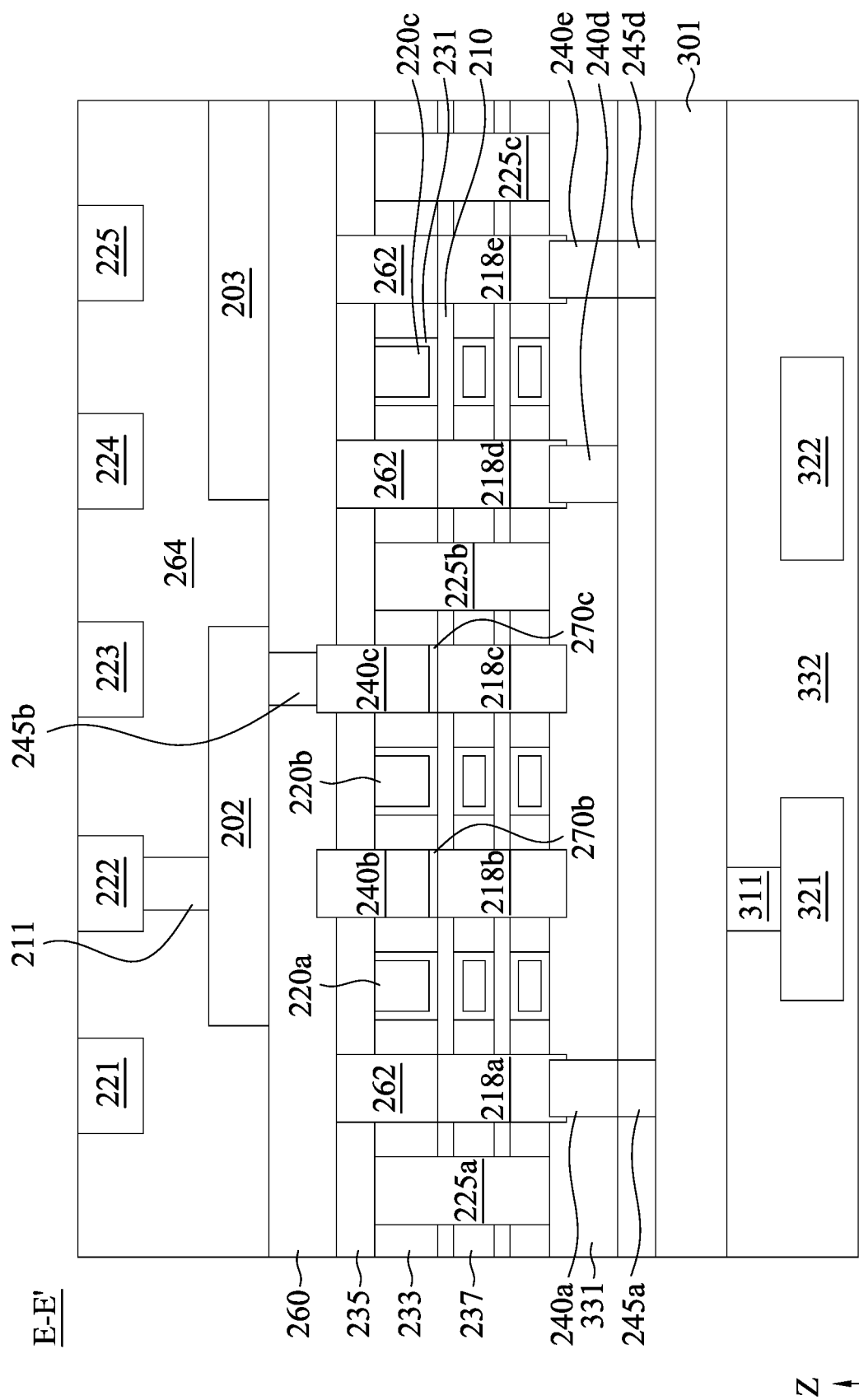
Figure 2F:
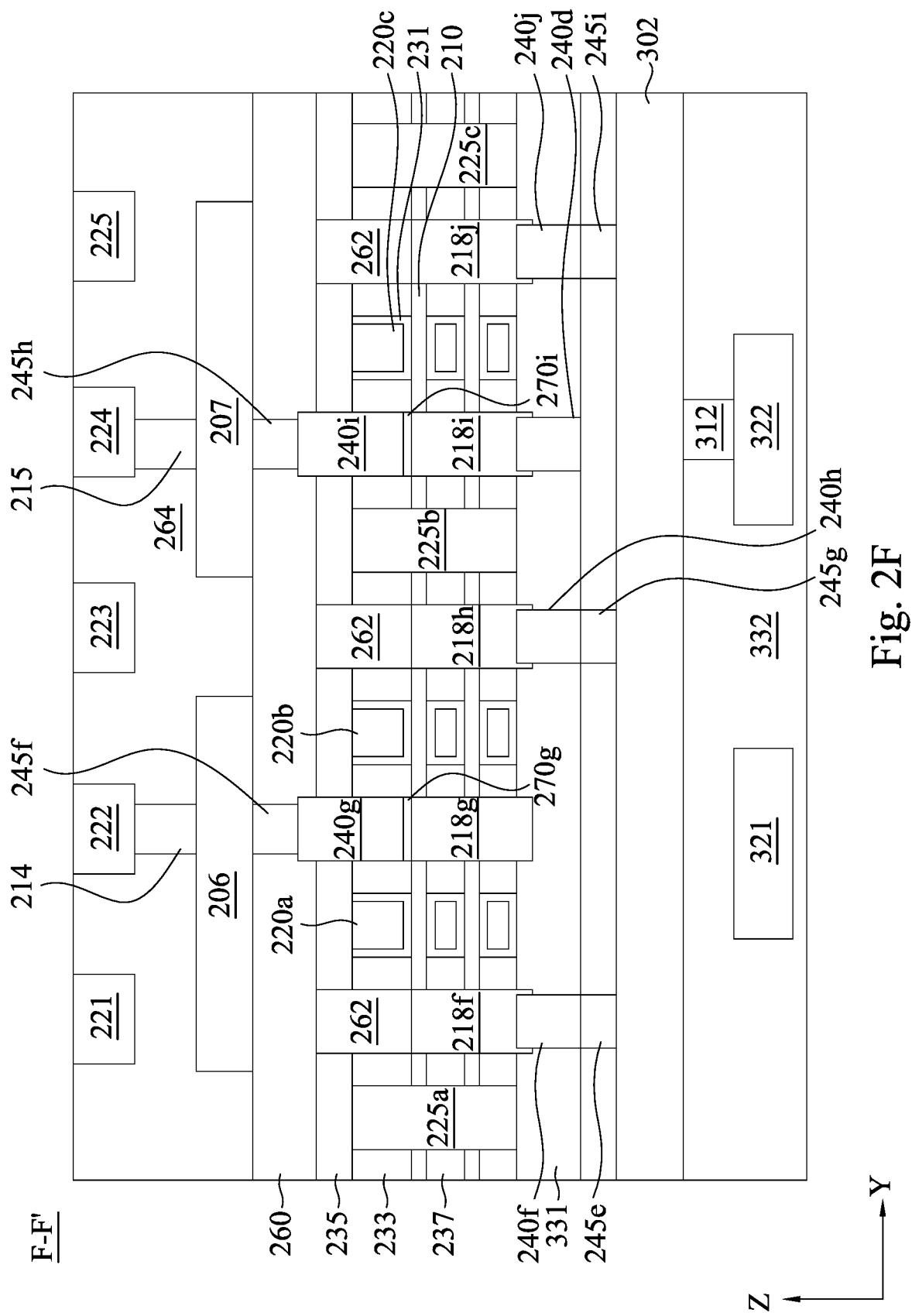
Figure 2G:
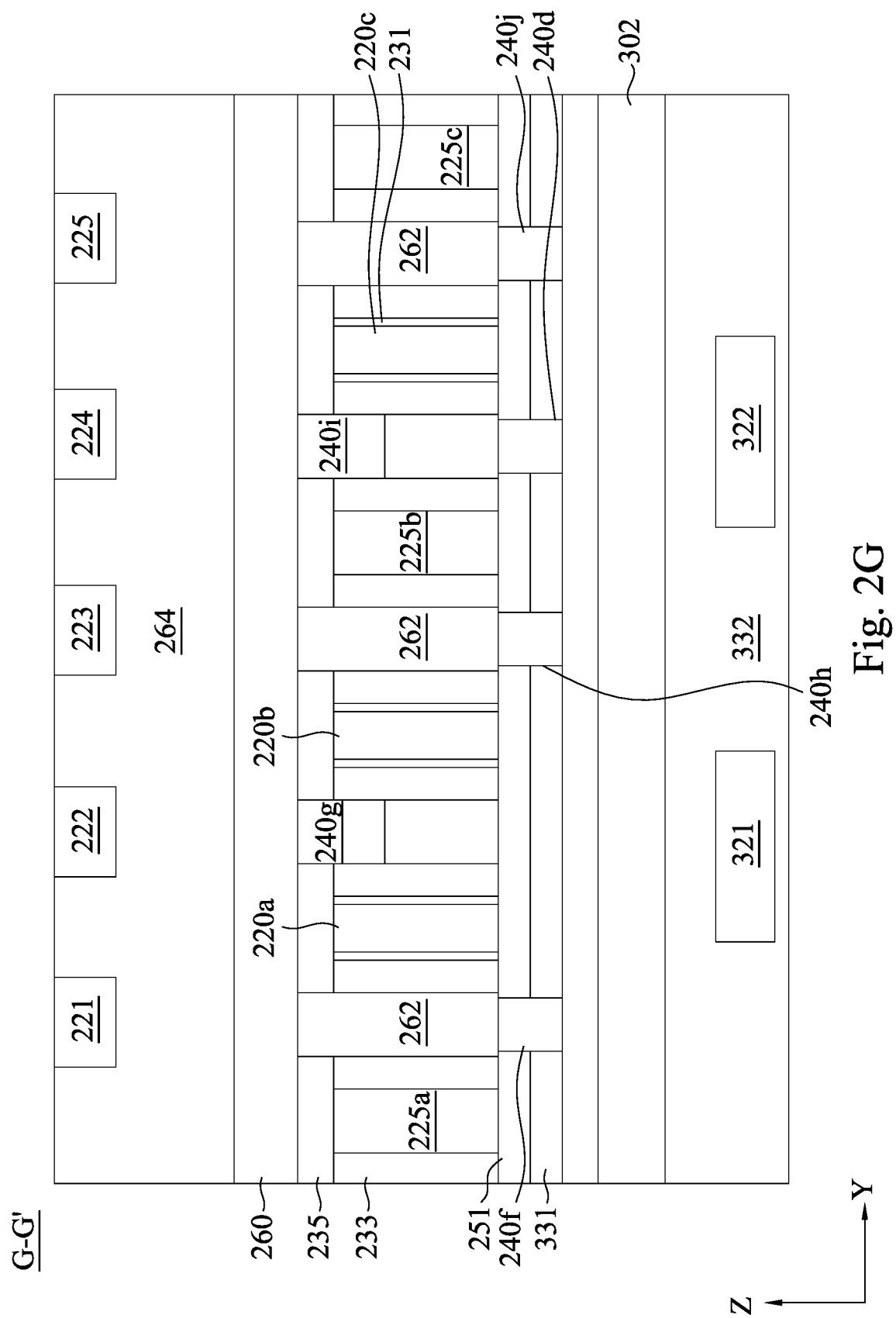

Reference is made to FIGS. 2E, 2F, and 2G. FIGS. 2E, 2F, and 2G illustrate cross-sectional views obtained from reference cross-section E-E', F-F', G-G' in FIGS. 1A and 1B, respectively. As shown in FIGS. 2E and 2F, the semiconductor sheets 210 are stacked along the Z-direction over the back-side dielectric 331, and each semiconductor sheet 210 is a Si sheet that forms a Si channel region for the corresponding NMOS transistor or PMOS transistor. In some embodiments, the semiconductor sheet 210 can be interchangeably referred to as a nanostructure or a semiconductor sheet. In some embodiments, semiconductor sheet 210 may have a width in a range from about 4 nm to about 7 nm when viewed in X-direction.

In FIG. 2E, each semiconductor sheet 210 between the source/drain regions 218a and 218b forms a Si channel region of the NMOS transistor MN2, and the Si channel region of the NMOS transistor MN2 is surrounded by the gate dielectric layer 231 and the gate electrode 220a. Each semiconductor sheet 210 between the source/drain regions 218b and 218c forms a Si channel region of the NMOS transistor and the Si channel region of the NMOS transistor MN1 is surrounded by the gate dielectric layer 231 and the gate electrode 220b. Each semiconductor sheet 210 between the source/drain regions 218d and 218e forms a Si channel region of the PMOS transistor MN3, and the Si channel region of the NMOS transistor MN3 is surrounded by the gate dielectric layer 231 and the gate electrode 220c.

In FIG. 2F, each semiconductor sheet 210 between the source/drain regions 218f and 215g forms a Si channel region of the PMOS transistor MP2, and the Si channel region of the PMOS transistor MP2 is surrounded by the gate dielectric layer 231 and the gate electrode 220a. Each semiconductor sheet 210 between the source/drain regions 218g and 218h forms a Si channel region of the PMOS transistor MP1, and the Si channel region of the PMOS transistor MP1 is surrounded by the gate dielectric layer 231 and the gate electrode 220b. Each semiconductor sheet 210 between the source/drain regions 218i and 218j forms a Si channel region of the PMOS transistor MP3, and the Si channel region of the PMOS transistor MP3 is surrounded by the gate dielectric layer 231 and the gate electrode 220c. In some embodiments, the number of stacked semiconductor sheets 210 may be between about 2 to about 10.

As shown in FIGS. 2E and 2F, the source/drain regions 218a, 218b, 218c, 218f, 218g, and 218h are formed on the first logic cell 10A, and the source/drain regions 218d, 218e, 218i, and 218j are formed on the second logic cell 10B. In some embodiments, the source/drain regions 218f, 218g, 218h, 218i and 218j include Si with Boron (e.g., $B_{11}$) content. In some embodiments, the source/drain regions 218f, 218g, 218h, 218i and 218j are formed by epitaxially growing Boron in Si material. In some embodiments, the source/drain regions 218a through 218j may be deeper than the gate electrodes 220a through 220c, such that portion of the source/drain regions 218a through 218j are in the back-side dielectric 331. In some embodiments, upper portions of the back-side source/drain contacts may be inlaid in the source/drain regions 218a through 218j. As shown in FIG. 2E, the upper portions of the source/drain contacts 240a, 240d, 240e are inlaid in the source/drain regions 218a, 218d, 218e. As shown in FIG. 2F, the upper portions of the source/drain contacts 240f, 240h, 240i are inlaid in the source/drain regions 218f, 218h, 218i. Source/drain silicide regions 230 are formed on the source/drain regions 218f, 218g, 218h, 218i and 218j. The source/drain contacts 240b, 240c, 240g, and 240i are formed on the source/drain silicide regions 270b, 270c, 270g, and 270i.

As shown in FIGS. 2E and 2F, the dielectric-base gates 225a, 225b, 225c are located on the edge of the semiconductor sheets 210. For example, the dielectric-base gate 225a is arranged on the left edge of the semiconductor sheets 210 in the first logic cell 10A, and the dielectric-base gate 225b is arranged on the right edge of the semiconductor sheets 210 in the first logic cell 10A. The dielectric-base gate 225b is arranged on the left edge of the semiconductor sheets 210 in the second logic cell 10B, and the dielectric-base gate 225c is arranged on the right edge of the semiconductor sheets 210 in the second logic cell 10B. In some embodiments, bottoms of the dielectric-base gates 225a, 225b, 225c may be higher than bottoms of the source/drain regions 218f, 218g, 218h, 218i, and 218j. In some embodiments, the dielectric-base gates 225a, 225b, 225c may be deeper than the source/drain regions 218f, 218g, 218h, 218i, and 218j. In some embodiments, bottoms of the dielectric-base gates 225a, 225b, 225c may be level with bottoms of the source/drain regions 218f, 218g, 218h, 218i, and 218j.

As shown in FIGS. 2E, 2F, and 2G, the spacers 233 are formed on the sidewalls of the dielectric-base gates 225a through 225c and the gate electrodes 220a through 220c. The hard mask layer 235 is formed over the gate electrodes 220a through 220c, the dielectric-base gates 225a through 225c, and the spacers 233. In some embodiments, the hard mask layer 235 may be made of dielectric material. In some embodiments, the top surface of the hard mask layer 235 may be lower than the top surface of the source/drain contacts 240b, 240c, 240g, and 240i. In some embodiments, the top surface of the hard mask layer 235 may be aligned with the top surface of the source/drain contacts 240b, 240c, 240g, and 240i.

As shown in FIGS. 2E, 2F, and 2G, on the front side of the semiconductor structure, the ILD layers 262 are formed between the gate electrodes 220a through 220c and over the source/drain regions 218a through 218j. The ILD 260 and the IMD layer 264 are formed over the hard mask layer 235 and the ILD layers 262 in sequence. The conductive lines 221 through 225 are formed in the IMD layer 264.

In FIG. 2E, the conductive lines 201, 202 are formed in the IMD layer 264 and over the gate electrodes 220a through 220c and the source/drain regions 218a through 218. The source/drain region 218c is electrically connected to an overlying level (e.g., conductive line 201) through the source/drain contact 240i and the source/drain via 245h. The source/drain contact 240b hinds on a top of the source/drain region 218b. The conductive line 201 is electrically connected to an overlying level (e.g., conductive line 222) through a conductive via 211. In FIG. 2F, the conductive lines 206, 207 are formed the IMD layer 264 and over the gate electrodes 220a through 220c and the source/drain regions 218a through 218. The source/drain region 218g is electrically connected to an overlying level (e.g., conductive line 206) through the source/drain contact 240g and the source/drain via 245f. The source/drain region 218i is electrically connected to an overlying level (e.g., conductive line 207) through the source/drain contact 240i and the source/drain via 245h. The conductive line 206 is electrically connected to an overlying level (e.g., conductive line 222) through a conductive via 214.

As shown in FIGS. 2E, 2F, and 2G, on the back side of the semiconductor structure, the back side dielectric 331 and an IMD layer 332 are deposited over the gate electrodes 220a through 220c and the dielectric-base gates 225a through 225c in sequence. The conductive lines 321 and 322 are formed in the IMD layer 264. In FIG. 2E, the source/drain regions 218a, 218e are electrically connected to an underlying level (e.g., conductive line 301) through the source/drain contacts 240a, 240e and the source/drain vias 245a, 245d. The source/drain contact 240a lands on a bottom of the source/drain region 218d. The conductive line 301 is electrically connected to an underlying level (e.g., conductive line 321) through a conductive via 311. In FIG. 2F, the source/drain regions 218f, 218h, 218j are electrically connected to an underlying level (e.g., conductive line 302) through the source/drain contacts 240f, 240h, 240j and the source/drain vias 245e, 245g, 245i. The source/drain contact 240d lands on a bottom of the source/drain region 218i. The conductive line 302 is electrically connected to an underlying level (e.g., conductive line 322) through a conductive via 312. In FIG. 2G, the STI structure 251 interposes between the backside dielectric 331 and the gate electrodes 220a through 220c. In some embodiments, the source/drain contacts 240f, 240h, 240d, 240j pass through the STI structure 251 and the back-side dielectric 331 and have top surfaces level with a top surface of the STI structure 251.

Figure 2H:
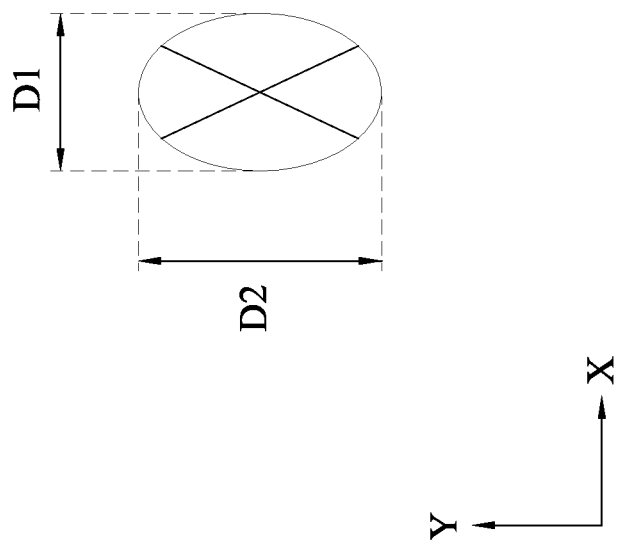
FIG. 2H illustrates a top view of a back-side source/drain via in a semiconductor structure in accordance with some embodiments of the present disclosure.

Reference is made to FIG. 2H. FIG. 2H illustrates a top view of a back-side source/drain via in a semiconductor structure in accordance with some embodiments of the present disclosure. As shown in FIG. 2H, a physical source/drain via 245 is formed in the IMD layer 332 (shown in FIGS. 2E and 2F) based on the shape of the source/drain via 245a in the layout shown in FIG. 1B. The source/drain via 245 defines a longitudinal length D2 extended in a direction parallel to the Y direction and defines a transversal length D1 extended in a direction parallel to the X direction, in which the longitudinal length D2 runs in the direction of a long axis of the source/drain via 245, the transversal length D1 runs in the direction of a short axis of the source/drain via 245, and the longitudinal length D2 is substantially orthogonal to the transversal length D1. In some embodiments, the shape of the source/drain via 245 in the layout is in a shape of an ellipse. In some embodiments, the shape of the physical source/drain via 245 in the IMD layer 332 is in a shape of an ellipse viewed from above the source/drain via 245. In some embodiments, the longitudinal length D2 is parallel to a longitudinal direction of the gate electrodes 220a through 220c. In some embodiments, the direction where the source/drain via 245 extended is intersected with a lengthwise direction of the semiconductor sheet 210. In some embodiments, the source/drain via 245 may be in a slot shape or a elliptical shape viewed from above the source/drain via 245 and also may be referred to as in a line shape or in a rectangular shape. The longitudinal length D2 may be in a range from about 1.2 to about 5 times the transversal length D1. In some embodiments, the source/drain contact in line shape or rectangular shape can help on lithography patterning and improve a critical dimension (CD) thereof.

Figure 3A:
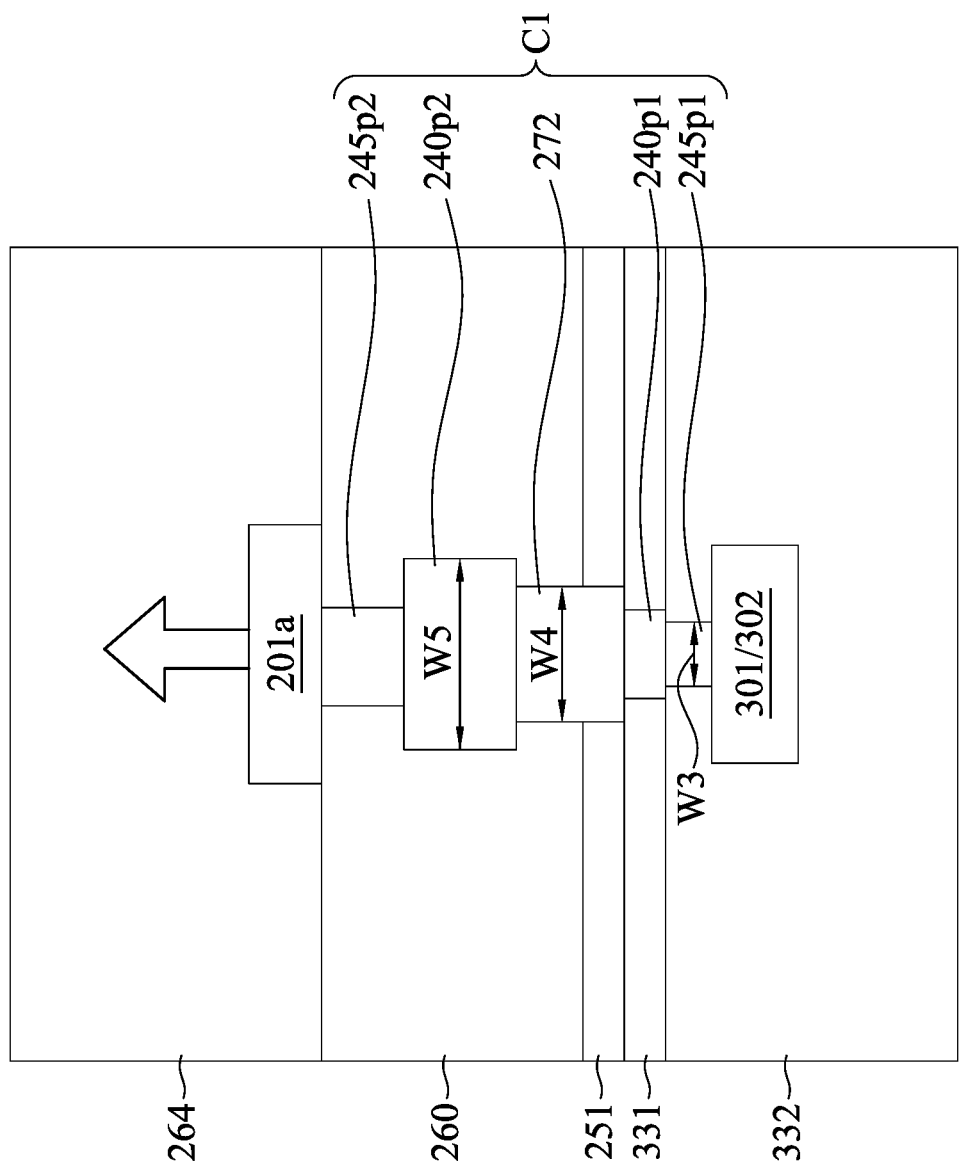
FIGS. 3A, 3B, and 3C illustrate schematic views of connections from back-side power lines to front-side power conductor layers in accordance with some embodiments of the present disclosure.
Figure 3B:
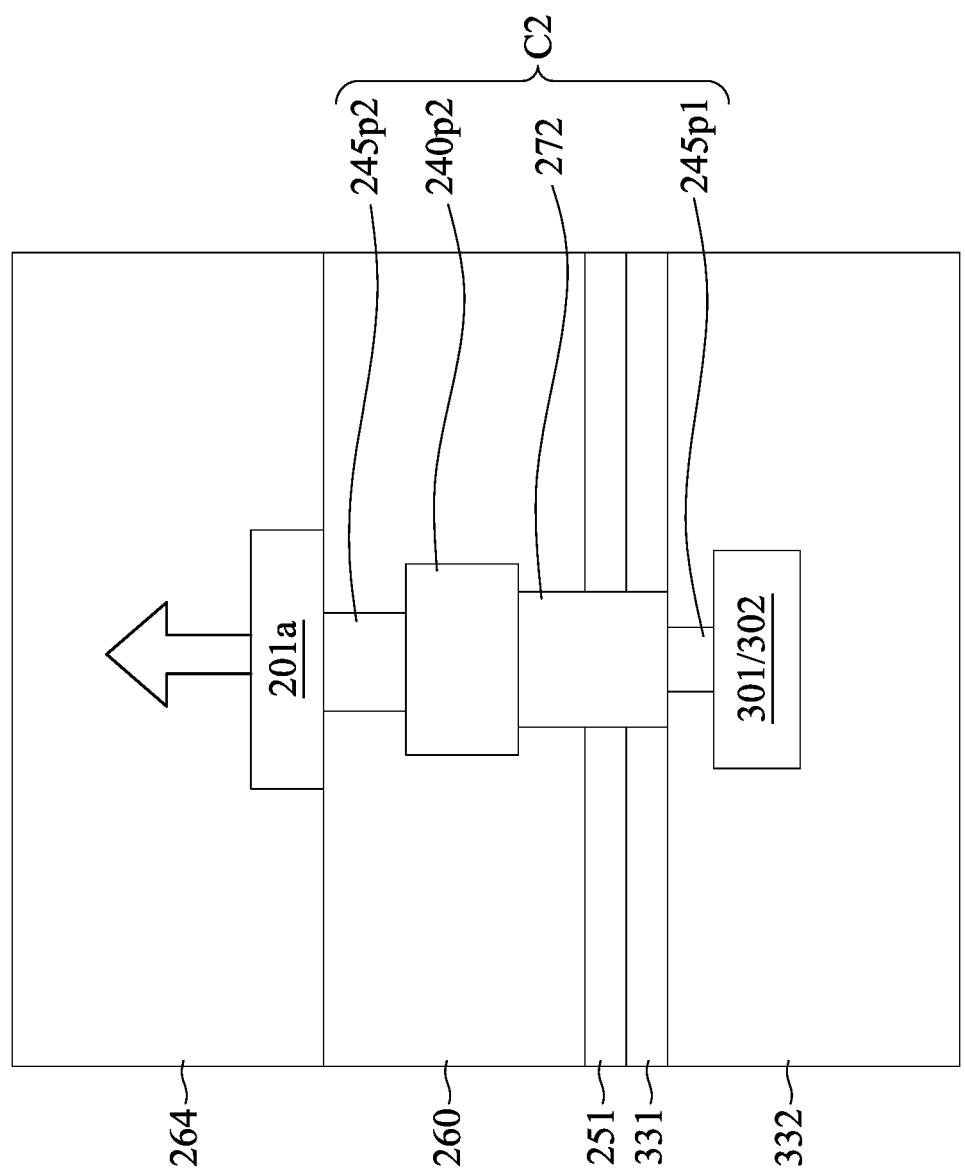
Figure 3C:
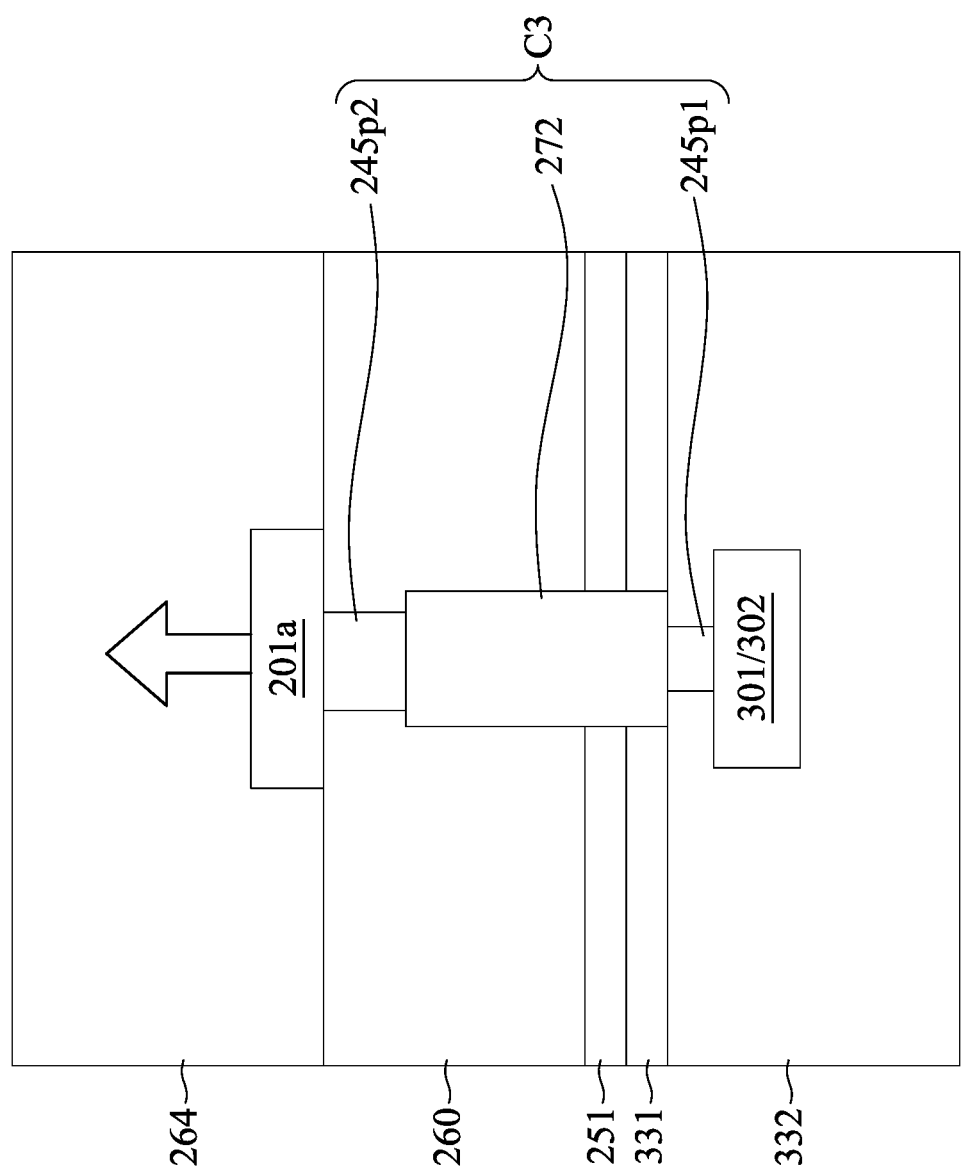
Figure 4A:
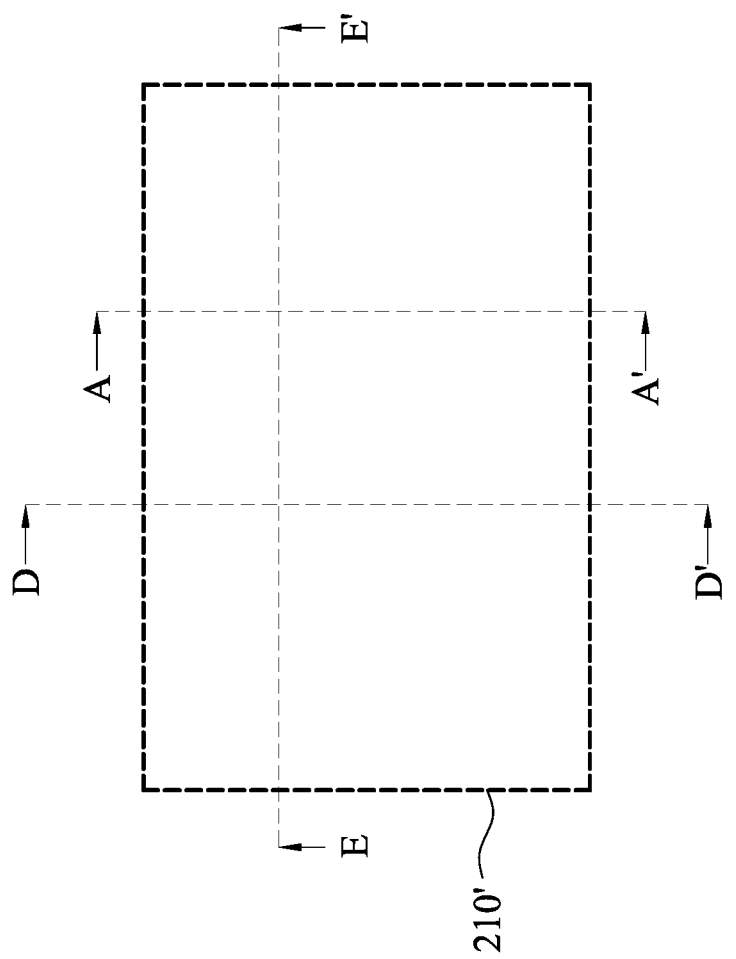
FIGS. 4A, 5A, 6A, 7A, 8A, 9A, 10A, 11A, 12A, 13A, 14A, 15A, 16A, 17A, 18A, 19A, and 20A illustrate a cell array layout diagram of a portion of the semiconductor structure of intermediate stages in the formation of a semiconductor device in accordance with some embodiments of the present disclosure.
Figure 4A:
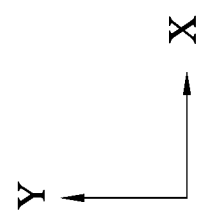
Figure 4C:
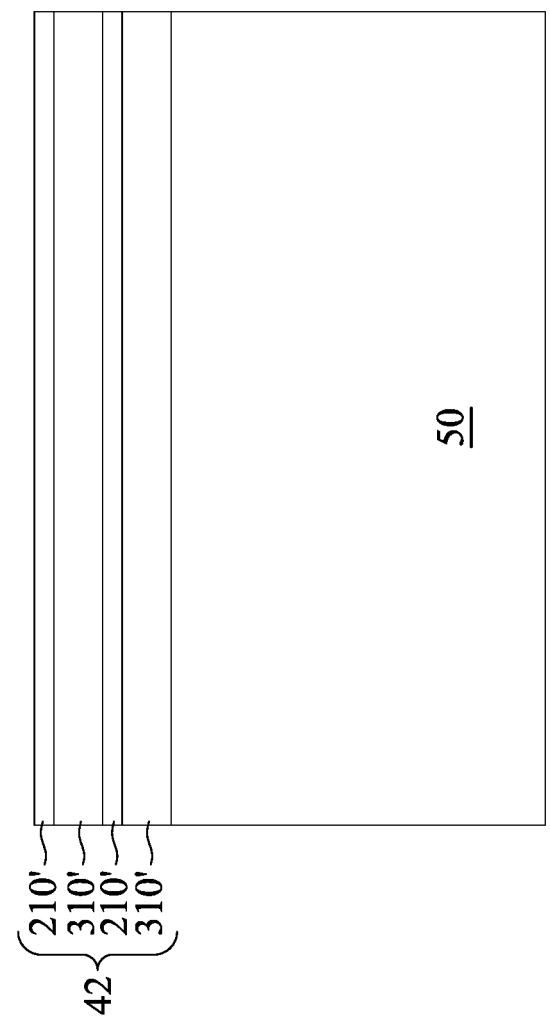
Figure 5A:
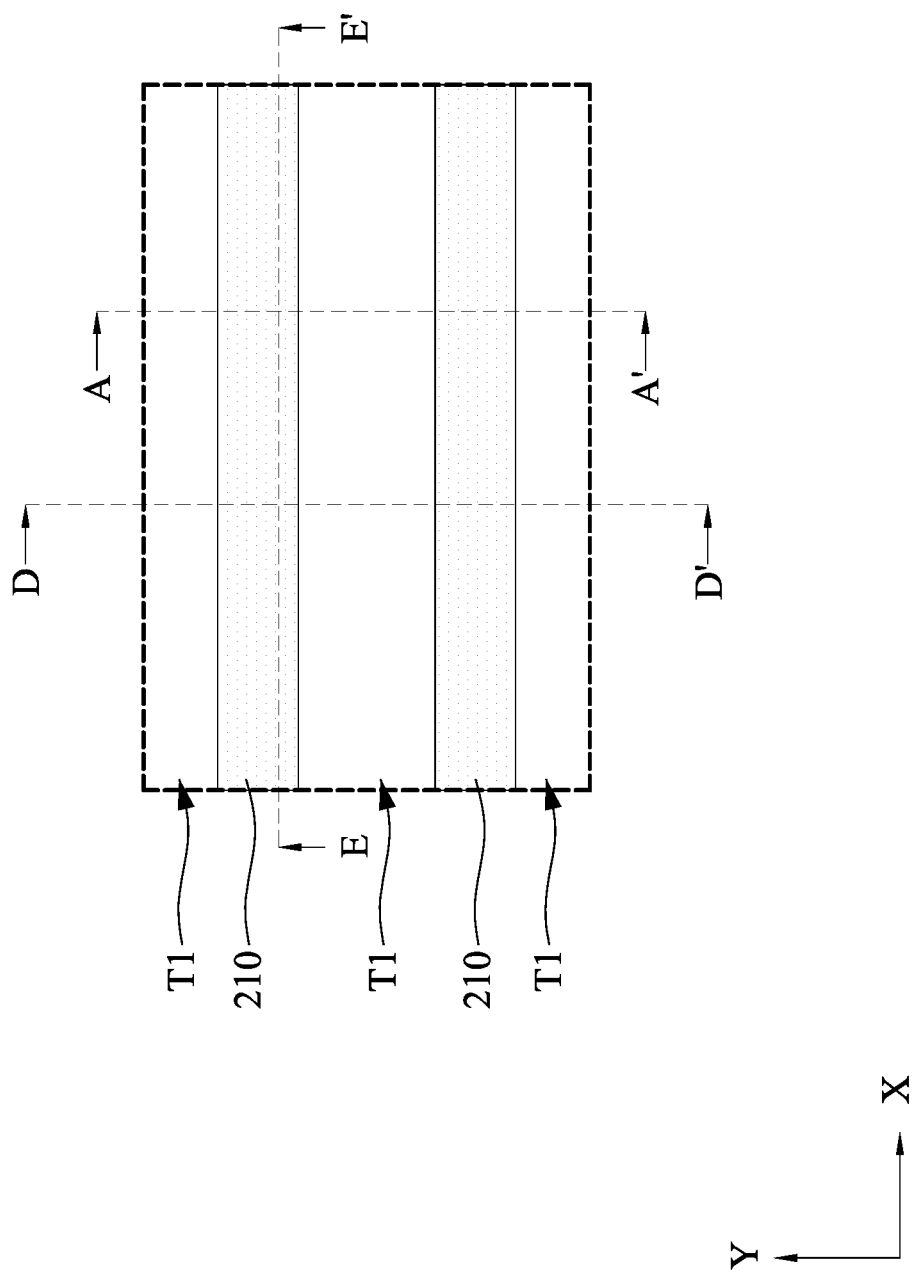
Figure 5D:
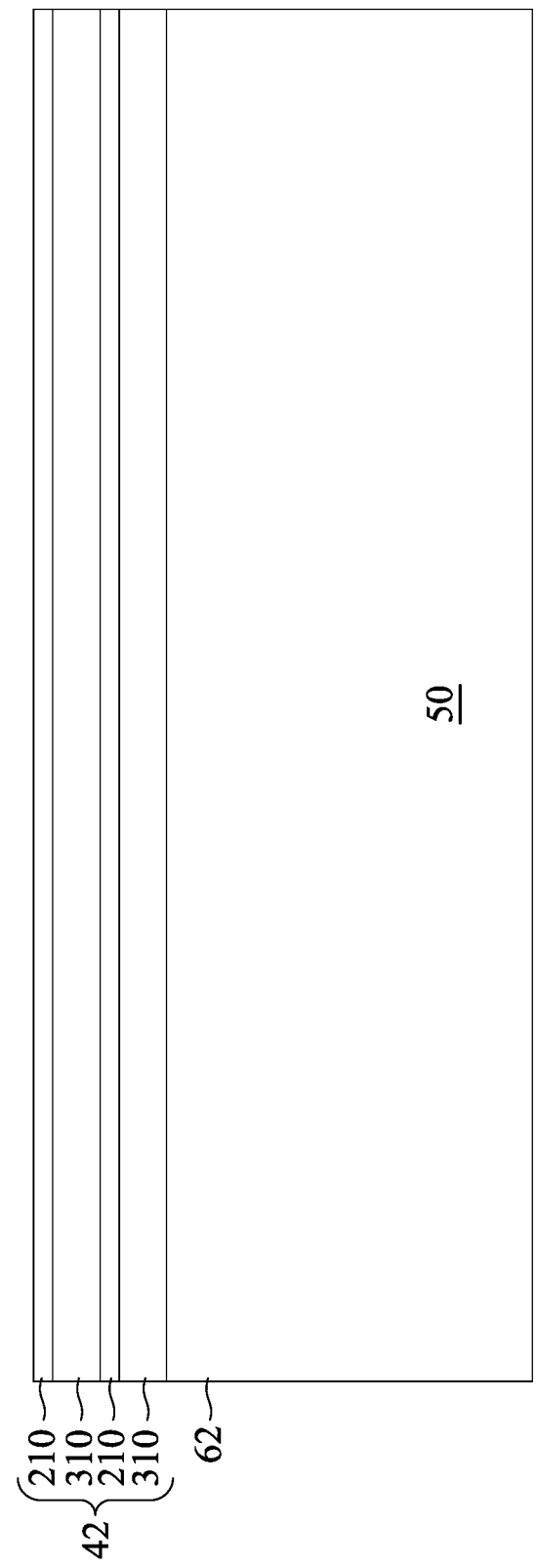
Figure 6A:
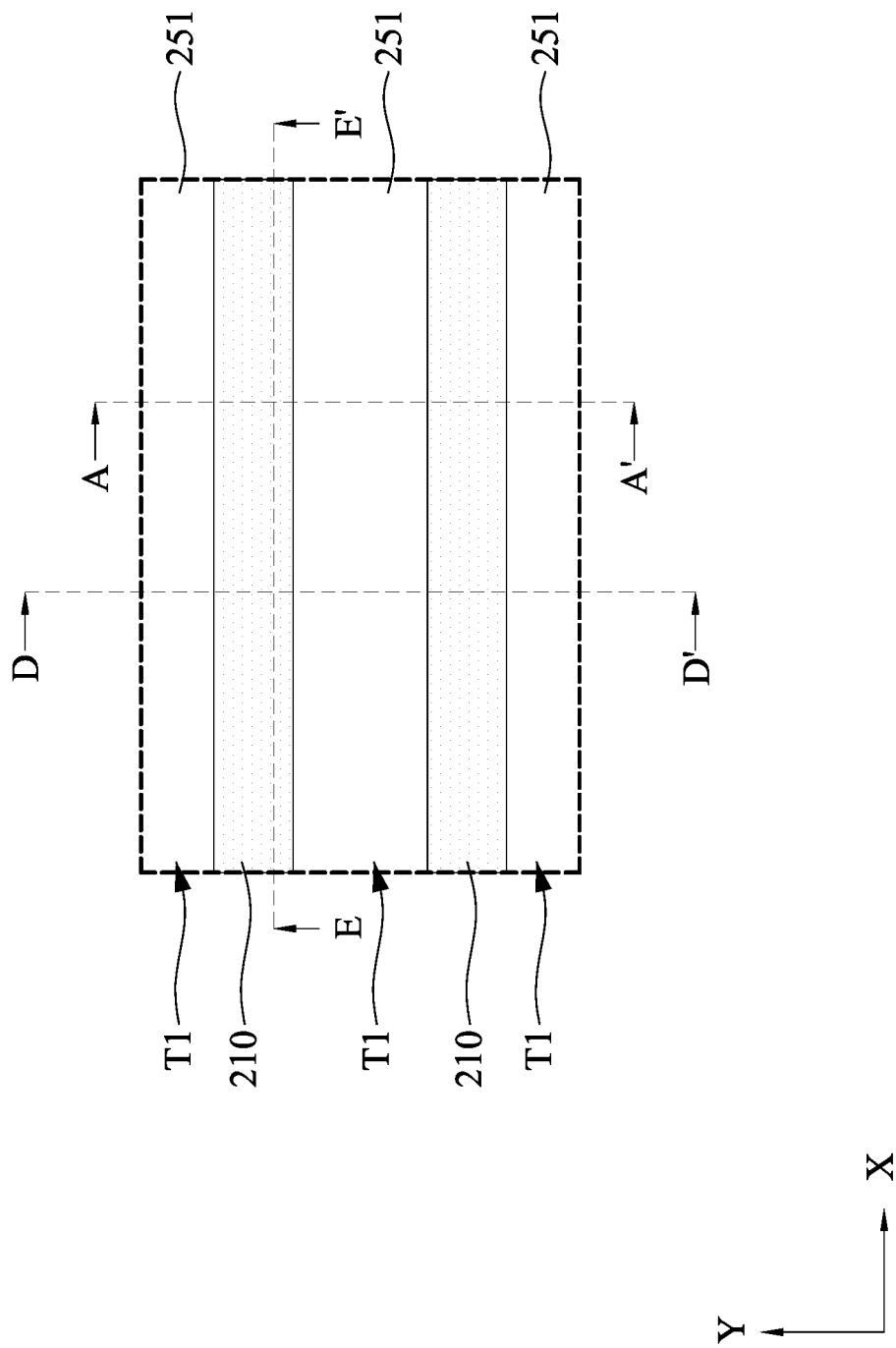
Figure 6B:
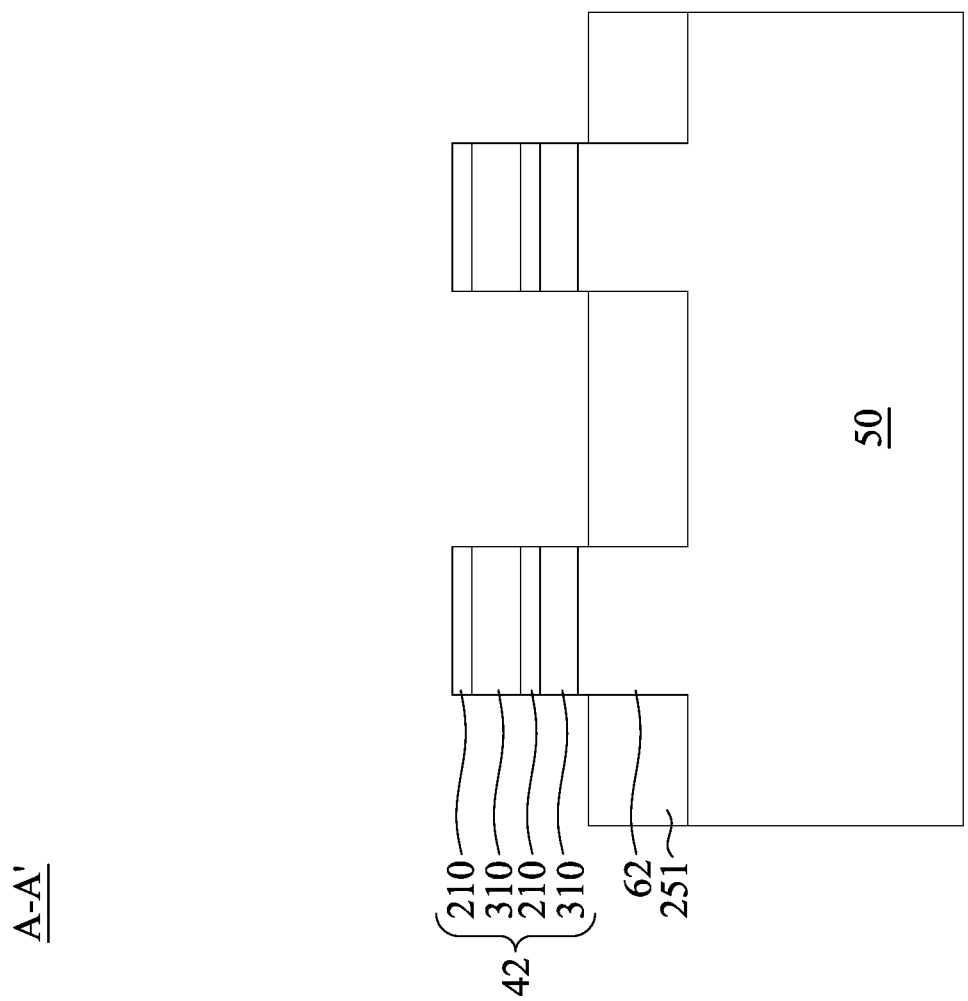
Figure 7A:
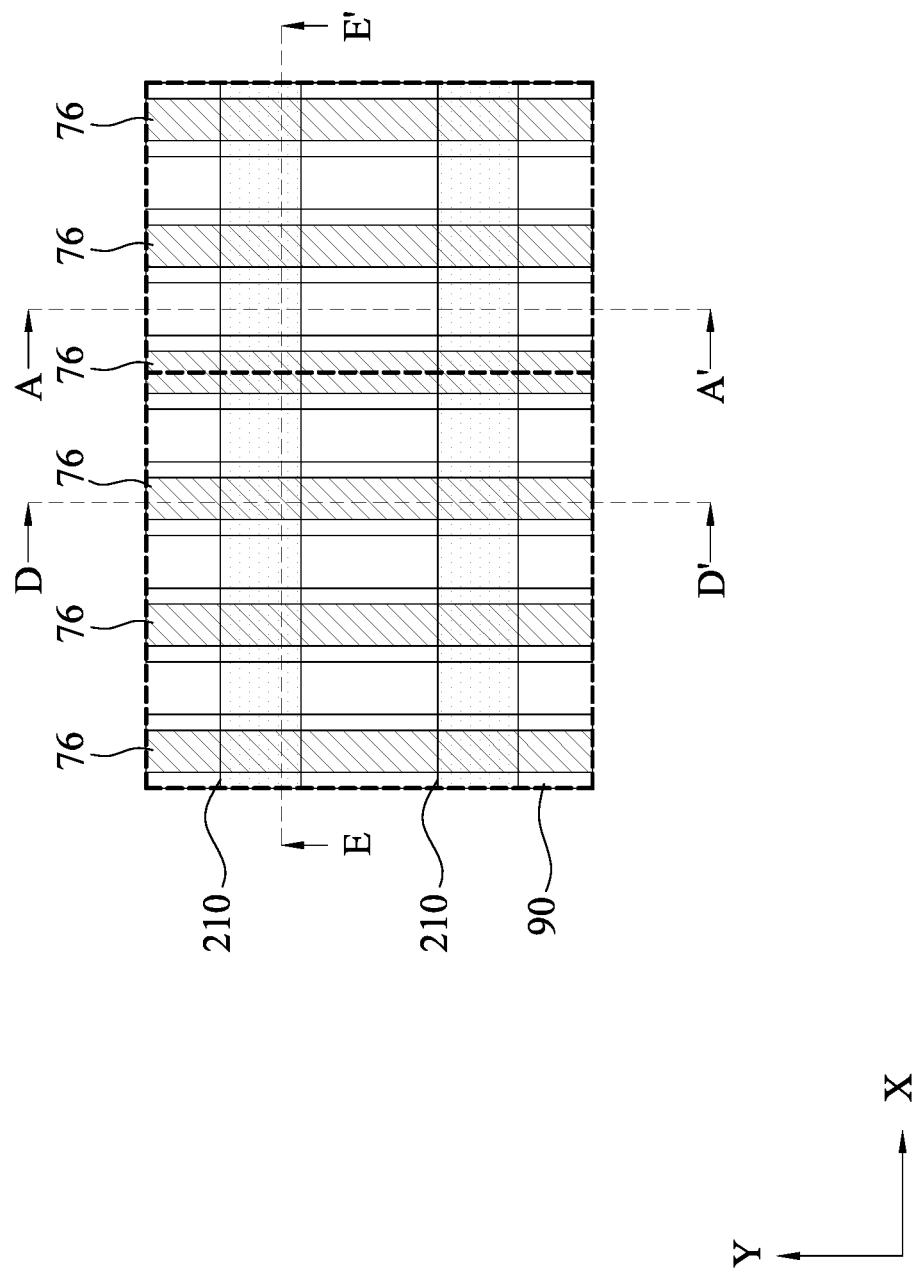
Figure 7B:
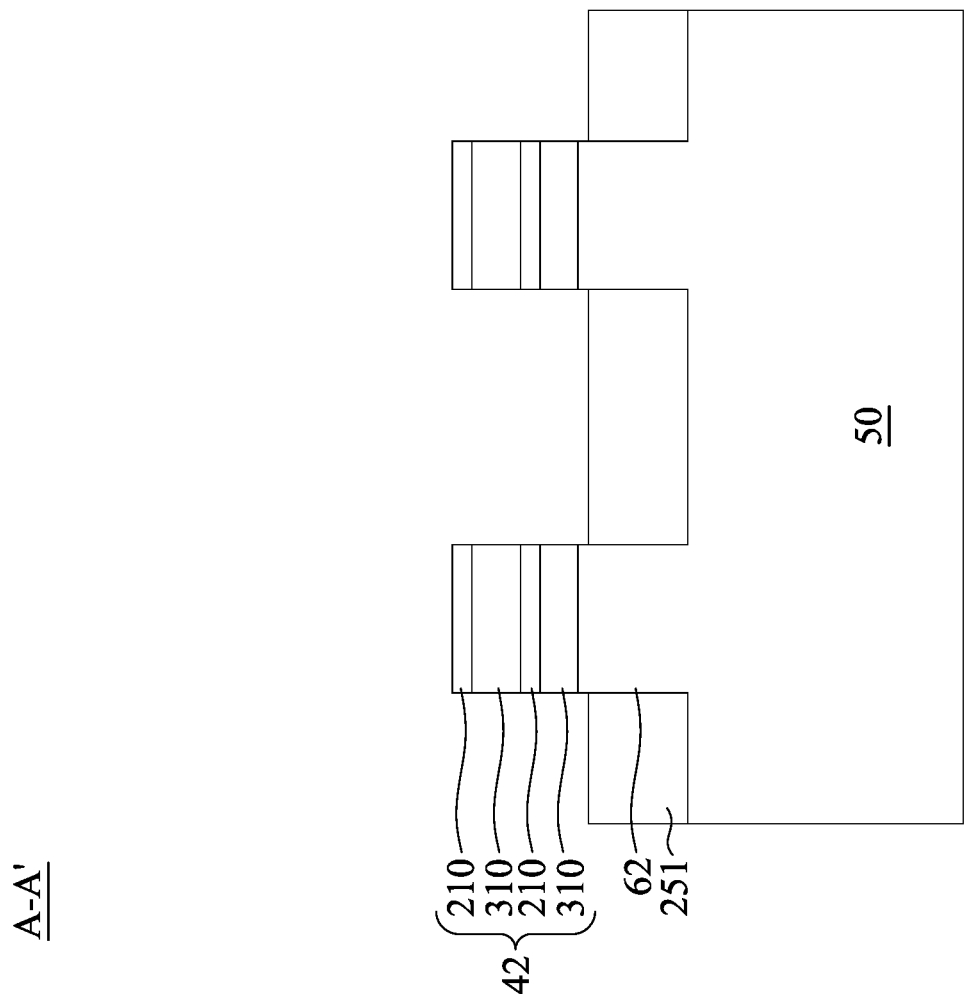
Figure 7C:
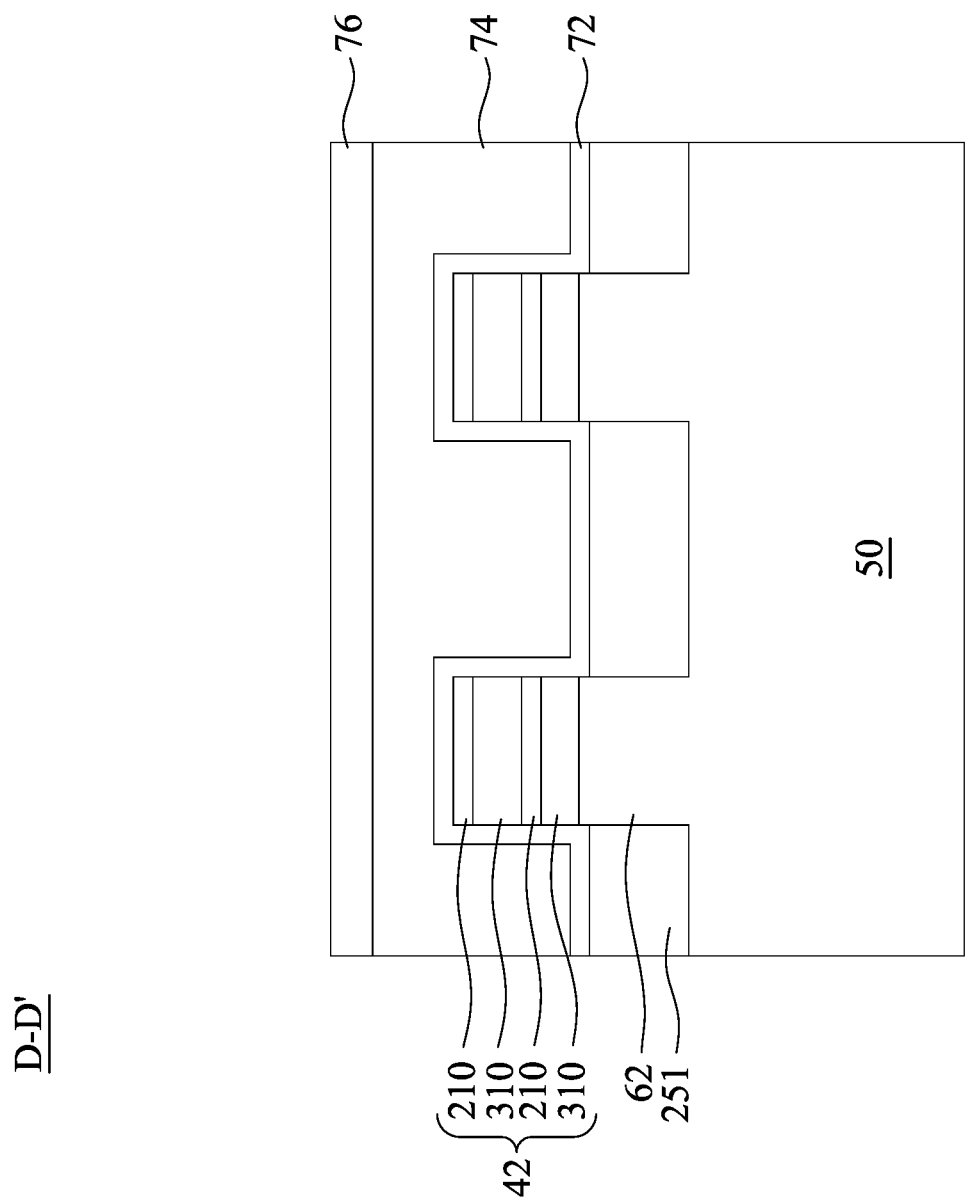
Figure 7D:
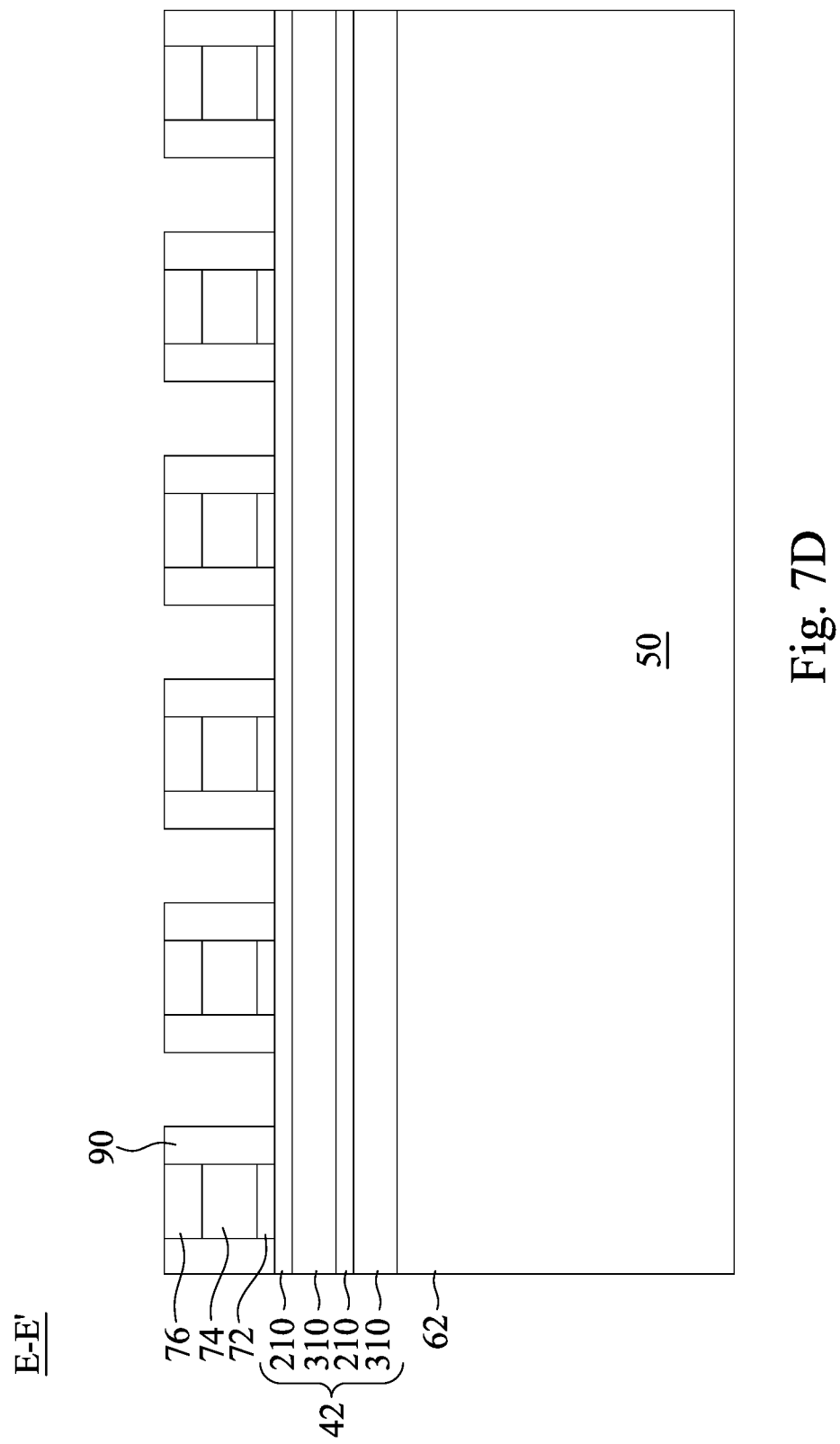
Figure 8A:
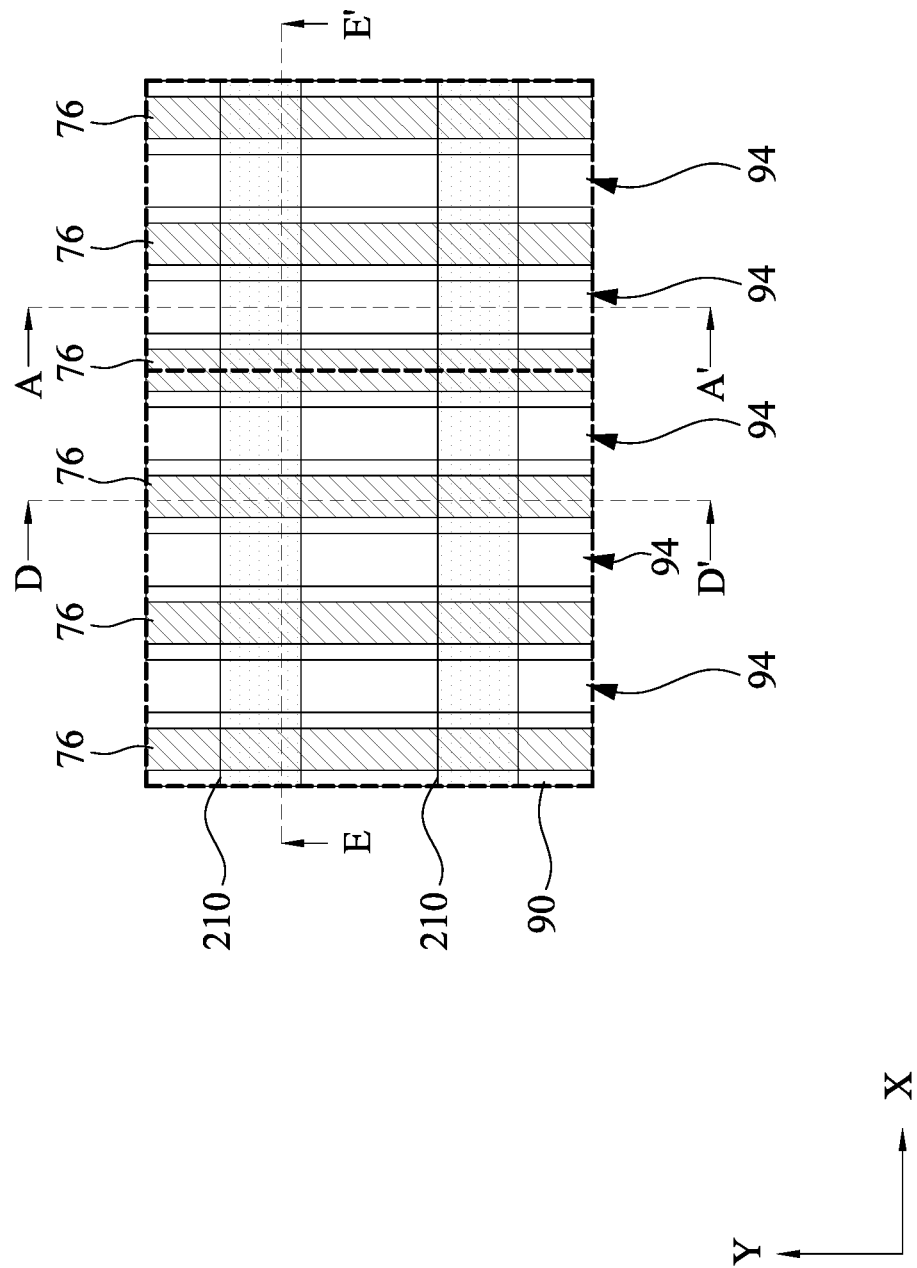
Figure 8C:
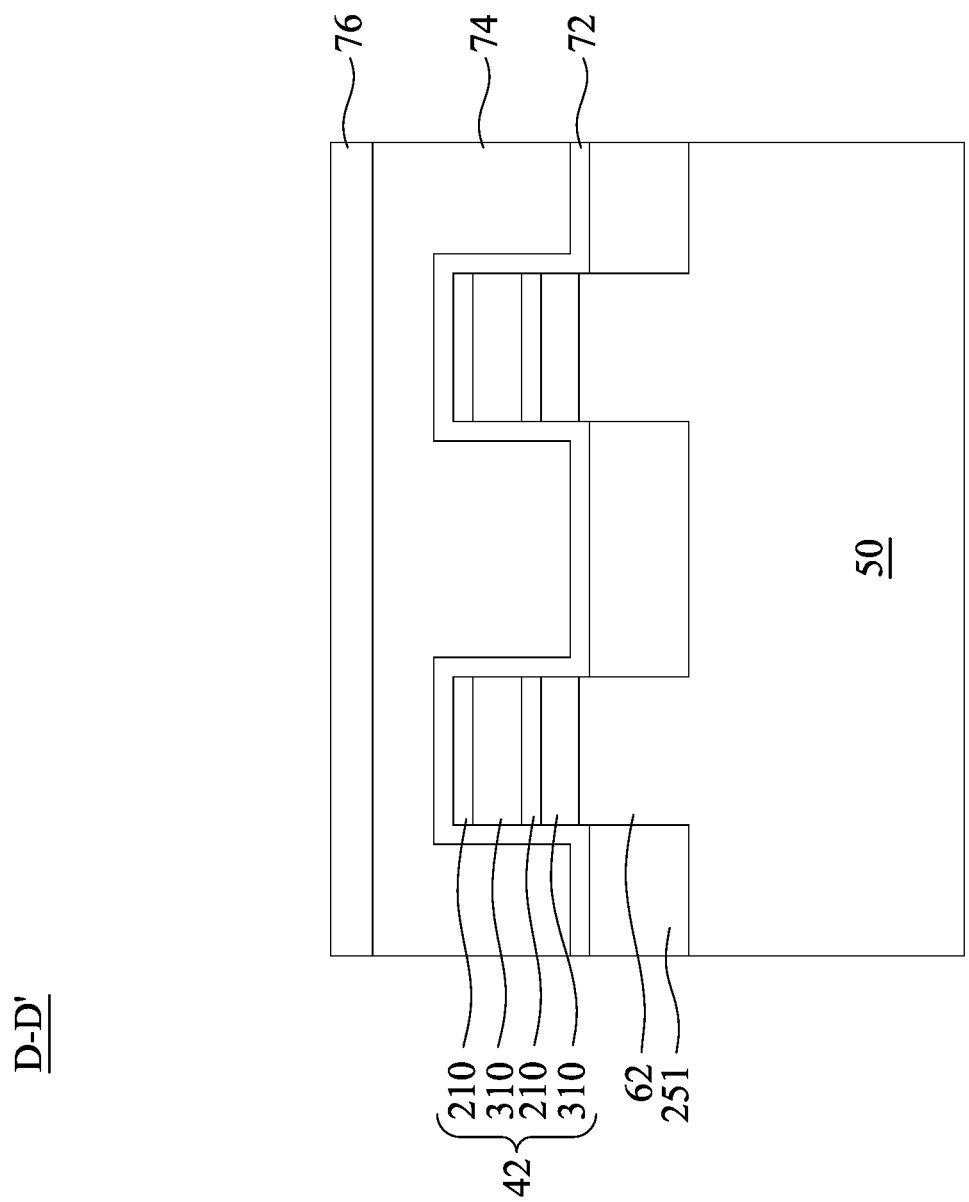
Figure 8D:
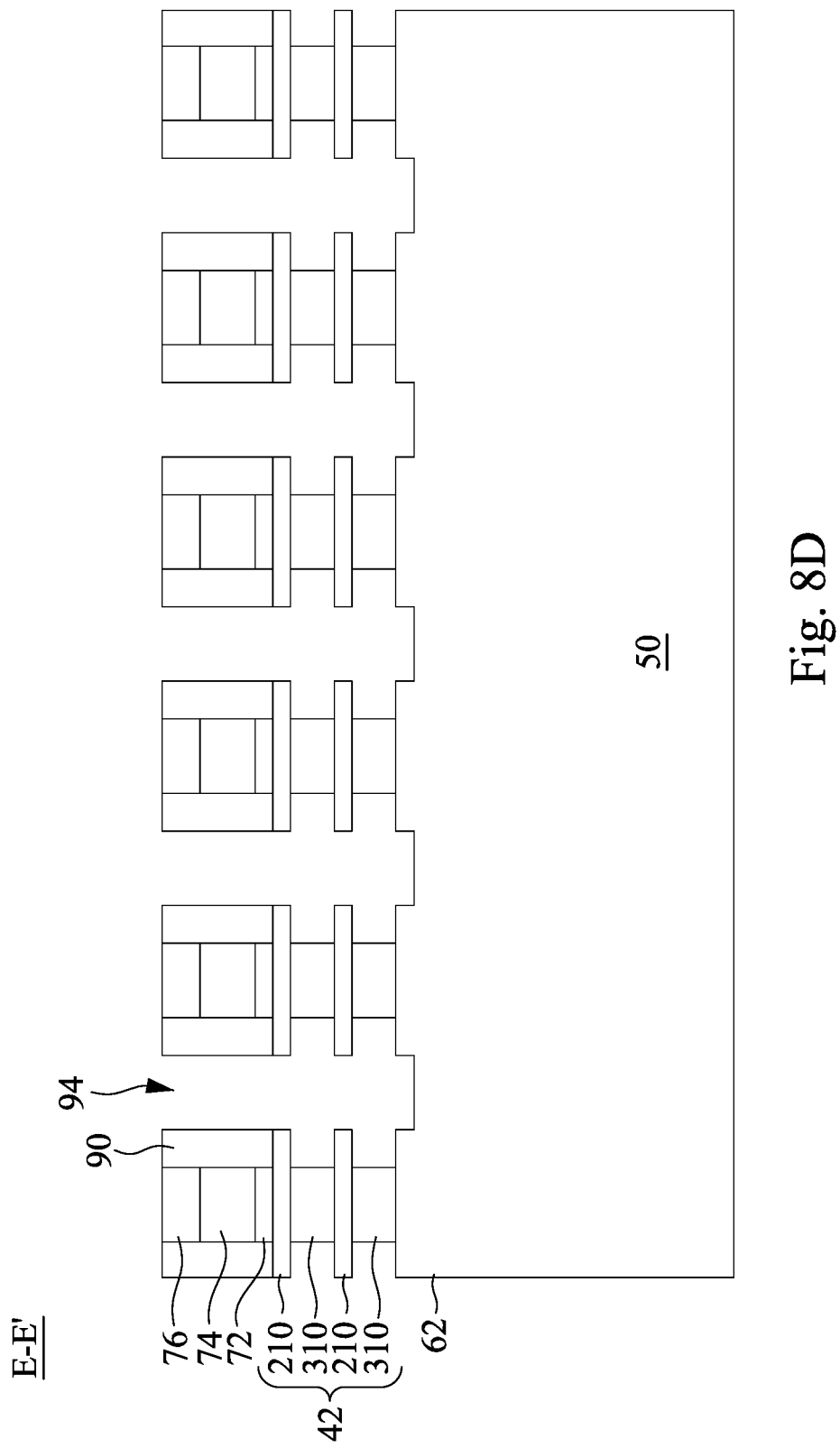
Figure 9A:
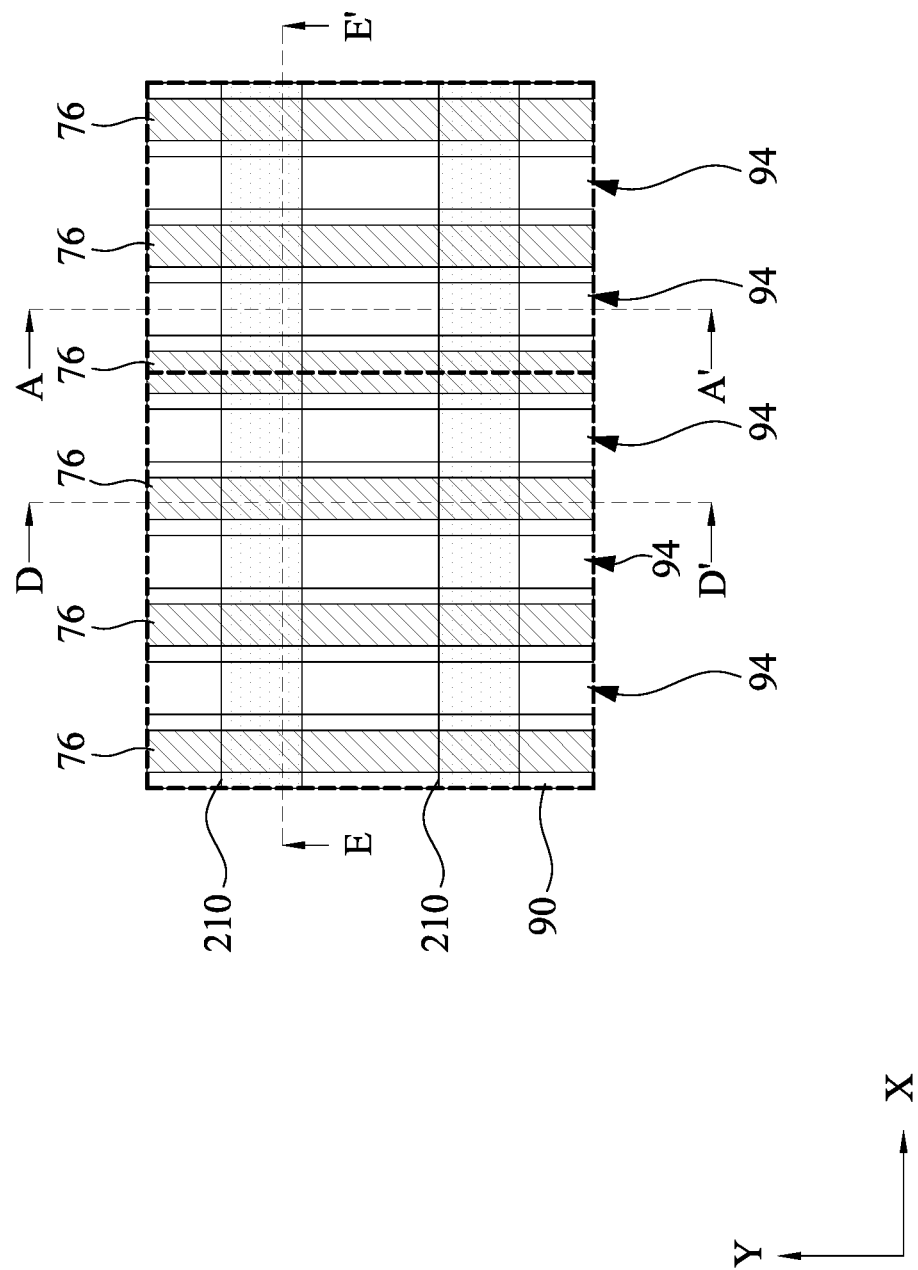
Figure 9C:
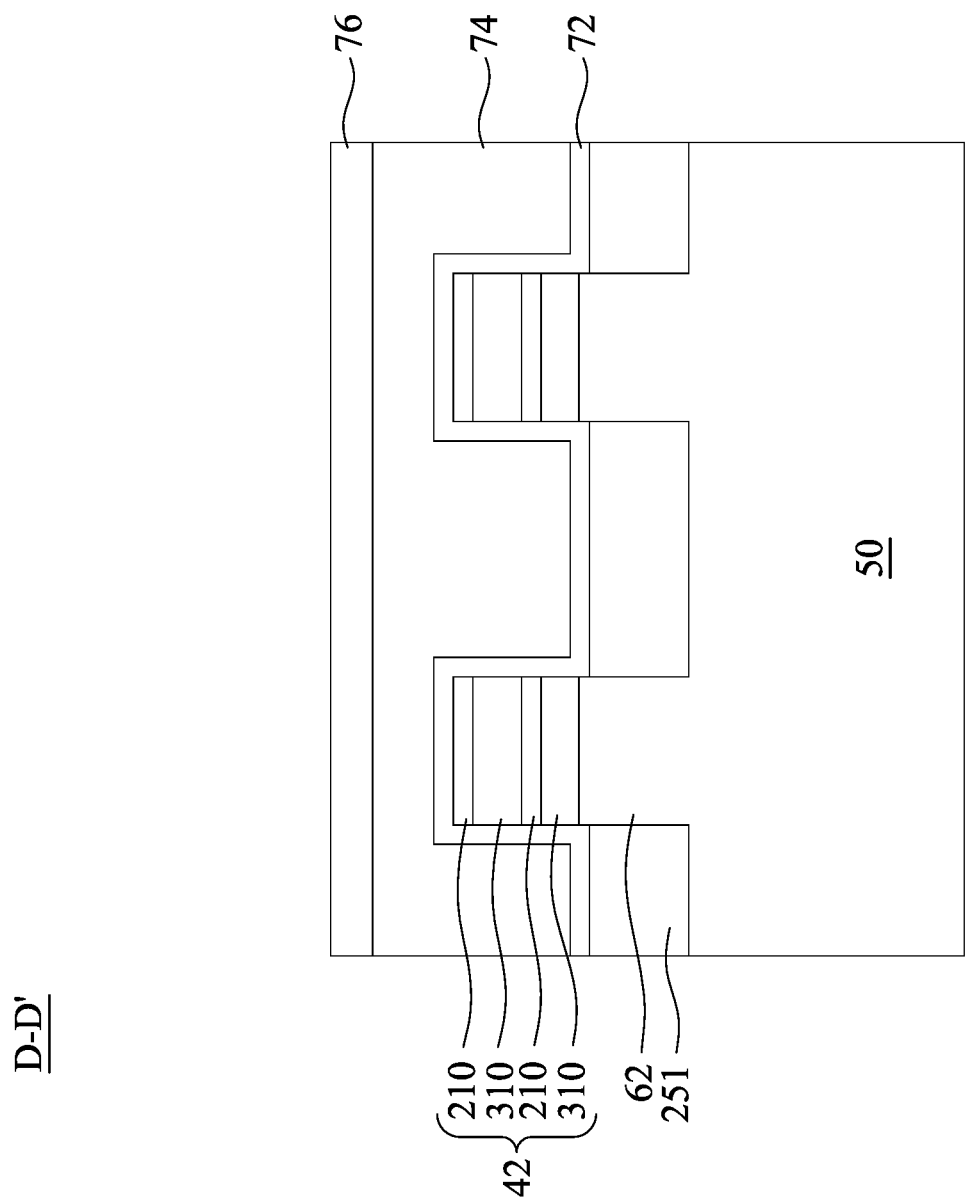
Figure 9D:
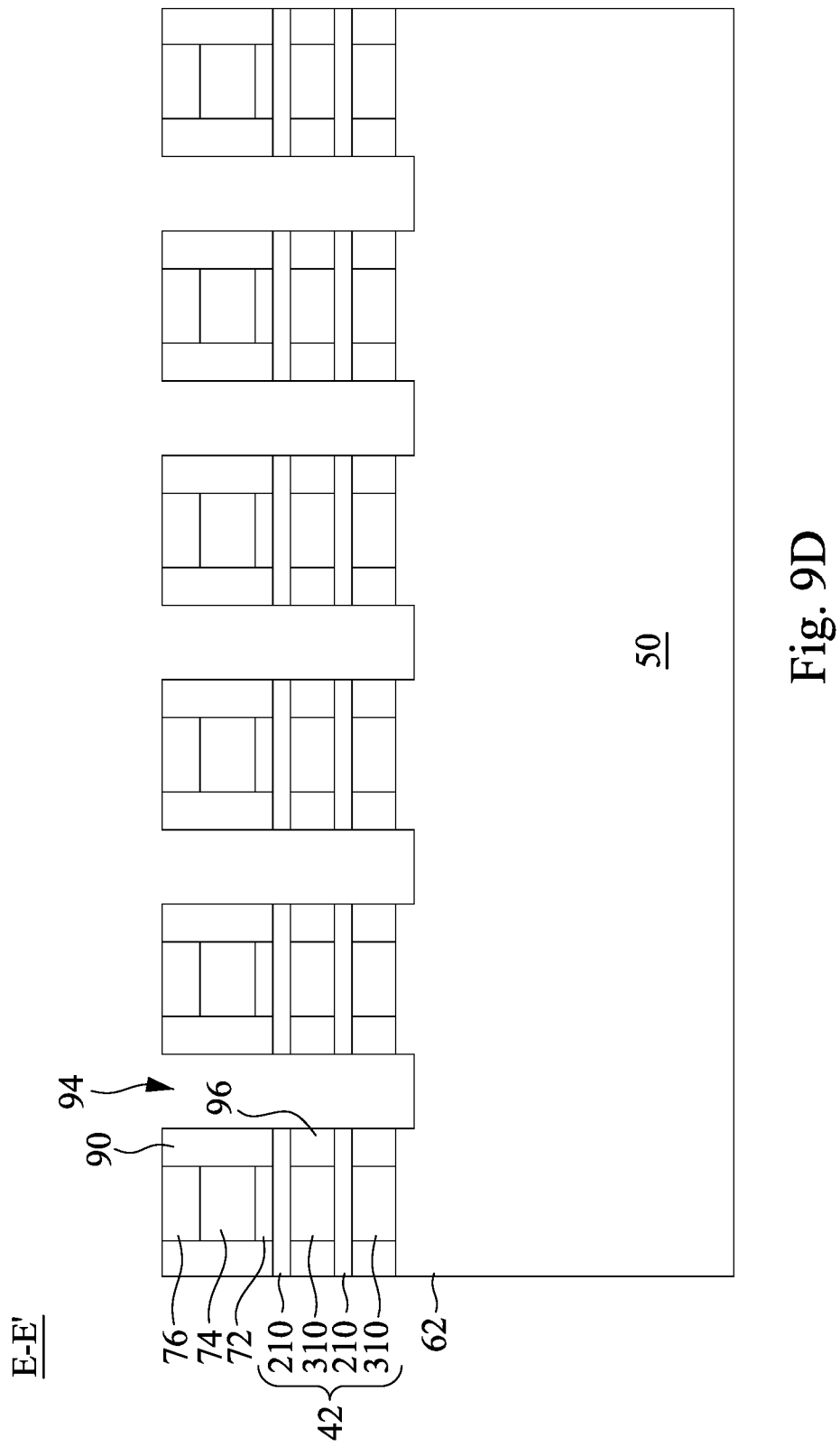
Figure 10A:
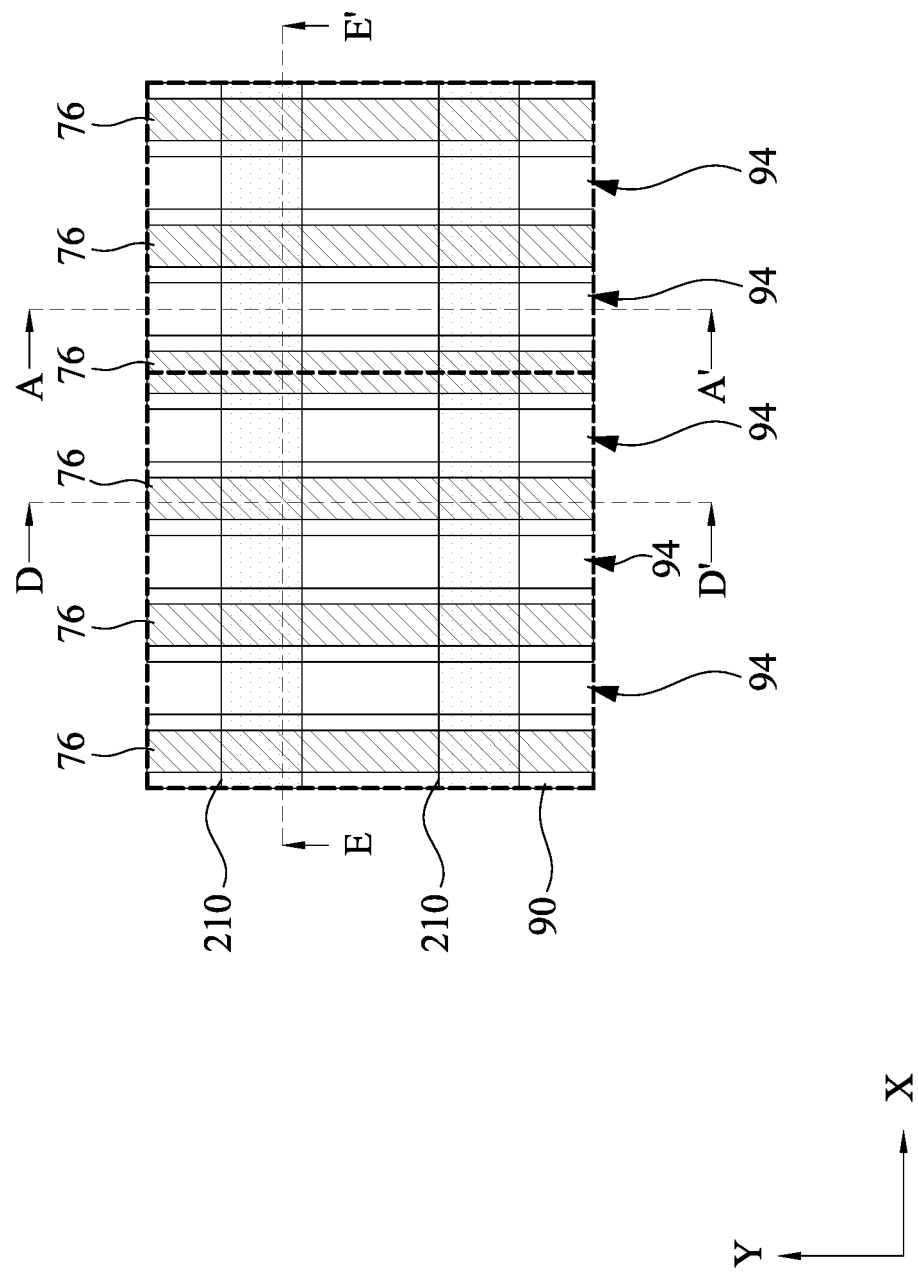
Figure 10B:
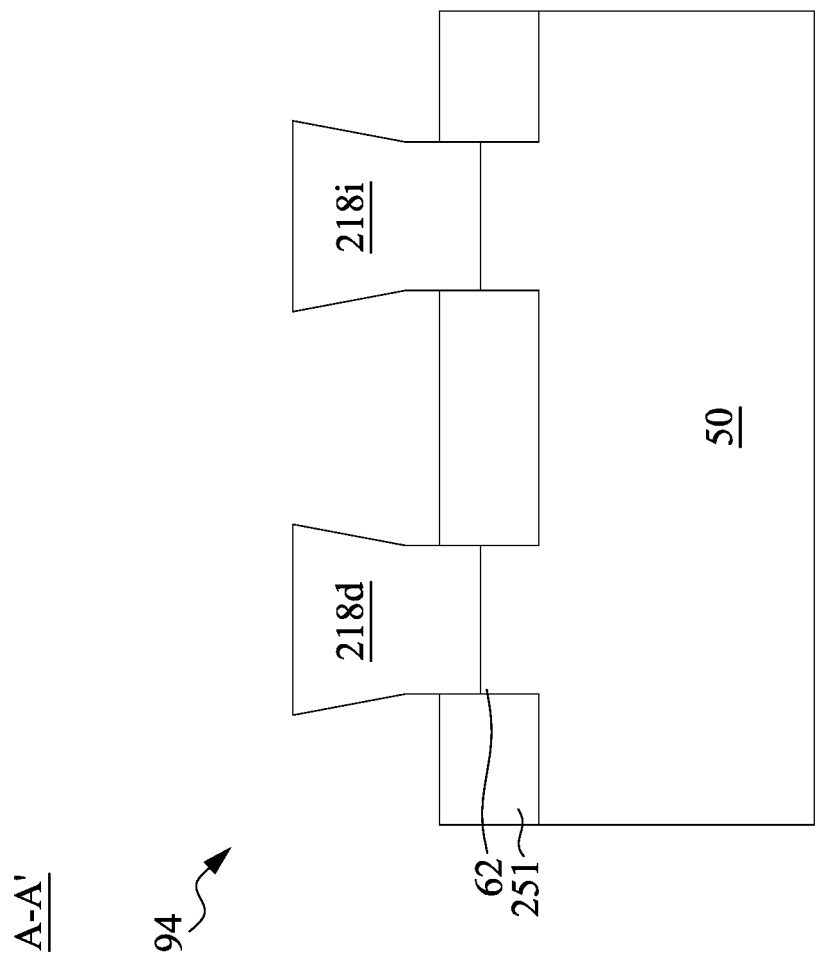
Figure 10C:
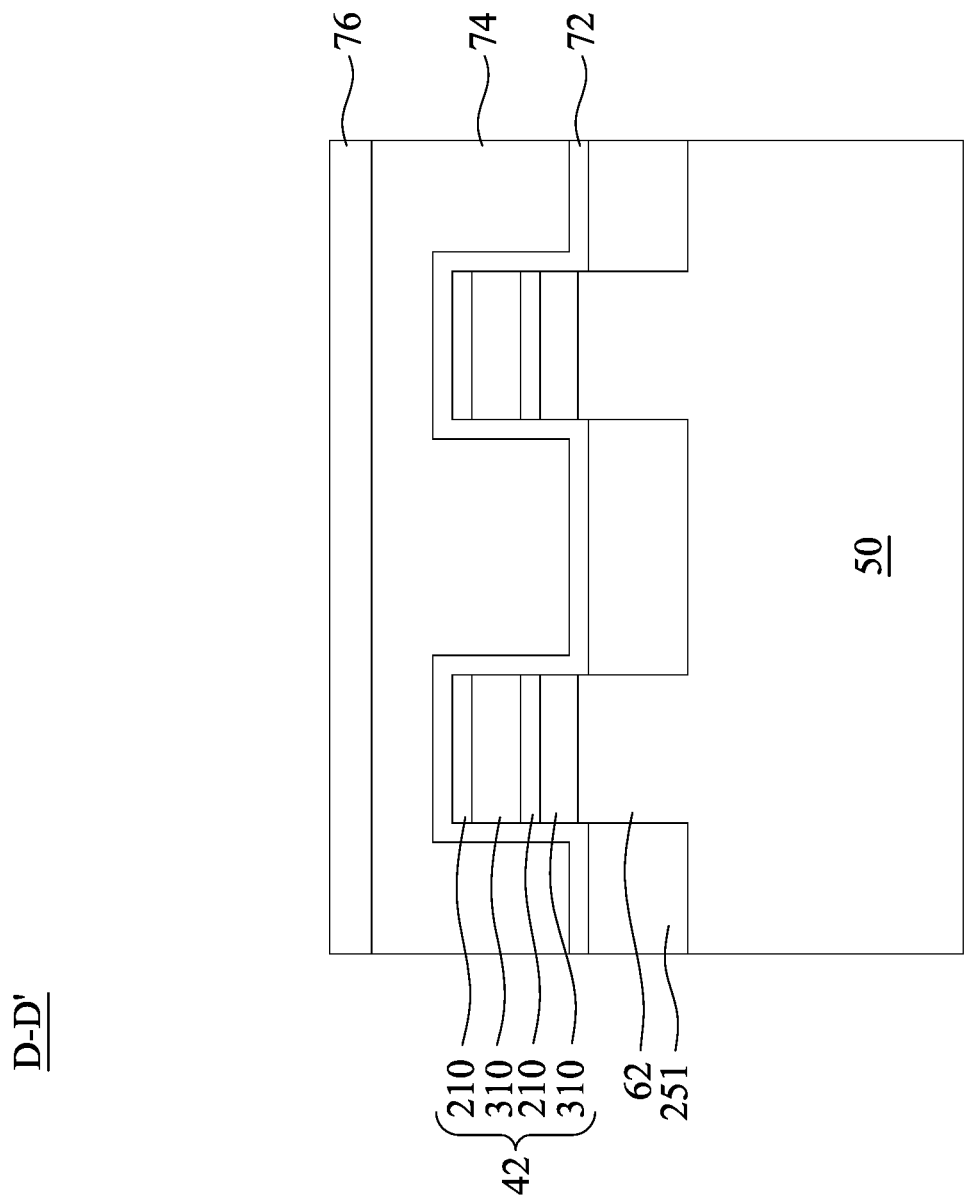
Figure 10D:
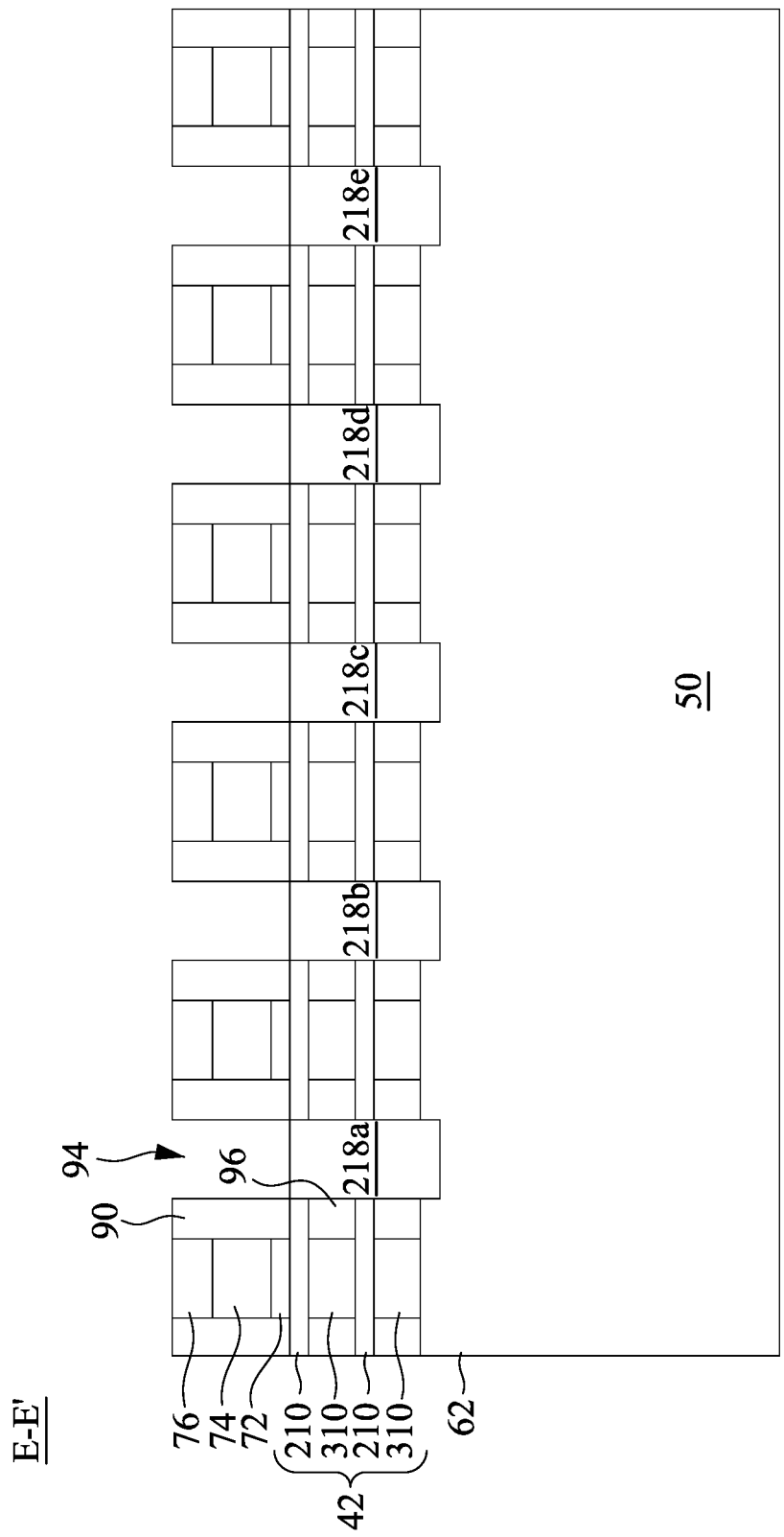
Figure 11A:
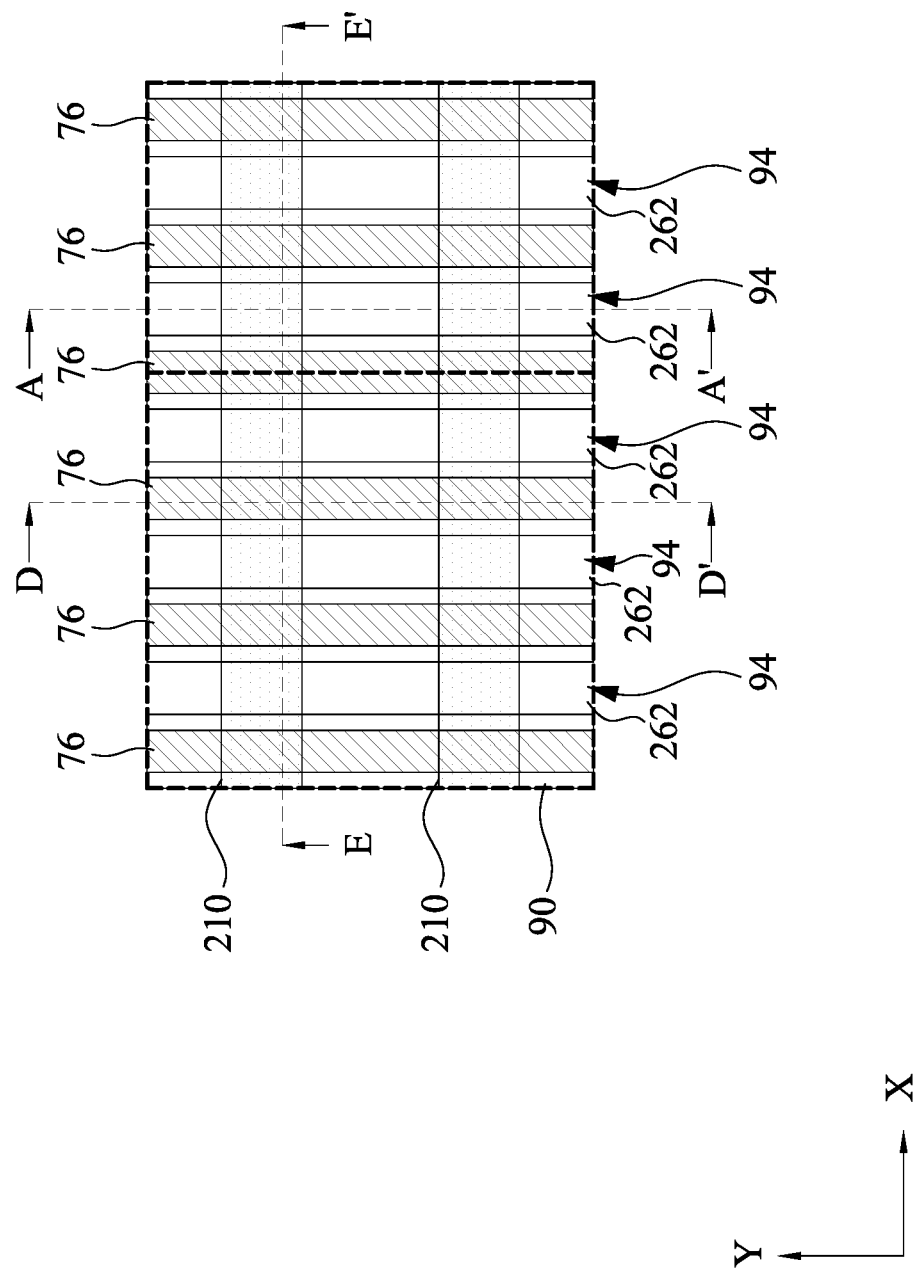
Figure 11B:
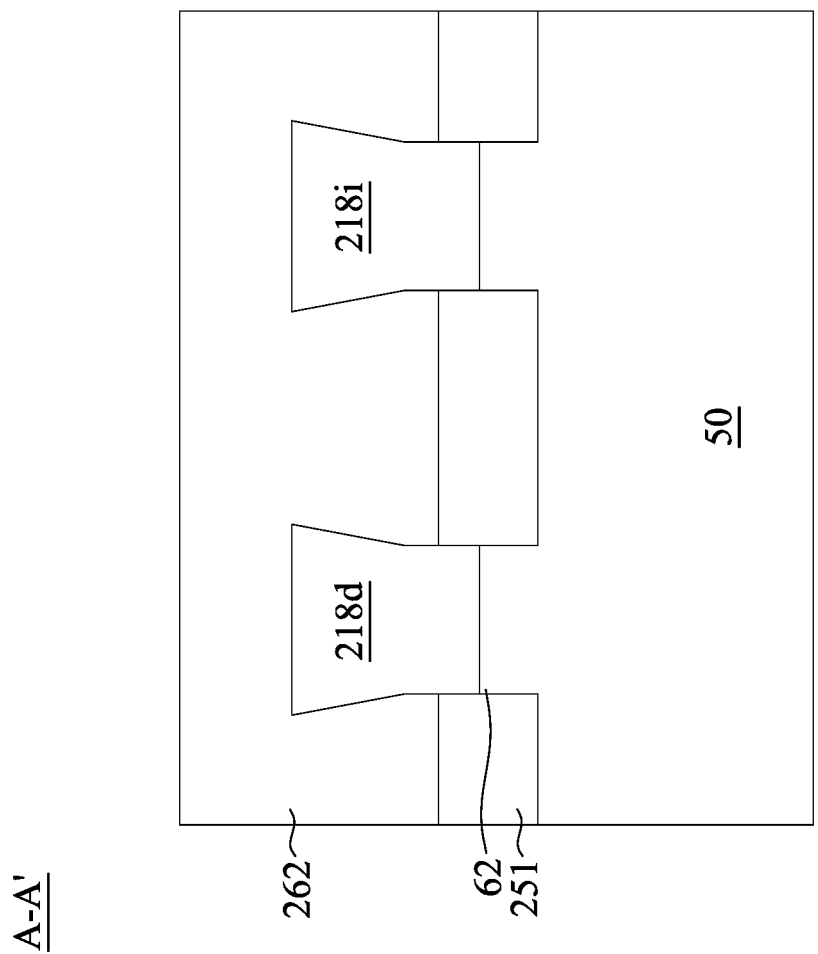
Figure 11C:
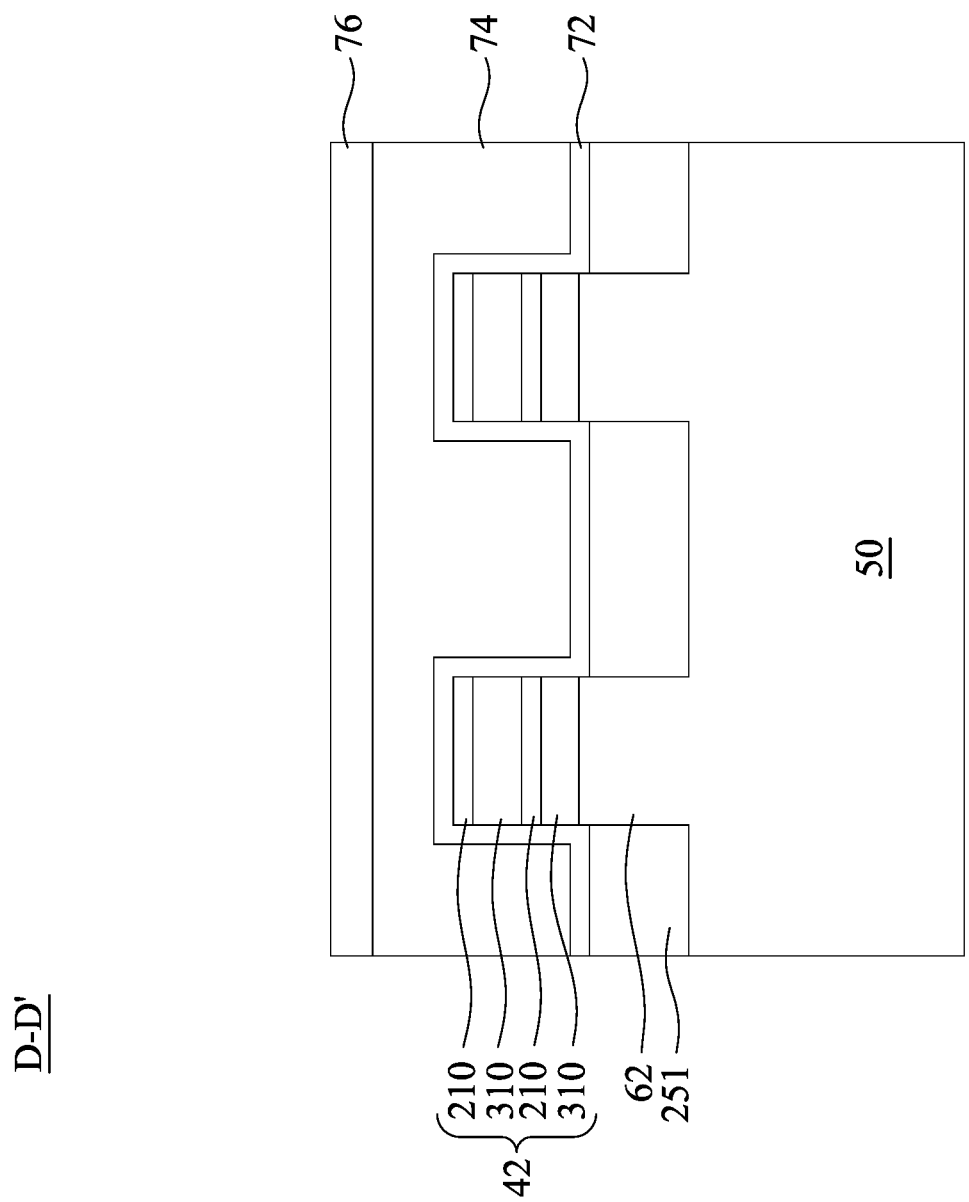
Figure 11D:
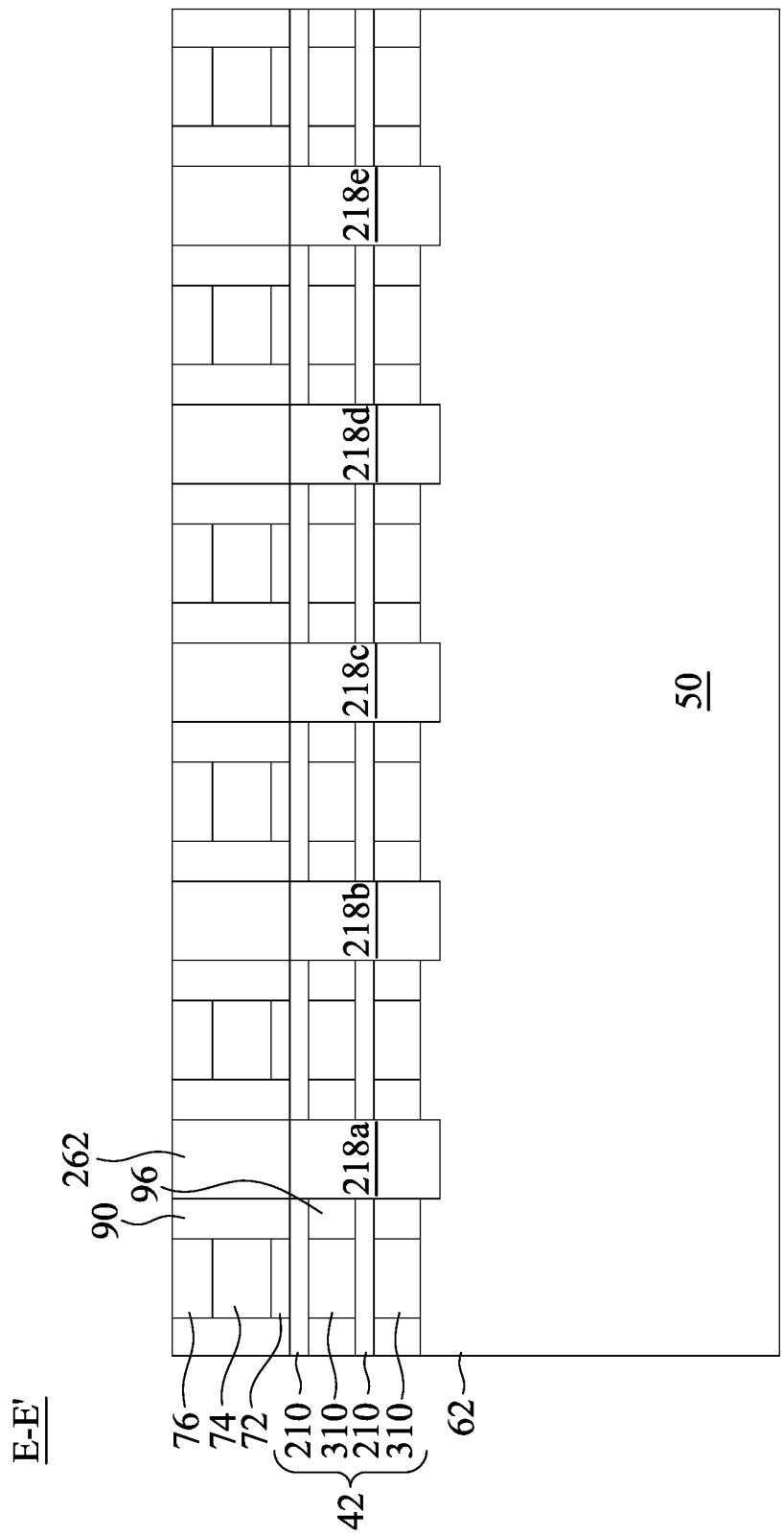
Figure 12A:
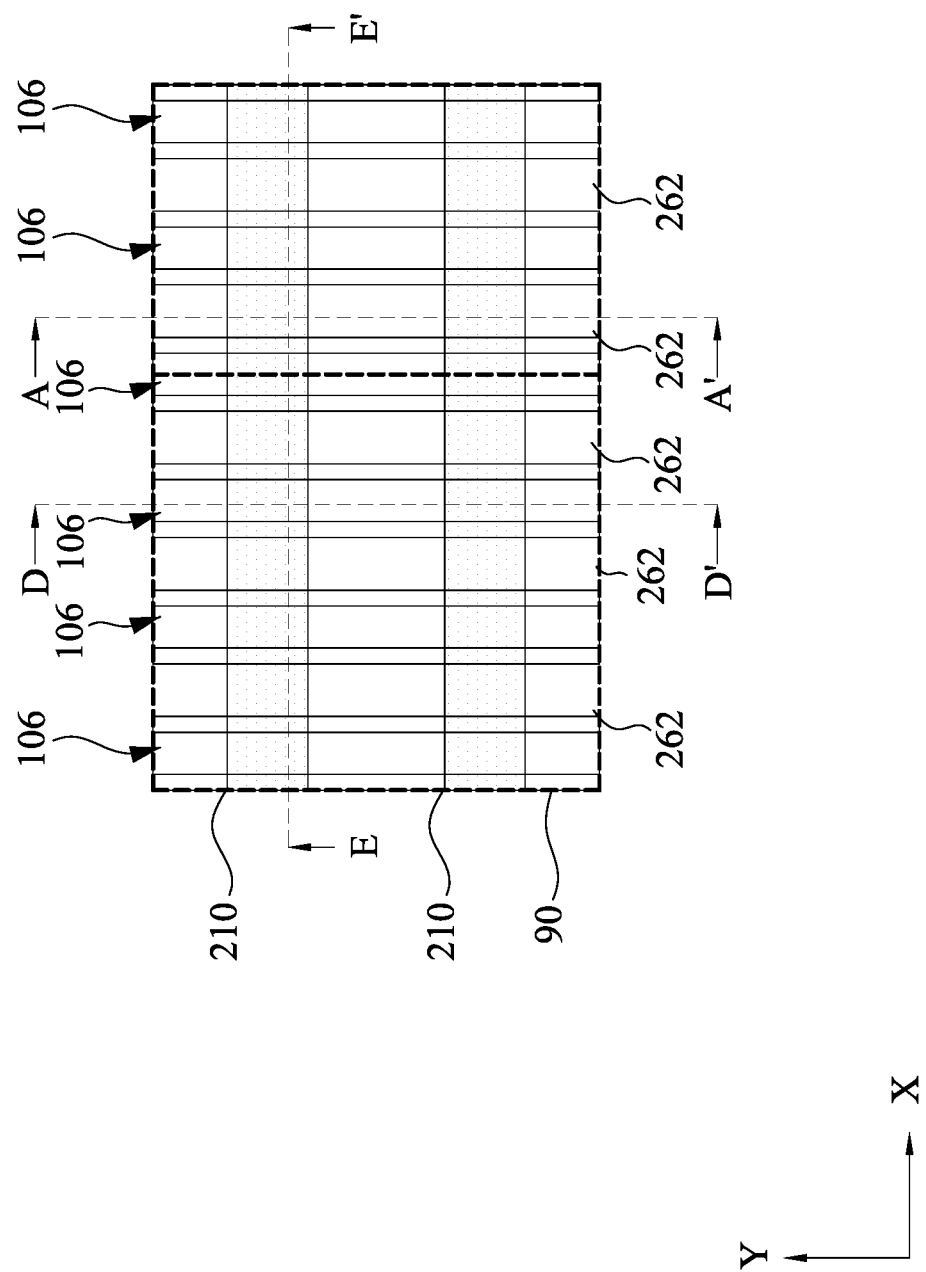
Figure 12B:
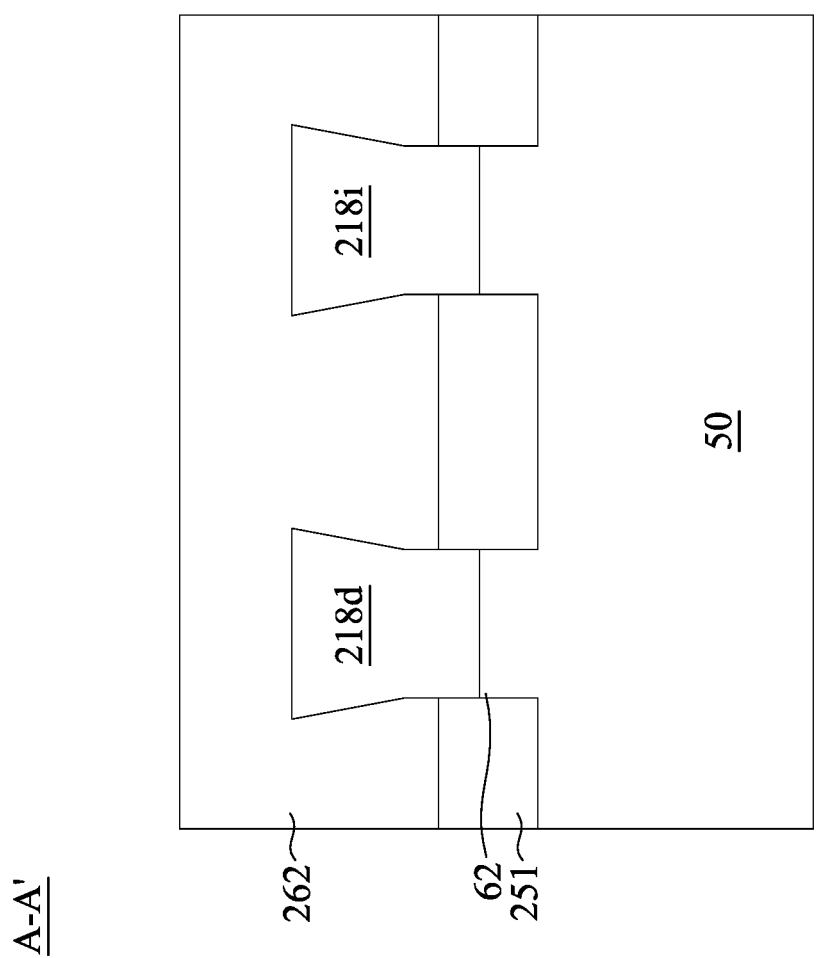
Figure 12C:
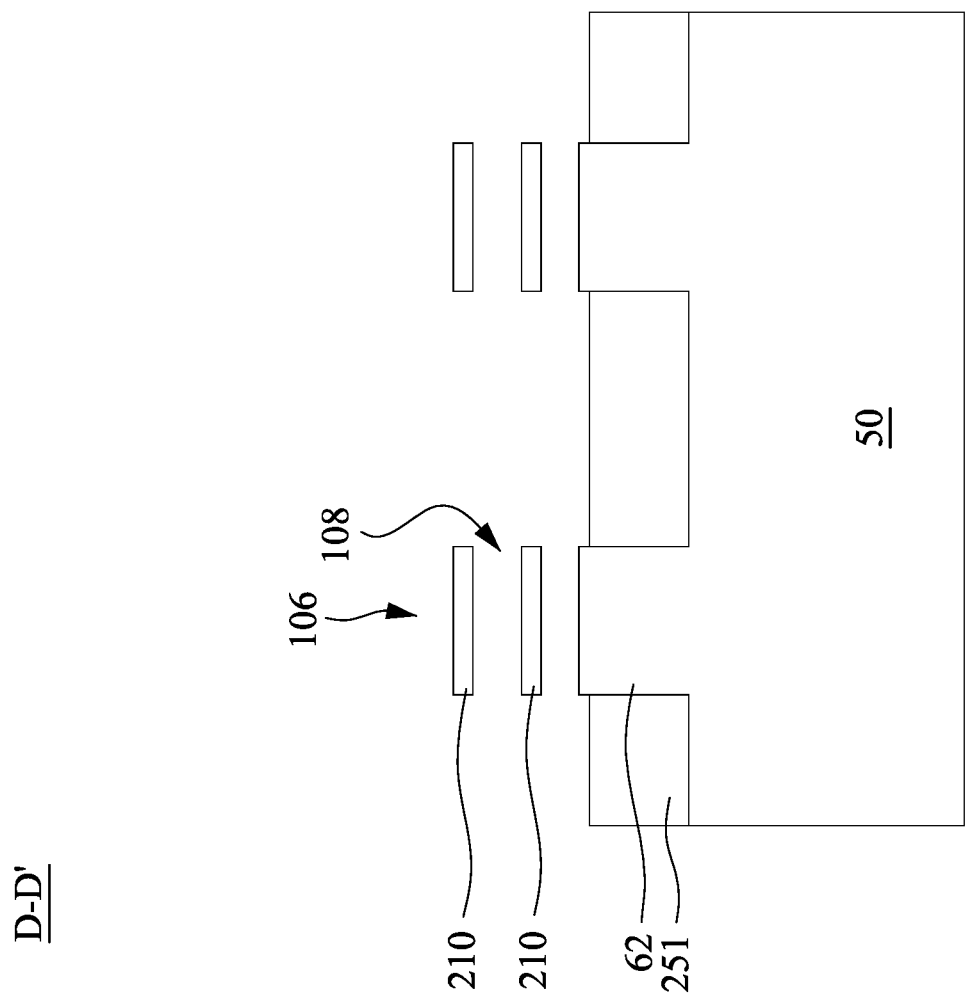
Figure 12D:
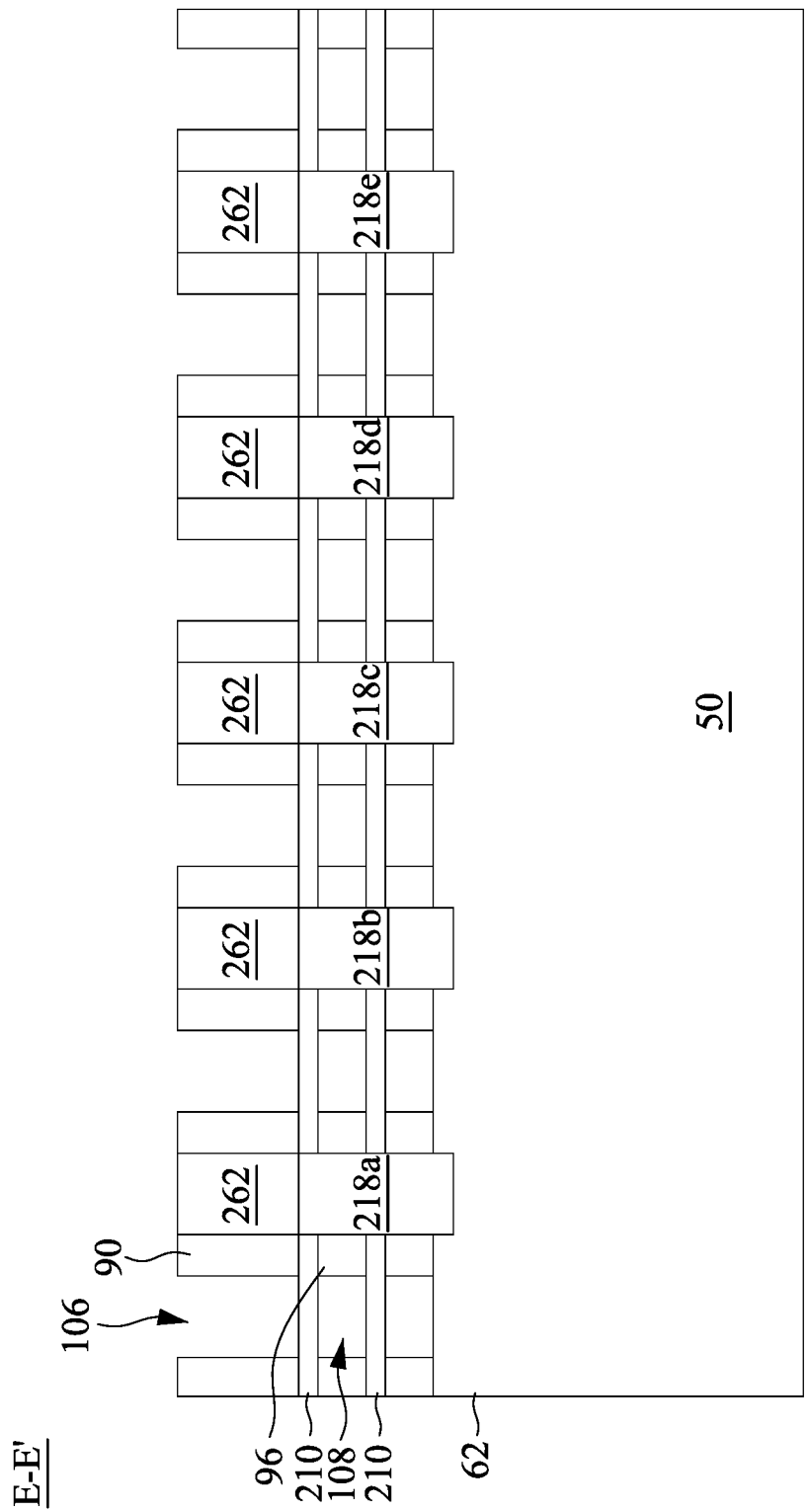

Reference is made to FIGS. 3A, 3B, and 3C. FIGS. 3A, 3B, and 3C illustrate schematic views of connections from back-side power lines to front-side power conductor layers in accordance with some embodiments of the present disclosure. As shown in FIGS. 3A, 3B, and 3C, a front-side conductive line 201a may be formed in the first interconnection layer of the logic circuit 110 in the IMD layer 264, such as a first metal layer on the front side of the semiconductor structure. A back-side conductive line 301/302 may be formed in the third interconnection layer of the logic circuit 110 on the IMD layer 332, such as a first metal layer on the back side of the semiconductor structure. The back-side conductive line 301/302 may be a power line VDD or a ground line VSS, and the front-side conductive line 201a may be electrically connected to a power conductor layer in the front side of the semiconductor structure.

As shown in FIG. 3A, a connection C1 may be formed from the back-side conductive layer 301/302 to the front-side conductive layer 201a and pass through the back-side IMD layer 332, the back-side dielectric 331, the STI structure 251, the front-side ILD layer 260, and the front-side IMD layer 264 in sequence. The connection C1 may include a back-side conductive via 245p1 in the IMD layer 332, a back-side conductive contact 240p1 in the dielectric 331, a tap via 272 in the STI structure 251, a front-side conductive contact 240p2 and a front-side conductive via 245p2 in the front-side ILD layer 260. In some embodiments, the tap via 272 may have a width W4 greater than a width W3 of the back-side conductive via 245p1. In some embodiments, the front-side conductive contact 240p2 may have a width W5 greater than the width W4 of the tap via 272.

As shown in FIG. 3B, the structure and function of the components and their relationships in the semiconductor structure are substantially the same as the semiconductor structure shown in FIG. 3A, and the related detailed descriptions may refer to the foregoing paragraphs, and are not described again herein. It is noted that, the difference between the present embodiment and the embodiment in FIG. 3A is in that the connection C2 omits the back-side conductive contact 240p1 as shown in FIG. 3A, and the tap via 272 further extend to the STI structure 251 to directly contact the back-side conductive via 245p1. As shown in FIG. 3C, the structure and function of the components and their relationships in the semiconductor structure are substantially the same as the semiconductor structure shown in FIG. 3A, and the related detailed descriptions may refer to the foregoing paragraphs, and are not described again herein. It is noted that, the difference between the present embodiment and the embodiment in FIG. 3A is in that the connection C3 omits the back-side and front side conductive contacts 240p1, 240p2 as shown in FIG. 3A, and the tap via 272 further extend to the STI structure 251 and the back-side dielectric 331 to directly contact the back-side and front-side conductive vias 245p1 and 245p2.

Figure 17A:
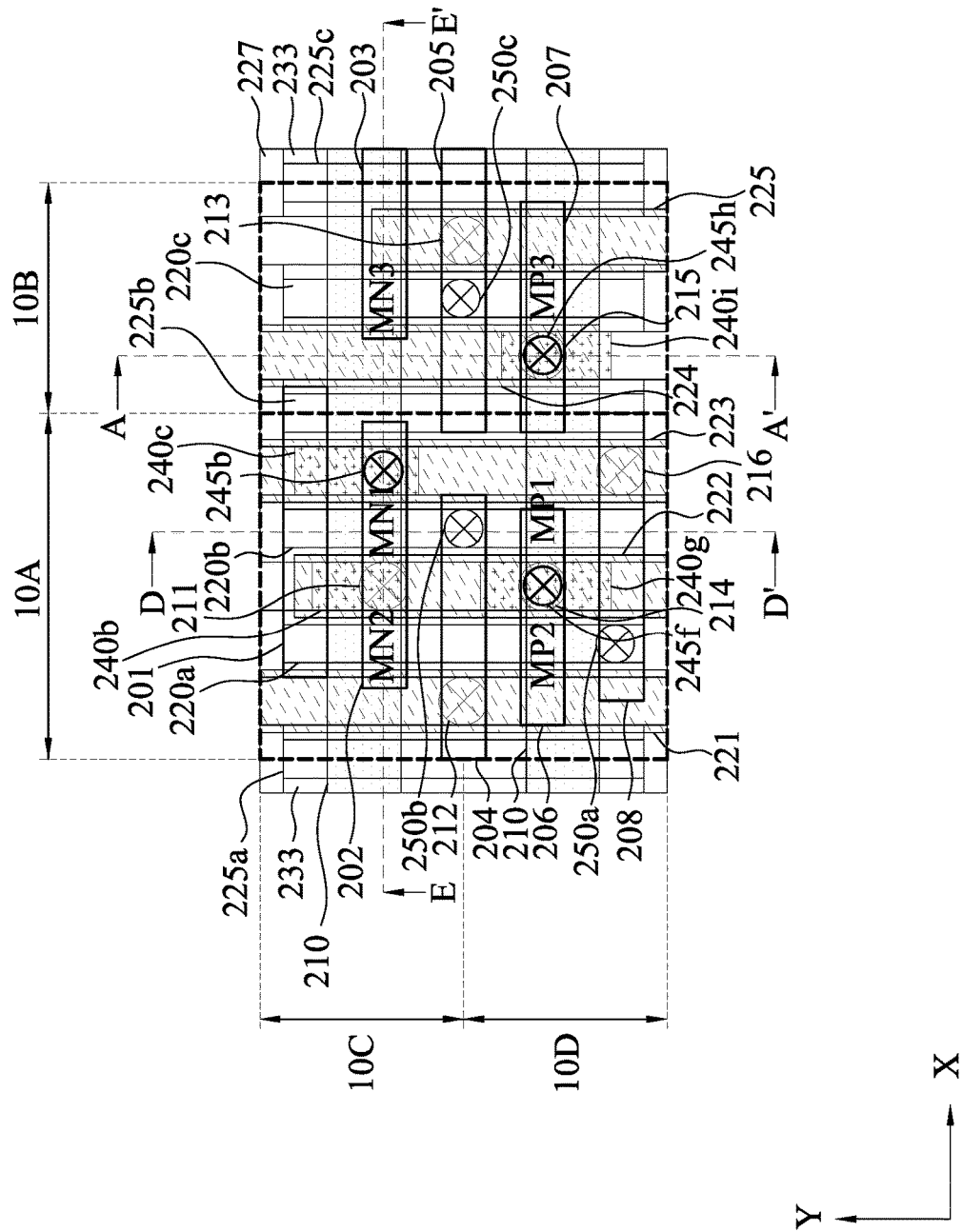
Figure 17B:
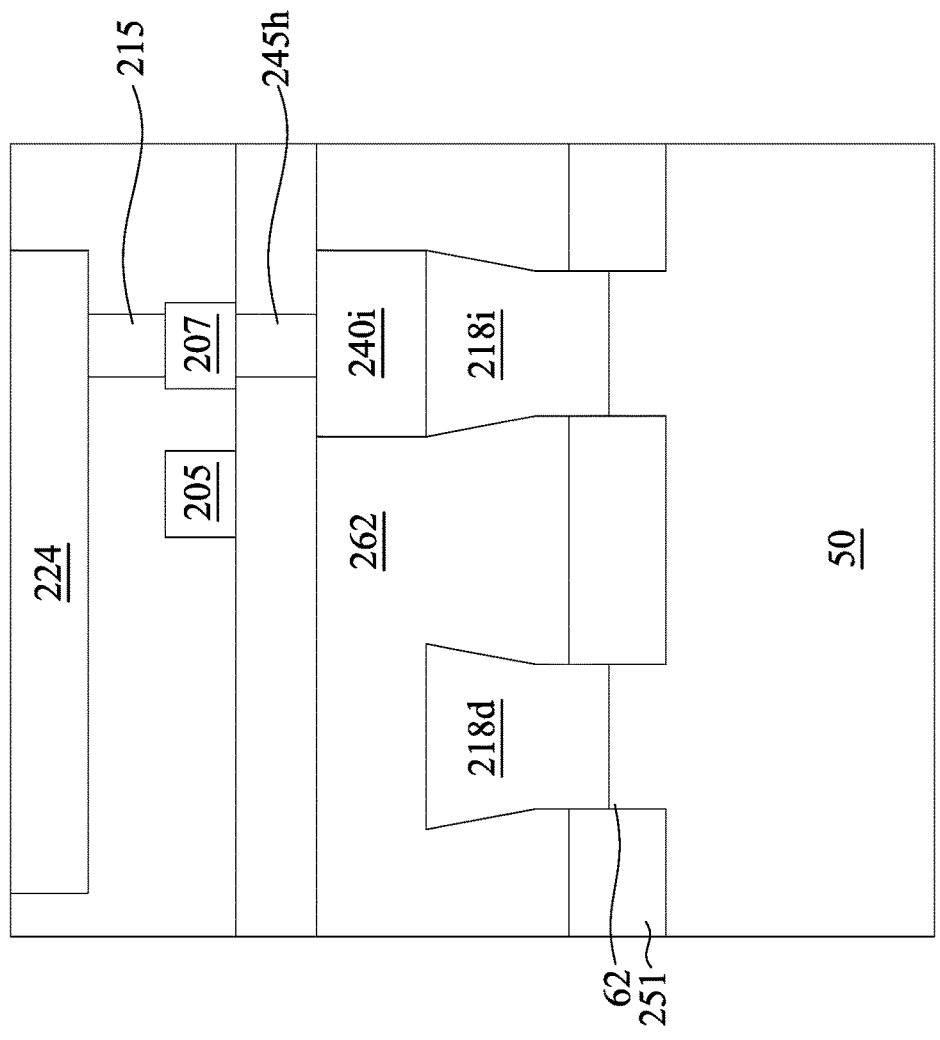
Figure 17C:
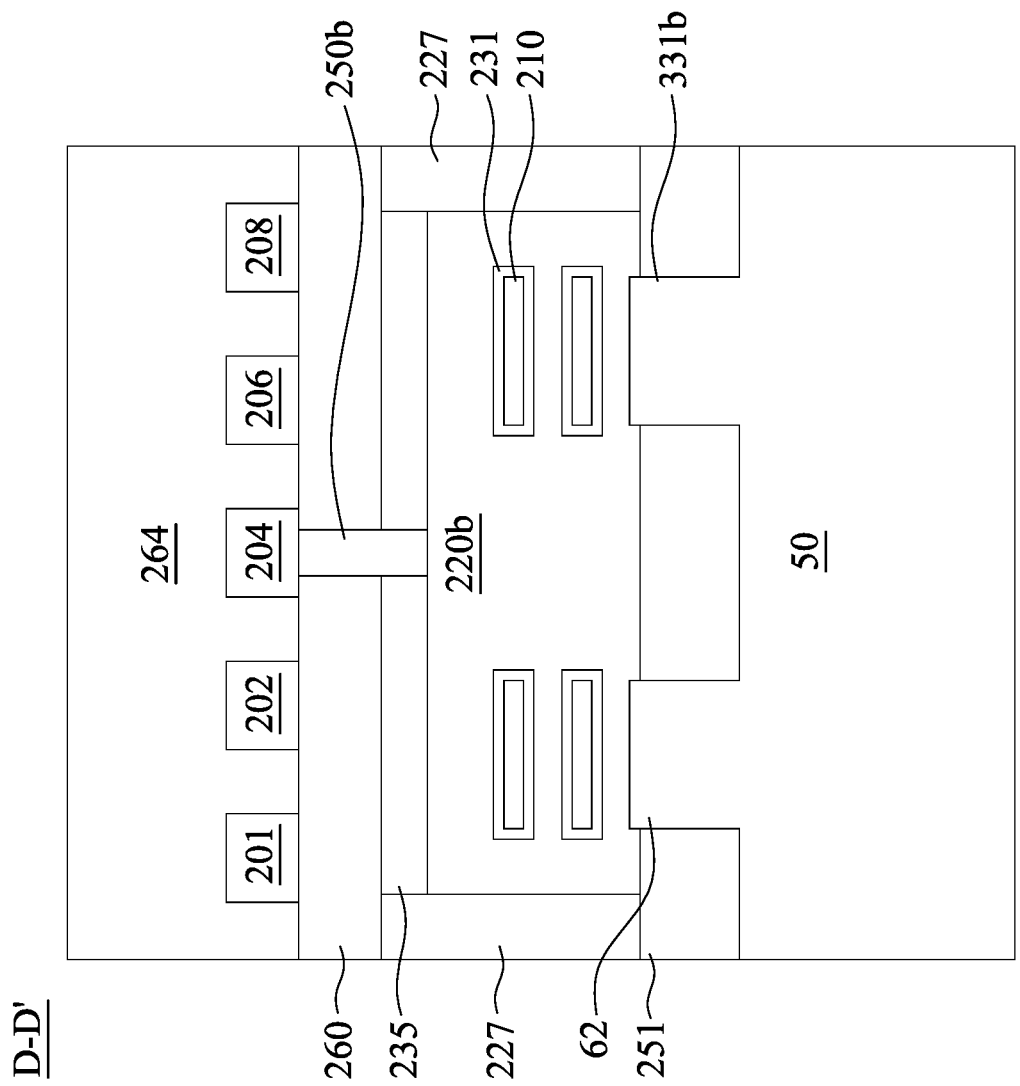
Figure 17D:
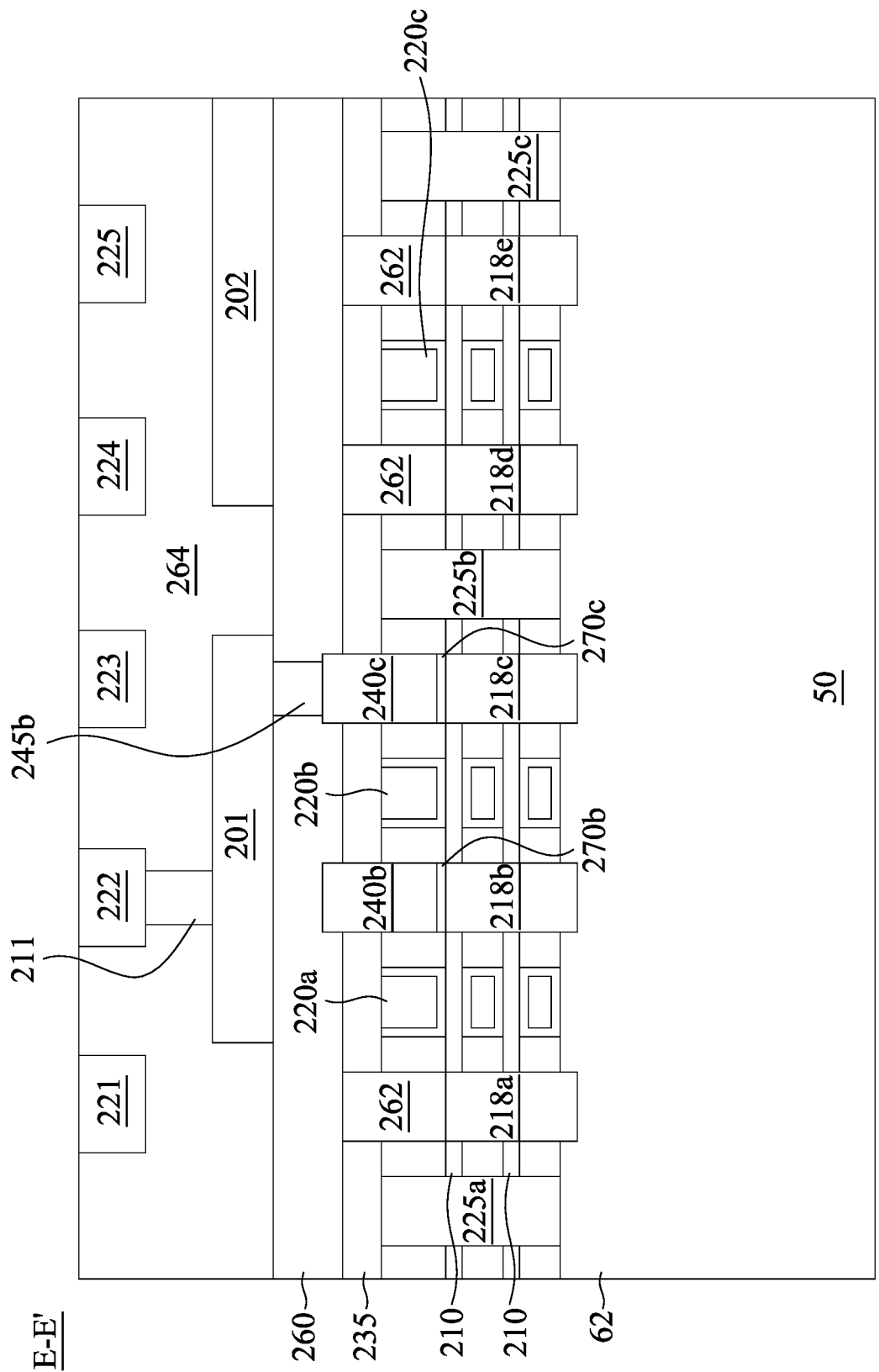
Figure 19A:
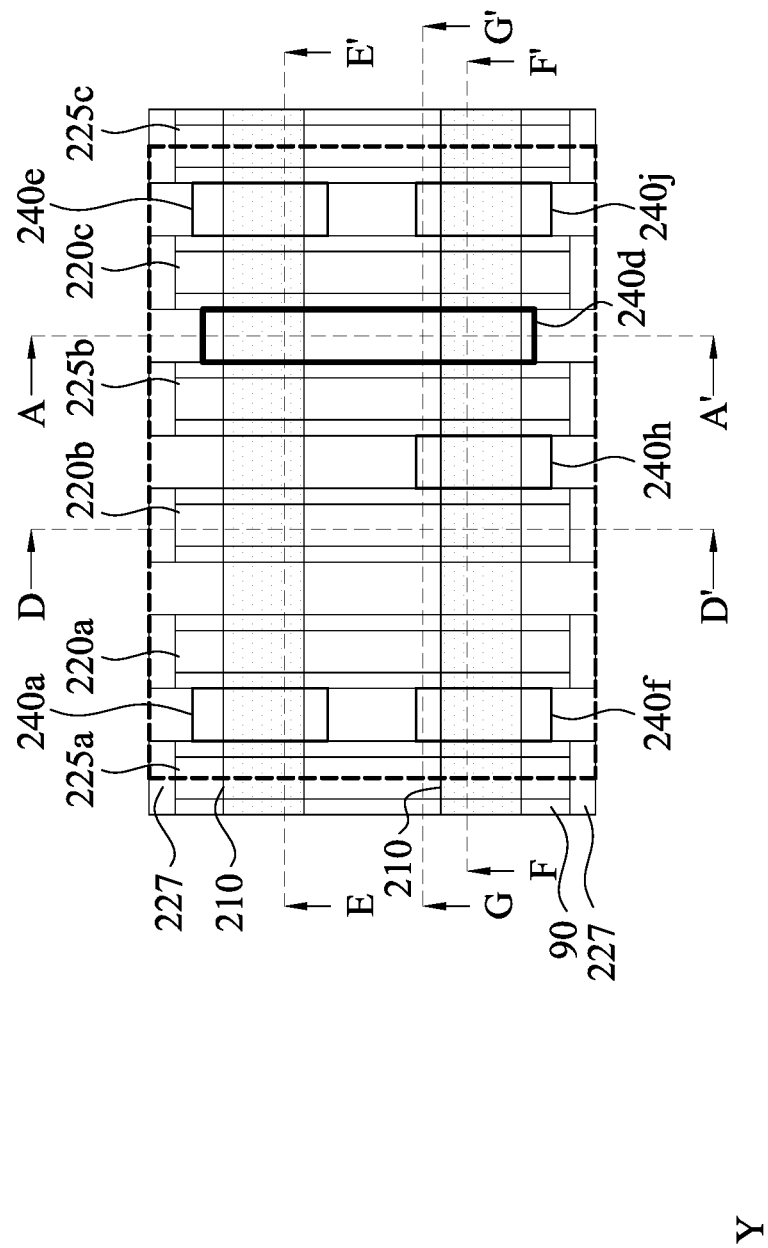
Figure 19B:
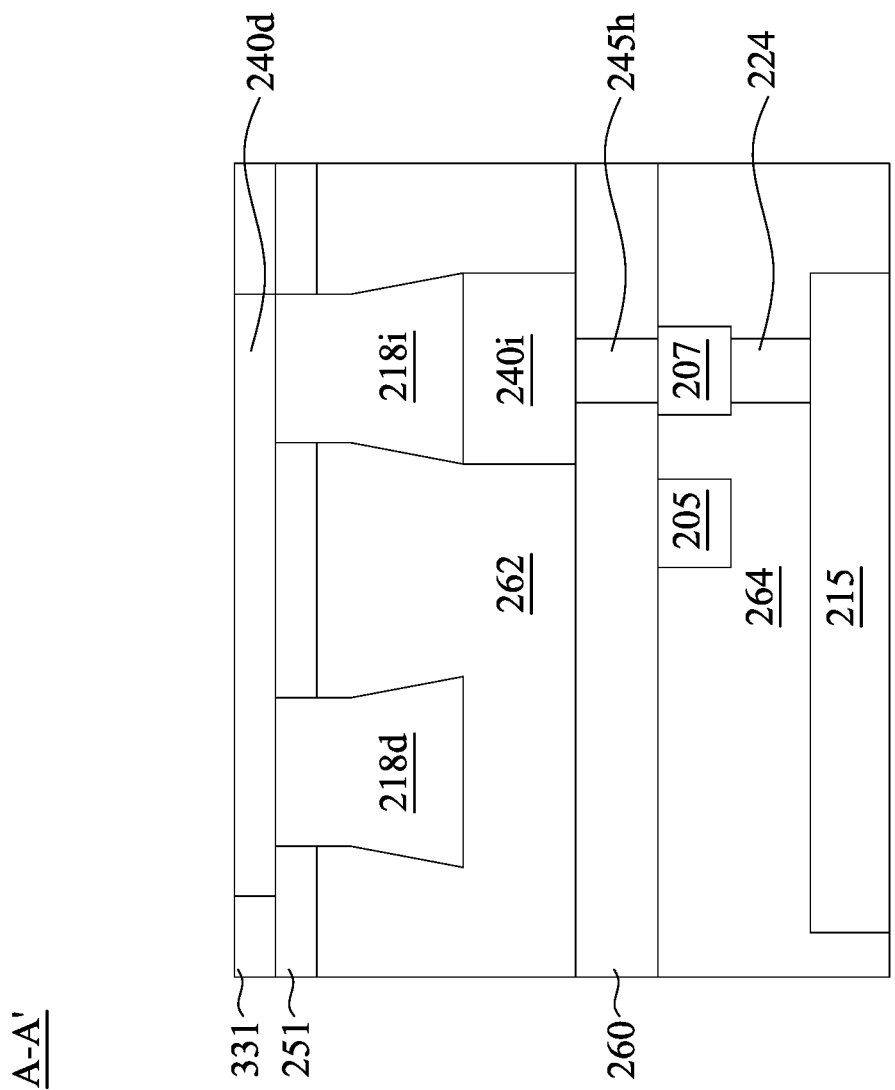
Figure 19C:
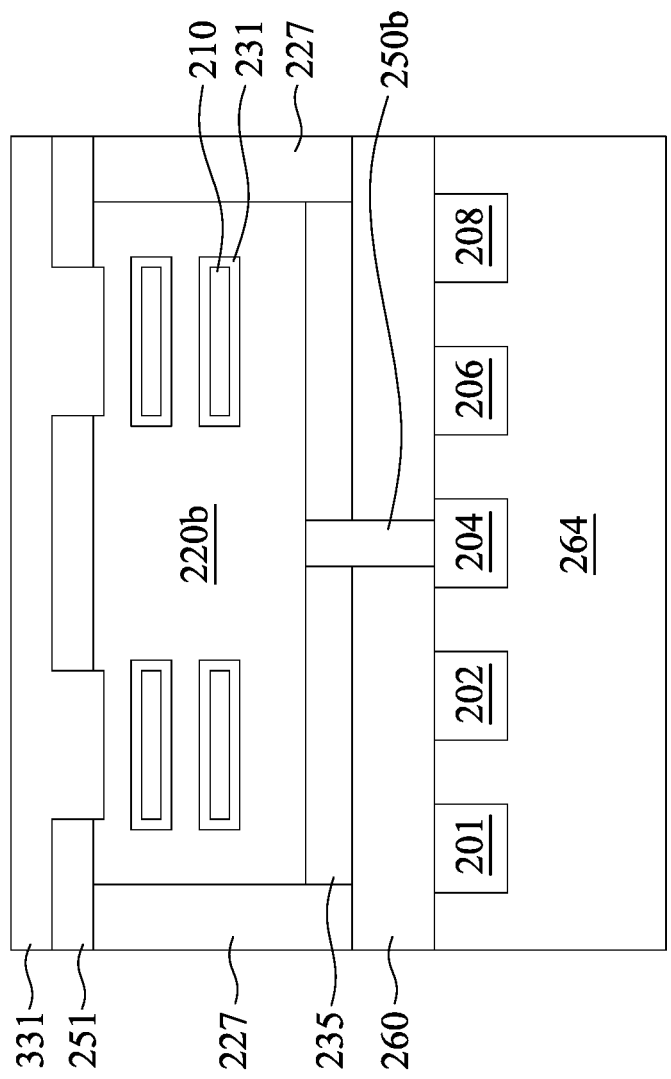
Figure 19D:
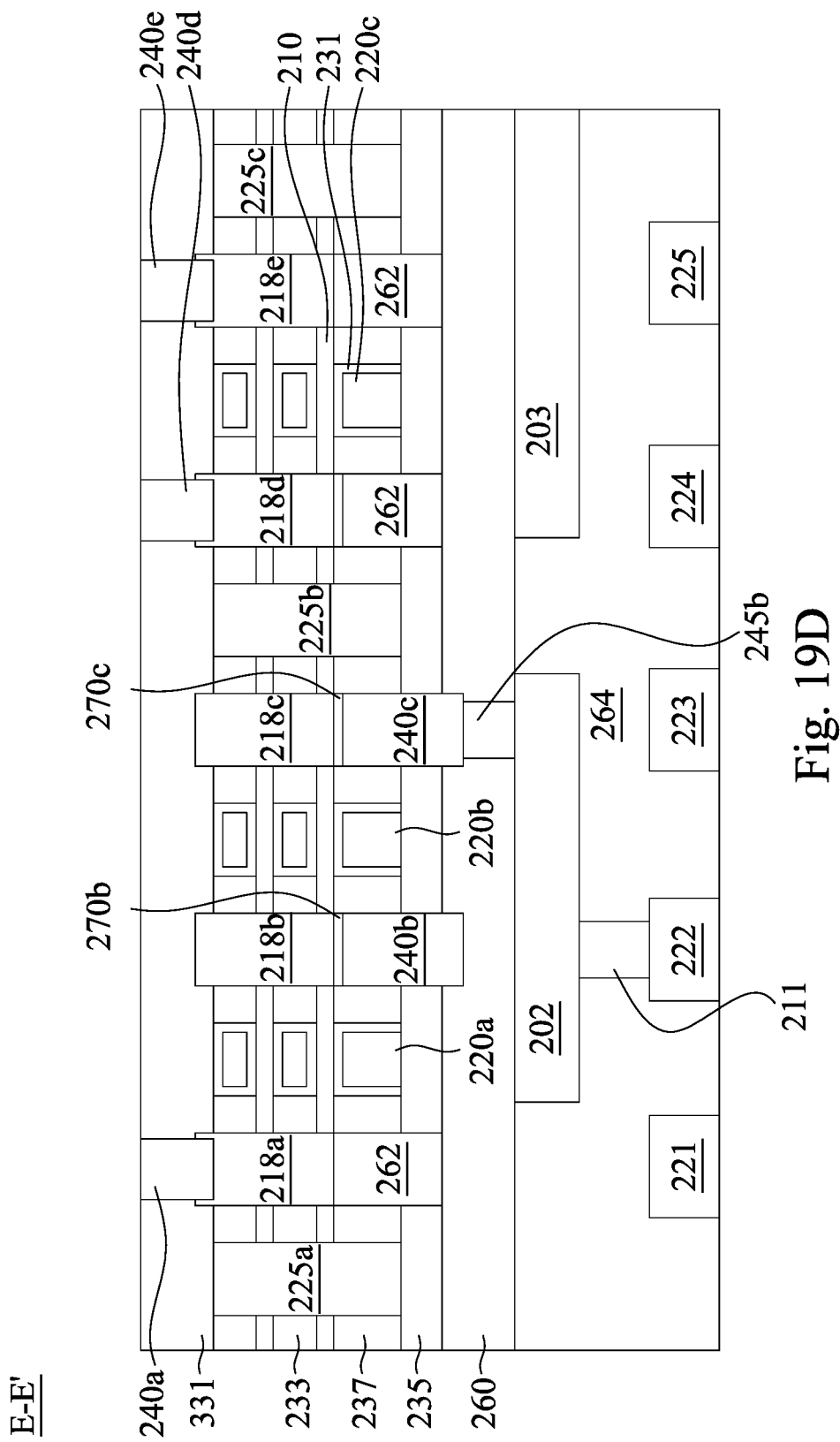
Figure 19E:
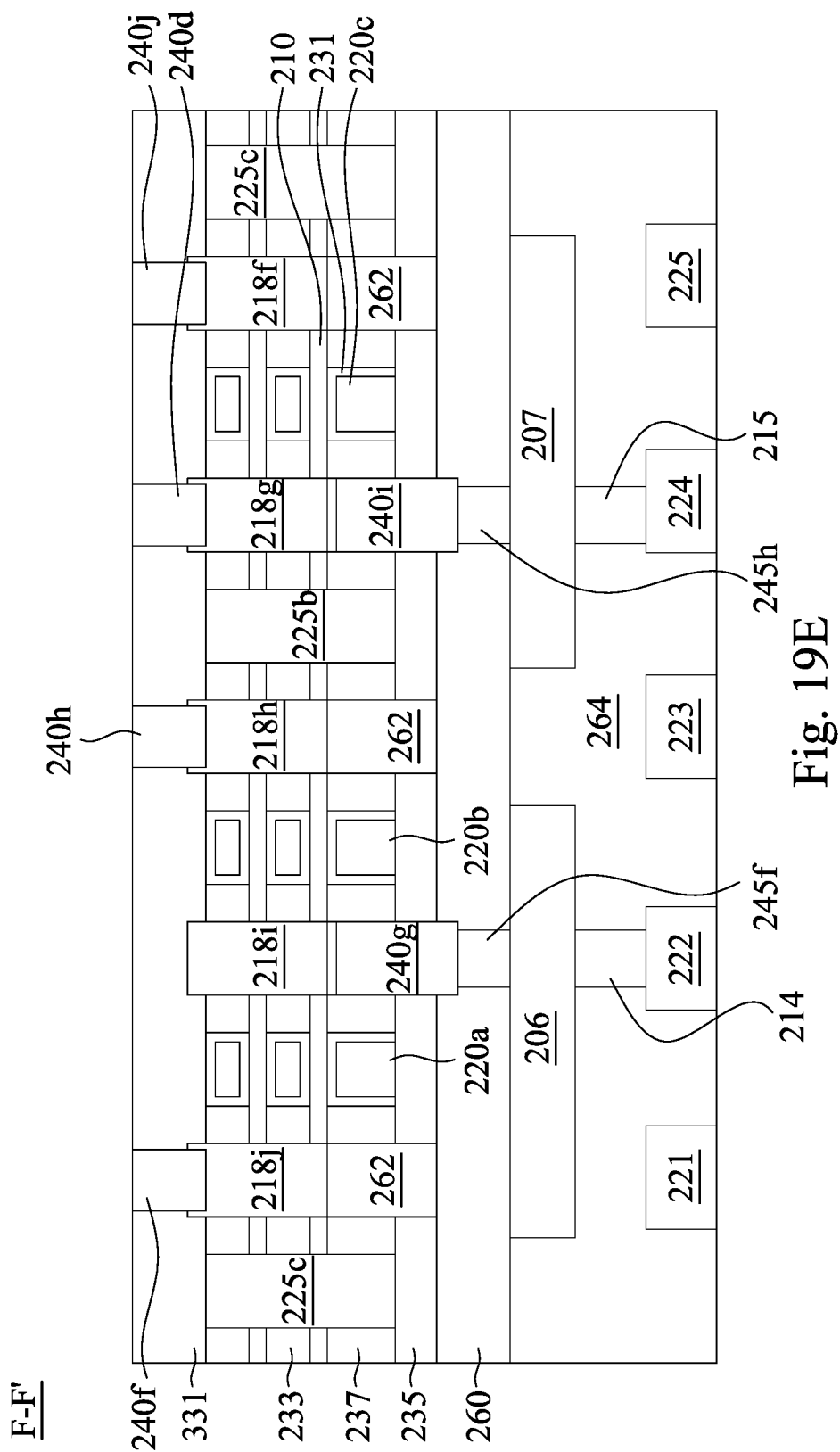
Figure 19F:
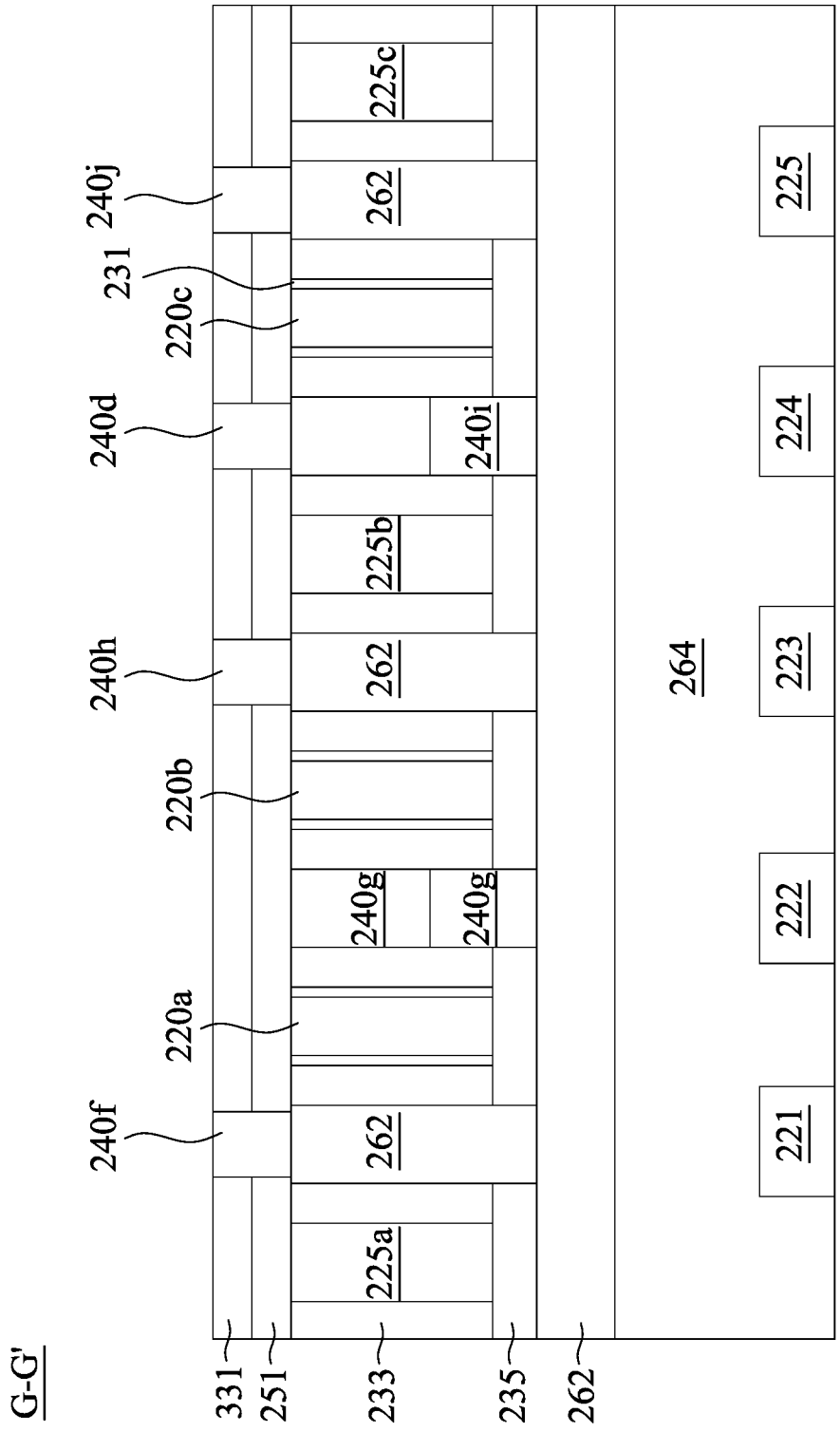
Figure 20A:
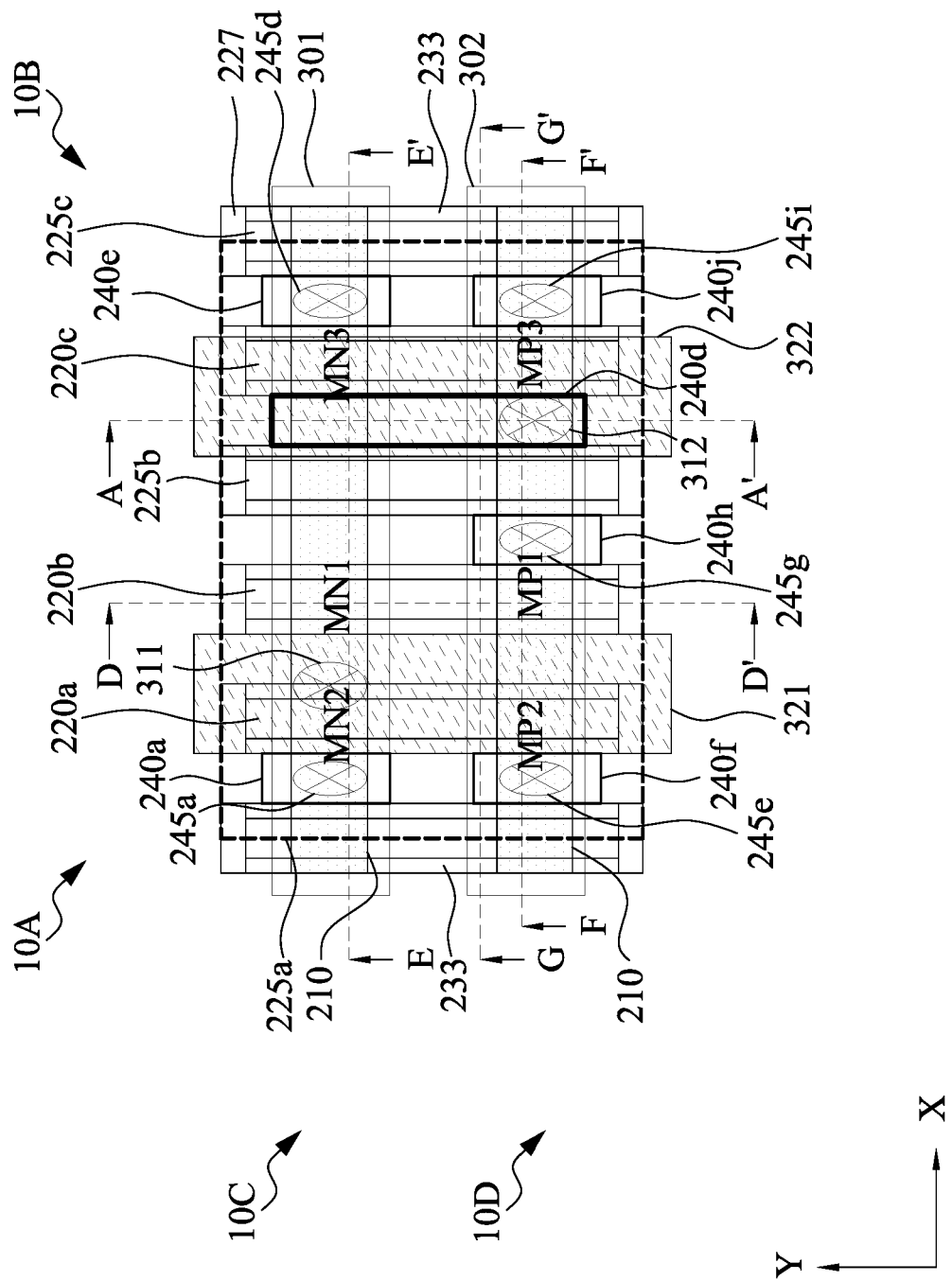
Figure 20B:
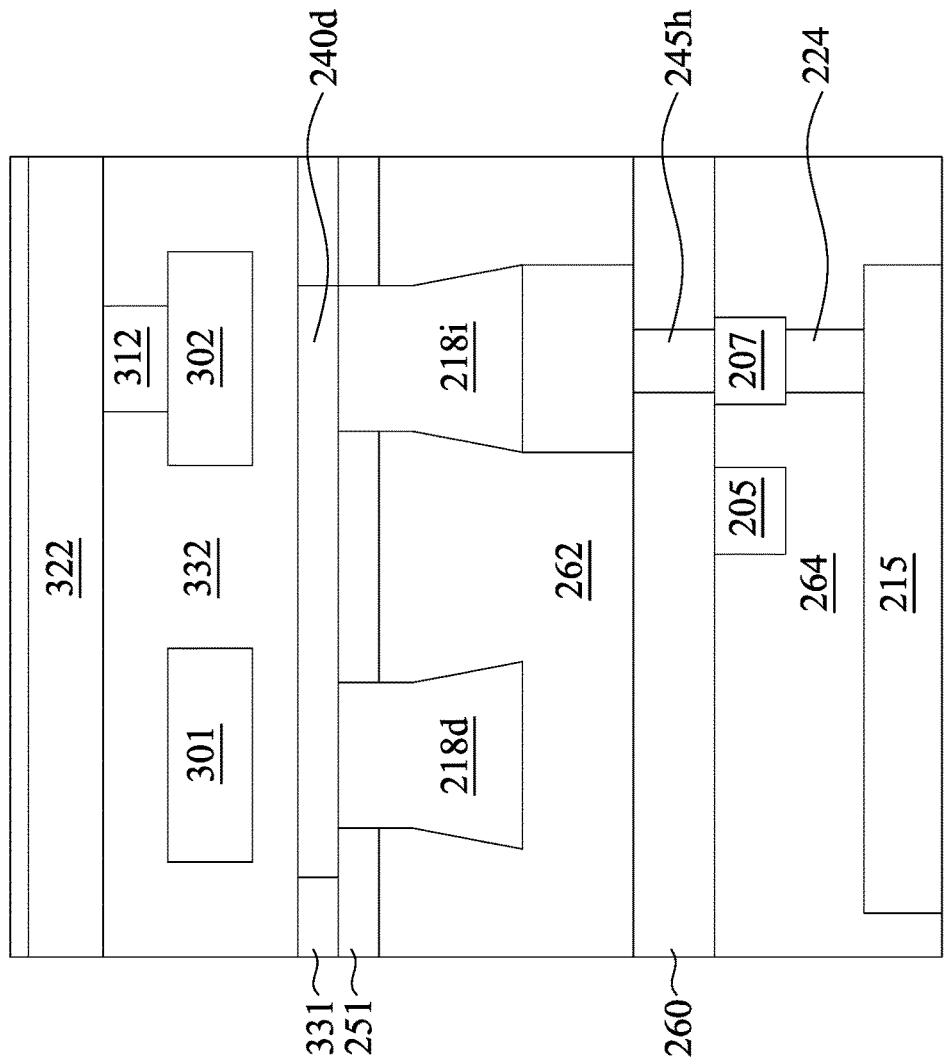
Figure 20C:
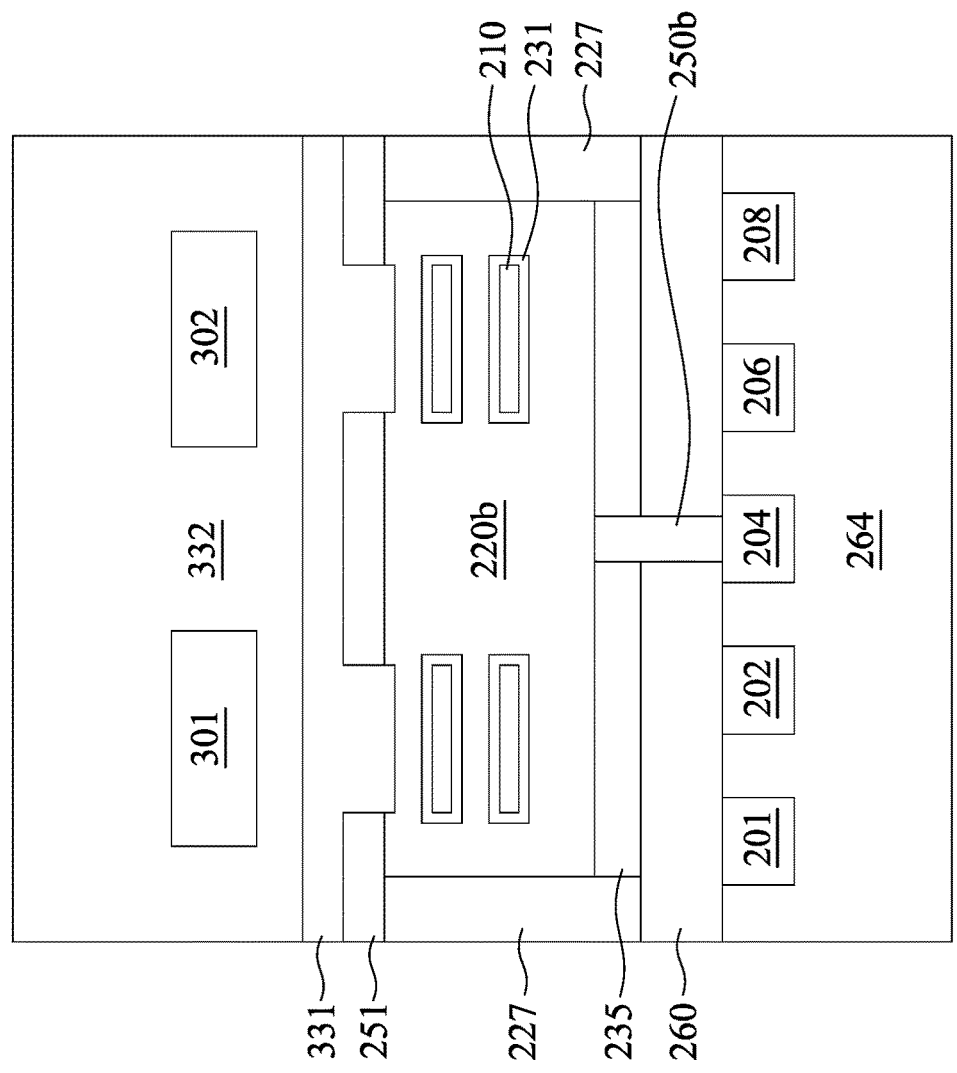
Figure 20D:
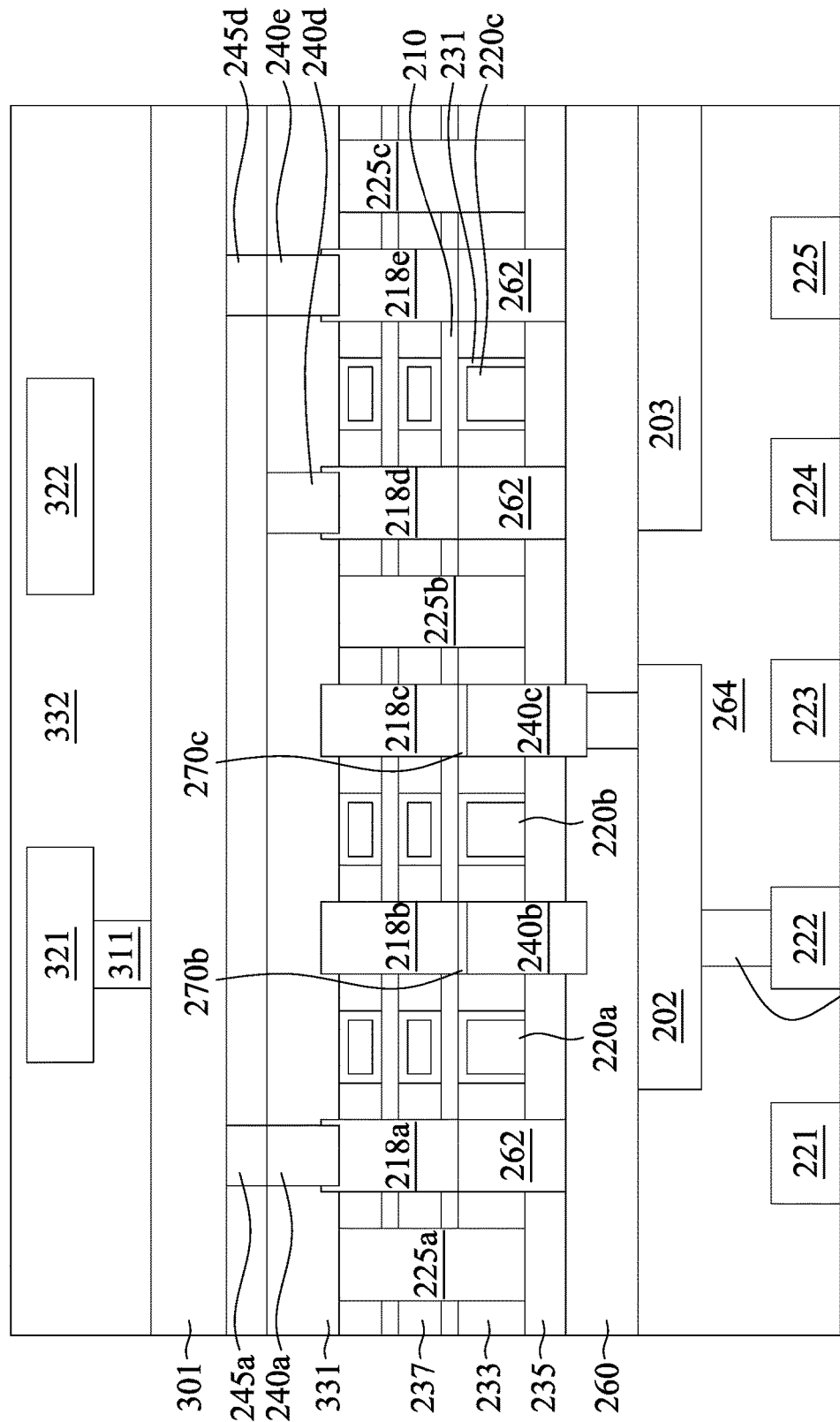
Figure 20E:
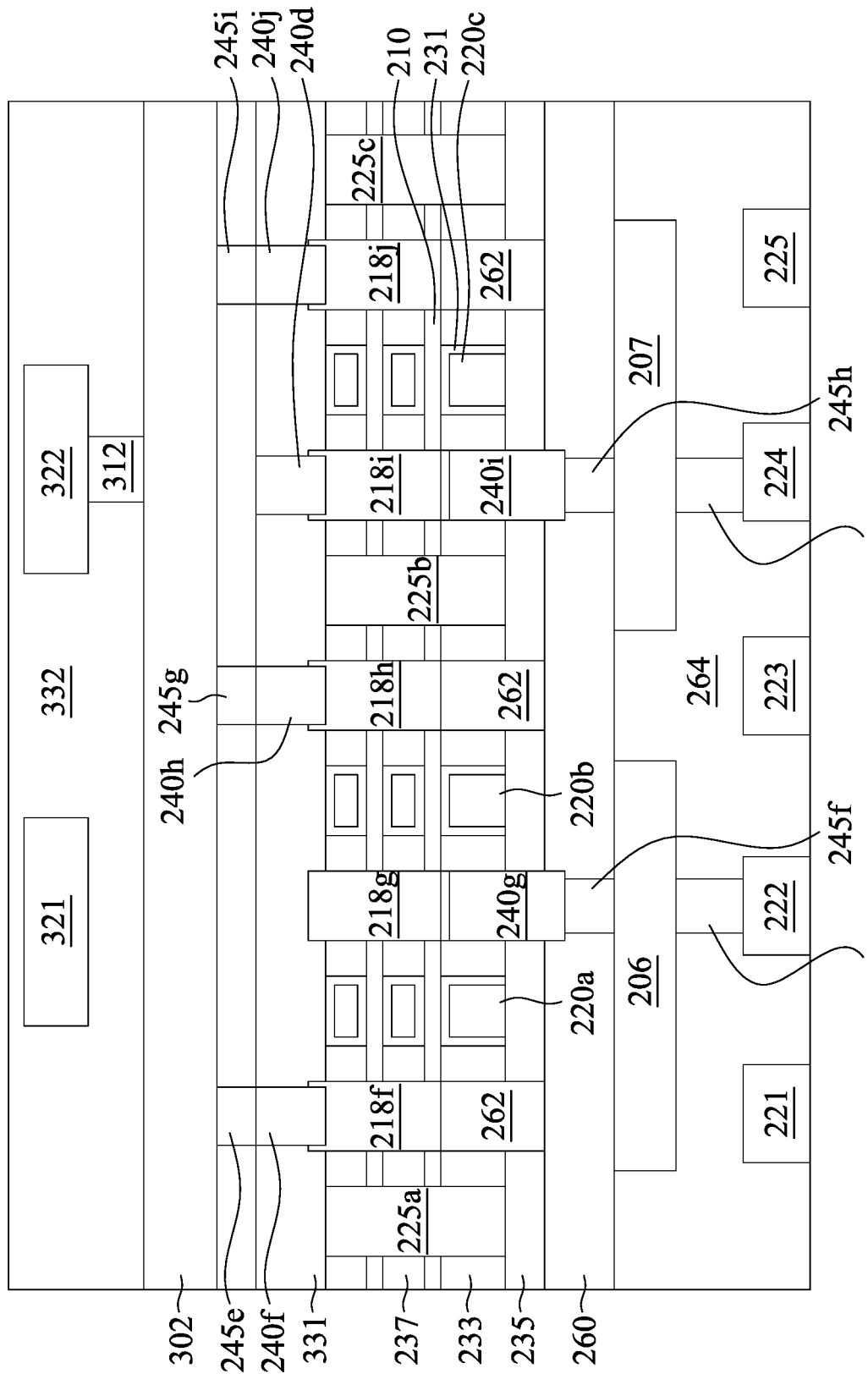
Figure 20F:
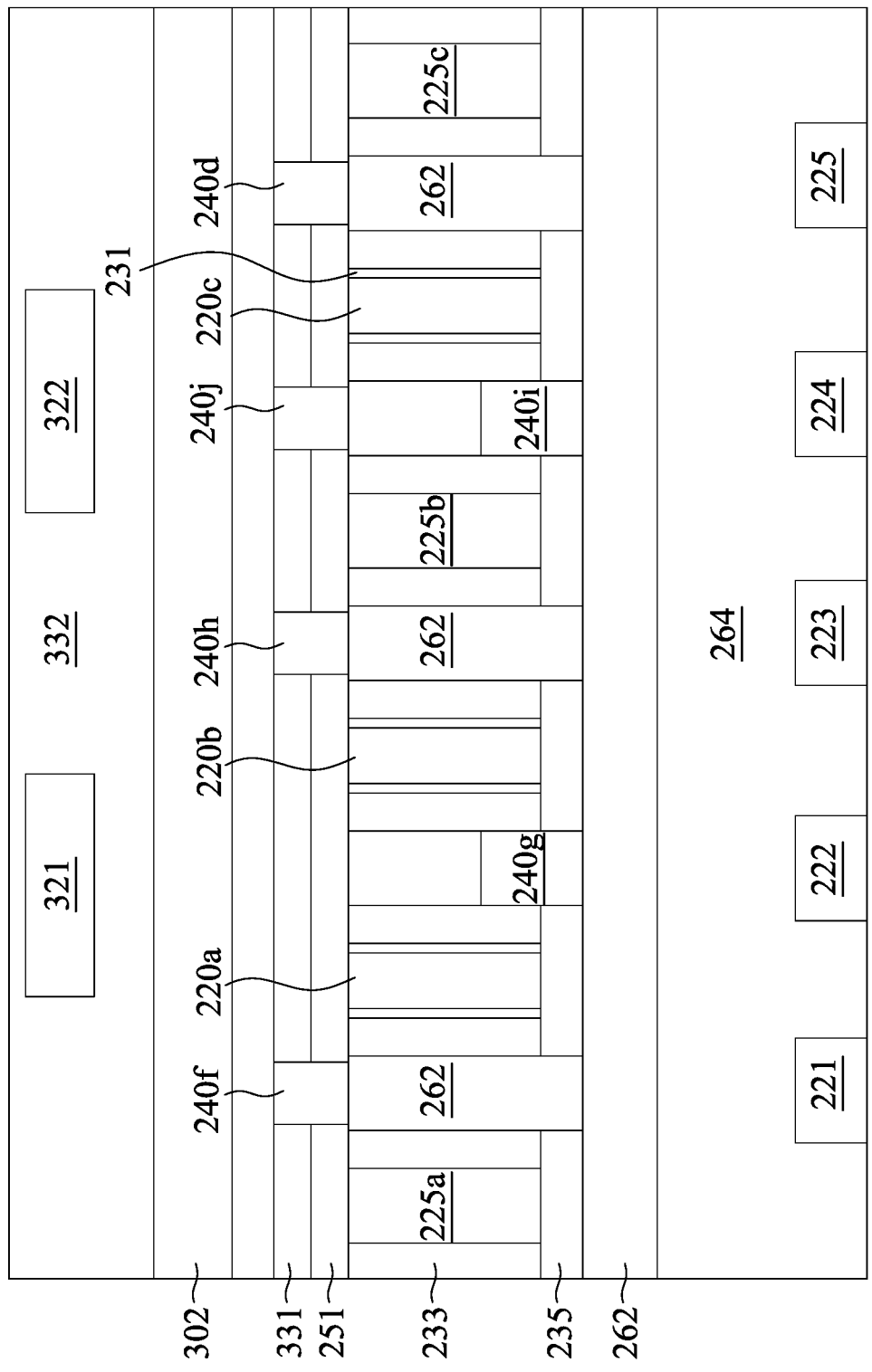

FIGS. 4A, 5A, 6A, 7A, 8A, 9A, 10A, 11A, 12A, 13A, 14A, 15A, 16A, 17A, 18A, 19A, and 20A illustrate a cell arras layout diagram of a portion of the semiconductor structure of intermediate stages in the formation of a semiconductor device in accordance with some embodiments of the present disclosure. FIGS. 4B, 5A, 6A, 7B, 8B, 9B, 10B, 11B, 12B, 13B, 14B, 15B, 16B, 17B, 18B, 19B, and 20B illustrate cross-sectional views obtained from reference cross-section A-A' in FIGS. 4A, 5A, 6A, 7A, 8A, 9A, 10A, 11A, 12A, 13A, 14A, 15A, 16A, 17A, 18A, 19A, and 20A, respectively. FIGS. 4C, 5C, 6C, 7C, 8C, 9C, 10C, 11C, 12C, 13C, 14C, 15C, 16C, 17C, 18C, 19C, and 20C illustrate cross-sectional views obtained from reference cross-section D-D' in FIGS. 4A, 5A, 6A, 7A, 8A, 9A, 10A, 11A, 12A, 13A, 14A, 15A, 16A, 17A, 18A, 19A, and 20A, respectively. FIGS. 4D, 5D, 6D, 7D, 8D, 9D, 10D, 11D, 12D, 13D, 14D, 15D, 16D, 17D, 18D, 19D, and 20D illustrate cross-sectional views obtained from reference cross-section E-E' in FIGS. 4A, 5A, 6A, 7A, 8A, 9A, 10A, 11A, 12A, 13A, 14A, 15A, 16A, 17A, 18A, 19A, and 20A, respectively. FIGS. 18E, 19E, and 20E illustrate cross-sectional views obtained from reference cross-section F-F' in FIGS. 18A, 19A, and 20A, respectively. FIGS. 18F, 19F, and 20F illustrate cross-sectional views obtained from reference cross-section G-G' in FIGS. 18A, 19A, and 20A, respectively.

Reference is made to FIGS. 4A, 4B, 4C, and 4D. A substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Subsequently, a multi-layer stack 42 is formed over the substrate 50. The multi-layer stack 42 includes alternating first semiconductor layers 310 and second semiconductor layers 210'. The first semiconductor layers 310' formed of a first semiconductor material, and the second semiconductor layers 210' are formed of a second semiconductor material. The semiconductor materials may each be selected from the candidate semiconductor materials of the substrate 50. In some embodiments, the multi-layer stack 42 includes two layers of each of the first semiconductor layers 310 and the second semiconductor layers 210'. It should be appreciated that the multi-layer stack 42 may include any number of the first semiconductor layers 310' and the second semiconductor layers 210'.

In some embodiments, and as will be subsequently described in greater detail, the first semiconductor layers 310' will be removed and the second semiconductor layers 210' will patterned to form channel regions for the nano-FETs in both the first type and second conductivity type device regions 10C and 10D as shown in FIGS. 1A and 1B. The first semiconductor layers 310' are sacrificial layers (or dummy layers), which will be removed in subsequent processing to expose the top surfaces and the bottom surfaces of the second semiconductor layers 210'. The first semiconductor material of the first semiconductor layers 310' is a material that has a high etching selectivity from the etching of the second semiconductor layers 210', such as silicon germanium. The second semiconductor material of the second semiconductor layers 210' is a material suitable for both n-type and p-type devices, such as silicon.

In some embodiments, the first semiconductor material of the first semiconductor layers 310' may be made of a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. The first semiconductor material and the second semiconductor material may have a high etching selectivity from the etching of one another. Each of the layers of the multi-layer stack 42 may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 42 may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 210') are formed to be thinner than other layers (e.g., the first semiconductor layers 310'). For example, in embodiments in which the first semiconductor layers 310' are sacrificial layers (or dummy layers) and the second semiconductor layers 210' are patterned to form channel regions for the nano-FETs in both the first type and second conductivity type device regions 10C and 10D as shown in FIGS. 1A and 1B.

Reference is made to FIGS. 5A, 5B, 5C, and 5D. Trenches T1 are patterned in the substrate 50 and the multilayer stack 42 to form fins 62, first semiconductor sheets 310, and second semiconductor sheets 210. The fins 62 are semiconductor strips patterned in the substrate 50. The first semiconductor sheets 310 and the second semiconductor sheets 210 include the remaining portions of the first semiconductor layers 310' and the second semiconductor layers 210', respectively. The trenches T1 may be patterned by any acceptable etch process, such as a reactive ion etch (RIE), neutral beam etch (NBE), the like, or a combination thereof. The etching may be anisotropic.

The fins 62 and the first and second semiconductor sheets 310, 210 may be patterned by any suitable method. For example, the fins 62 and the first and second semiconductor sheets 310, 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the first and second semiconductor sheets 310, 210. In some embodiments, the mask (or other layer) may remain on the first and second semiconductor sheets 310, 210.

The fins 62 and the first and second semiconductor sheets 310, 210 may each have widths in a range of about 8 nm to about 40 nm. In some embodiments, the fins 62 and the first and second semiconductor sheets 310, 210 have substantially equal widths in the first type and second conductivity type device regions 10C and 10D as shown in FIGS. 1A and 1B. In some embodiments, the fins 62 and the first and second semiconductor sheets 310, 210 in one region (e.g., the first conductivity type device region 10C as shown in FIGS. 1A and 1B) are wider or narrower than the fins 62 and the first and second semiconductor sheets 310, 210 in another region (e.g., the second conductivity type device region 10D as shown in FIGS. 1A and 1B).

Reference is made to FIGS. 6A, 6B, 6C, and 6D. STI structures 251 are formed over the substrate 50 and between adjacent fins 62. The STI structures 251 are disposed around at least a portion of the fins 62 such that at least a portion of the first and second semiconductor sheets 310, 210 protrude from between adjacent STI structures 251. In some embodiments, the top surfaces of the STI structures 70 are coplanar (within process variations) with the top surfaces of the fins 62. In some embodiments, the top surfaces of the STI structures 251 are above or below the top surfaces of the fins 62. The STI structures 251 separate the features of adjacent devices.

The STI structures 251 may be formed by any suitable method. For example, an insulation material can be formed over the substrate 50 and the first and second semiconductor sheets 310, 210, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the first and second semiconductor sheets 310, 210. Although the STI structures 251 are each illustrated as a single layer, some embodiments may utilize multiple layers. For example, in some embodiments a liner (not separately illustrated) may first be formed along surfaces of the substrate 50, the fins 62, and the first and second semiconductor sheets 310, 210. Thereafter, a fill material, such as those previously described may be formed over the liner.

A removal process is then applied to the insulation material to remove excess insulation material over the first and second semiconductor sheets 310, 210. In some embodiments, a planarization process such as a chemical mechanical polish (CMP), an etch-back process, combinations thereof, or the like may be utilized. In embodiments in which a mask remains on the first and second semiconductor sheets 310, 210, the planarization process may expose the mask or remove the mask. After the planarization process, the top surfaces of the insulation material and the mask (if present) or the first and second semiconductor sheets 310, 210 are coplanar (within process variations). Accordingly, the top surfaces of the mask (if present) or the first and second semiconductor sheets 310, 210 are exposed through the insulation material. In some embodiments, no mask remains on the first and second semiconductor sheets 310, 210. The insulation material is then recessed to form the STI structures 251. The insulation material is recessed, such as in a range from about 30 nm to about 80 nm, such that at least a portion of the first and second semiconductor sheets 310, 210 protrude from between adjacent portions of the insulation material. Further, the top surfaces of the STI structures 251 may have a flat surface as illustrated, a convex surface, a concave surface (such as dishing), or a combination thereof. The top surfaces of the STI structures 251 may be formed flat, convex, and/or concave by an appropriate etch. The insulation material may be recessed using any acceptable etching process, such as one that is selective to the material of the insulation material (e.g., selectively etches the insulation material of the STI structures 251 at a faster rate than the materials of the fins 62 and the first and second semiconductor sheets 310, 210). For example, an oxide removal may be performed using dilute hydrofluoric (dHF) acid.

The process previously described is just one example of how the fins 62 and the first and second semiconductor sheets 310, 210 may be formed. In some embodiments, the fins 62 and/or the first and second semiconductor sheets 310, 210 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the first and second semiconductor sheets 310, 210. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Reference is made to FIGS. 7A, 7B, 7C, and 7D. A dummy dielectric layer, a dummy gate layer, and a mask layer are sequentially formed on the fins 62 and the first and second semiconductor sheets 310, 210. The dummy dielectric layer is formed on the fins 62 and the first and second semiconductor sheets 310, 210. The dummy dielectric layer may be formed of a dielectric material such as silicon oxide, silicon nitride, a combination thereof, or the like, which may be deposited or thermally grown according to acceptable techniques. Subsequently, a dummy gate layer is formed over the dummy dielectric layer. Subsequently, a mask layer is formed over the dummy gate layer. The dummy gate layer may be deposited over the dummy dielectric layer and then planarized, such as by a CMP. The mask layer may be deposited over the dummy gate layer. The dummy gate layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer may be formed of material(s) that have a high etching selectivity from the etching of insulation materials, e.g., the STI structures 251 and or the dummy dielectric layer. The mask layer may be formed of a dielectric material such as silicon nitride, silicon oxynitride, or the like. In this example, the dummy gate layer and mask layer are formed across the first type and second conductivity type device regions 10C and 10D as shown in FIGS. 1A and 1B. In some embodiments, the dummy dielectric layer covers the fins 62, the first and second semiconductor sheets 310, 210, and the STI structures 251, such that the dummy dielectric layer extends over the STI structures 251 and between the dummy gate layer and the STI structures 251. In another embodiment, the dummy dielectric layer covers only the fins 62 and the first and second semiconductor sheets 310, 210.

The mask layer is patterned using acceptable photolithography and etching techniques to form masks 76. The pattern of the masks 76 is then transferred to the dummy gate layer by any acceptable etching technique to form dummy gates 74. The pattern of the masks 76 may optionally be further transferred to the dummy dielectric layer by any acceptable etching technique to form dummy dielectrics 72. The dummy gates 34 cover portions of the first and second semiconductor sheets 310, 210 that will be exposed in subsequent processing to form channel regions. Specifically, the dummy gates 84 extend along the portions of the second semiconductor sheets 210 that will be patterned to form channel regions. The pattern of the masks 76 may be used to physically separate adjacent dummy gates 74. The dummy gates 74 may also have lengthwise directions substantially perpendicular (within process variations) to the lengthwise directions of the fins 62. The masks 76 can optionally be removed after patterning, such as by any acceptable etching technique.

Gate spacers 90 are formed over the first and second semiconductor sheets 310, 210, on exposed sidewalls of the masks 76 (if present), the dummy gates 74, and the dummy dielectrics 72. In some embodiments, the gate spacers 90 can be interchangeably referred to top spacers or upper gate spacers. In some embodiments, the gate spacers 90 may have a lateral dimension in a range from about 4 nm to about 12 nm. In some embodiments, the gate spacer 90 may include multiple dielectric material and selected from a group consist of $SiO_2$, $Si_3N_4$, carbon doped oxide, nitrogen doped oxide, porous oxide, air gap, or combinations thereof. The gate spacers 90 may be formed by conformally depositing one or more dielectric materials) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 90).

Reference is made to FIGS. 8A, 8B, 8C, and 8D. Source/drain recesses 94 are formed in the first and second semiconductor sheets 310, 210. In some embodiments, the source/drain recesses 94 extend through the first and second semiconductor sheets 310, 210 and into the fins 62. In some embodiments, the fins 62 may be etched such that bottom surfaces of the source/drain recesses 94 are disposed below the top surfaces of the STI structures 251. The source/drain recesses 94 may be formed by etching the first and second semiconductor sheets 310, 210 using an anisotropic etching processes, such as a RIE, a NBE, or the like. The gate spacers 90 and the dummy gates 74 collectively mask portions of the fins 62 and/or the first and second semiconductor sheets 310, 210 during the etching processes used to form the source/drain recesses 94. A single etch process may be used to etch each of the first and second semiconductor sheets 310, 210, or multiple etch processes may be used to etch the first and second semiconductor sheets 310, 210. Timed etch processes may be used to stop the etching of the source/drain recesses 94 after the source/drain recesses 94 reach a desired depth.

Reference is made to FIGS. 9A, 9B, 9C, and 9D. Inner spacers 96 are formed on sidewalls of the remaining portions of the first semiconductor sheets 310, e.g., those sidewalls exposed by the source/drain recesses 94. As will be subsequently described in greater detail, source/drain regions will be subsequently formed in the source/drain recesses 94, and the first semiconductor sheets 310 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first semiconductor sheets 310. In some embodiments, the inner spacers 96 can be interchangeably referred to lower gate spacers. In some embodiments, the inner spacers 96 may have a lateral dimension in a range from about 4 nm to about 12 nm.

As an example to form the inner spacers 96, the source/drain recesses 94 can be laterally expanded. Specifically, portions of the sidewalls of the first semiconductor sheets 310 exposed by the source/drain recesses 94 may be recessed. Although sidewalls of the first semiconductor sheets 310 are illustrated as being straight, the sidewalls may be concave or convex. The sidewalls may be recessed by any acceptable etching process, such as one that is selective to the material of the first semiconductor sheets 310 (e.g., selectively etches the material of the first semiconductor sheets 310 at a faster rate than the material of the second semiconductor sheets 210). The etching may be isotropic. For example, when the second semiconductor sheets 210 are formed of silicon and the first semiconductor sheets 310 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first semiconductor sheets 310. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. In some embodiments, the inner spacer 96 may have a higher K (dielectric constant) value than the gate spacer 90. In some embodiments, the material of inner spacer is selected from a group including $SiO_2$, $Si_3N_4$, SiON, SiOC, SiOCN base dielectric material, air gap, or combinations thereof. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 90 may partially fill, completely fill, or overfill the sidewall recesses. Moreover, although the sidewalls of the inner spacers 96 are illustrated as being straight, the sidewalls of the inner spacers 96 may be concave or convex.

Reference is made to FIGS. 10A, 10B, 10C, and 10D. Epitaxial source/drain regions 218a through 218j are formed in the source/drain recesses 94, such that each dummy gate 74 (and corresponding channel regions) is disposed between respective adjacent pairs of the epitaxial source/drain regions 218a through 218j. in some embodiments, the gate spacers 90 and the inner spacers 96 are used to separate the epitaxial source/drain regions 218a through 218j from, respectively, the dummy gates 84 and the first semiconductor sheets 310 by an appropriate lateral distance so that the epitaxial source/drain regions 218a through 218j do not short out with subsequently formed gates of the resulting nano-FETs. A material of the epitaxial source/drain regions 218a through 218j may be selected to exert stress in the respective channel regions, thereby improving performance.

The epitaxial source/drain regions 218a through 218e in the first conductivity type device region 10C may be formed by masking the second conductivity type device region 10D. Then, the epitaxial source/drain regions 218a through 218e in the first conductivity type device region 10C are epitaxially grown in the source/drain recesses 94 in the first conductivity type device region 10C. The epitaxial source/drain regions 218a through 218e may include any acceptable material appropriate for n-type devices. For example, the epitaxial source/drain regions 218a through 218e in the first conductivity type device region 10C may include materials exerting a tensile strain on the channel regions, such as silicon, silicon carbide, phosphorous doped silicon carbide, silicon phosphide, or the like. The epitaxial source/drain regions 218a through 218e in the first conductivity type device region 10C may be referred to as "n-type source/ drain regions." The epitaxial source/drain regions 218a through 218e in the first conductivity type device region 10C may have surfaces raised from respective surfaces of the fins 62 and the first and second semiconductor sheets 310, 210, and may have facets.

The epitaxial source/drain regions 218f through 218j in the second conductivity type device region 10D may be formed by masking the first conductivity type device region 10C. Then, the epitaxial source/drain regions 218f through 218j in the second conductivity type device region 10D are epitaxially grown in the source/drain recesses 94 in the second conductivity type device region 10D. The epitaxial source/drain regions 218f through 218j may include any acceptable material appropriate for p-type devices. For example, the epitaxial source/drain regions 218f through 218j in the second conductivity type device region 10D may include materials exerting a compressive strain on the channel regions, such as silicon germanium, boron doped silicon germanium, germanium, germanium tin, or the like. The epitaxial source/drain regions 218f through 218j in the second conductivity type device region 10D may be referred to as "p-type source/drain regions." The epitaxial source/drain regions 218f through 218j in the second conductivity type device region 10D may have surfaces raised from respective surfaces of the fins 62 and the first and second semiconductor sheets 310, 210, and may have facets.

Reference is made to FIGS. 11A, 11B, 11C, and 11D. An inter-layer dielectric (ILD) layer 262 is deposited over the epitaxial source/drain regions 218a through 218e, the gate spacers 90, the masks 86 (if present) or the dummy gates 74. The ILD layer 262 may be formed of a dielectric material, which may be deposited by any suitable method, such as CVD, plasma-enhanced CVD (PECVD), FCVD, or the like. Acceptable dielectric materials may include phospho-silicate glass (PSG), born-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the ILD layer 262 and the epitaxial source/drain regions 218a through 218e, the gate spacers 90, and the masks 76 (if present) or the dummy gates 74. The CESL may be formed of a dielectric material, such as silicon nitride, silicon oxide, silicon oxynitride, or the like, having a high etching selectivity from the etching of the ILD 262. The CESL may be formed by an any suitable method, such as CVD, ALD, or the like.

Subsequently, a removal process is performed to level the top surfaces of the ILD layer 262 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 90 along sidewalls of the masks 76. After the planarization process, the top surfaces of the gate spacers 90, the ILD layer 262, the CESL, and the masks 76 (if present) or the dummy gates 74 are coplanar (within process variations). Accordingly, the top surfaces of the masks 76 (if present) or the dummy gates 74 are exposed through the ILD layer 262. In some embodiments, the masks 76 remain, and the planarization process levels the top surfaces of the ILD layer 262 with the top surfaces of the masks 76.

Reference is made to FIGS. 12A, 12B, 12C, and 12D. The masks 76 (if present) and the dummy gates 74 are removed in an etching process, so that recesses 106 are formed. Portions of the dummy dielectrics 72 in the recesses 106 are also removed. In some embodiments, the dummy gates 74 are removed by an anisotropic dry etch process. For example, the etching process may include e dry etch process using reaction gas(es) that selectively etch the dummy gates 74 at a faster rate than the ILD layer 262 or the gate spacers 90. During the removal, the dummy dielectrics 72 may be used as etch stop layers when the dummy gates 74 are etched. The dummy dielectrics 72 are then removed. Each recess 106 exposes and/or overlies portions of the channel regions. Portions of the second semiconductor sheets 210 which act as the channel regions are disposed between adjacent pairs of the epitaxial source/drain regions 218a through 218e.

The remaining portions of the first semiconductor sheets 310 are then removed to expand the recesses 106, such that openings 108 are formed in regions between the second semiconductor sheets 210. The remaining portions of the first semiconductor sheets 310 can be removed by any acceptable etching process that selectively etches the material of the first semiconductor sheets 310 at a faster rate than the material of the second semiconductor sheets 210. The etching may be isotropic. For example, when the first semiconductor sheets 310 are formed of silicon germanium and the second semiconductor sheets 210 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second semiconductor sheets 210. In some embodiments, the removing of the remaining portions of the first semiconductor sheets 310 can be interchangeably referred to as a channel releasing process. The second semiconductor sheets 210 can be interchangeably referred to as a vertically stacked multiple channels (sheets) and may have a vertically sheet pitch within a range of from about 10 nm to about 30 nm. In some embodiments, the second semiconductor sheets 210 may have a thickness within a range from about 4 nm to about 10 nm. In some embodiments, the vertically sheet pitch of the between adjacent two of the second semiconductor sheets 210 may be within a range from about 6 to about 20.

Reference is made to FIGS. 13A, 13B, 13C, and 13D. Gate structures are formed to wrap around the second semiconductor sheets 210. A gate dielectric layer 231 is formed in the recesses 106. Gate electrode layers 220a through 220f are formed on the gate dielectric layer 231. The gate dielectric layer 231 and the gate electrode layers 220a through 220f are layers for replacement gates, and each wrap around all (e.g., four) sides of the second semiconductor sheet 210. In some embodiments, the gate structure can be interchangeably referred to as a gate strip or a gate pattern.

Figure 13A:
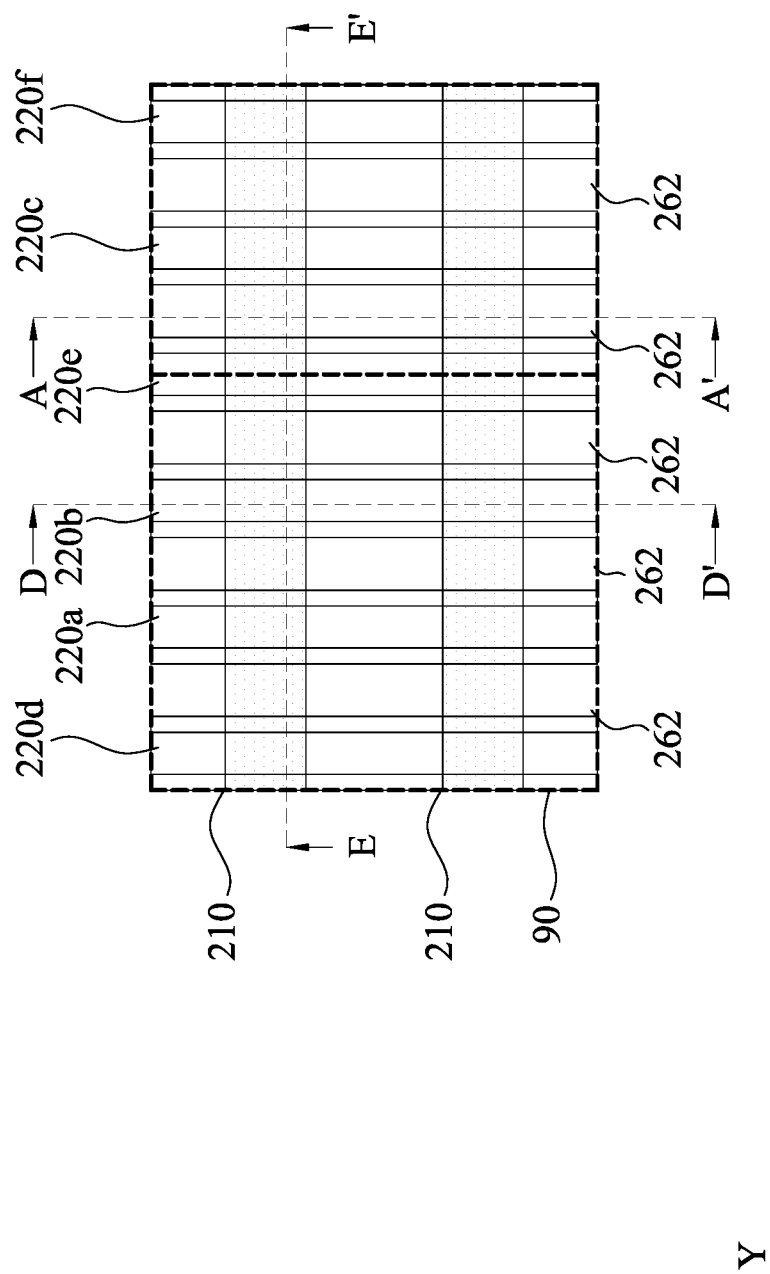
Figure 13B:
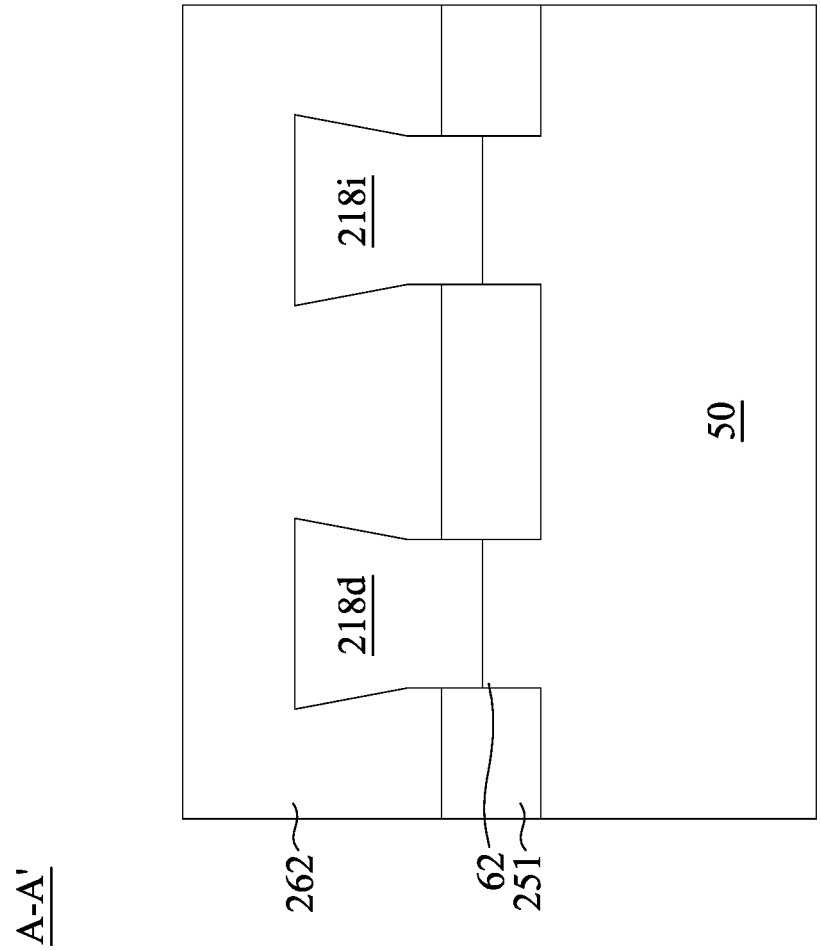
Figure 13D:
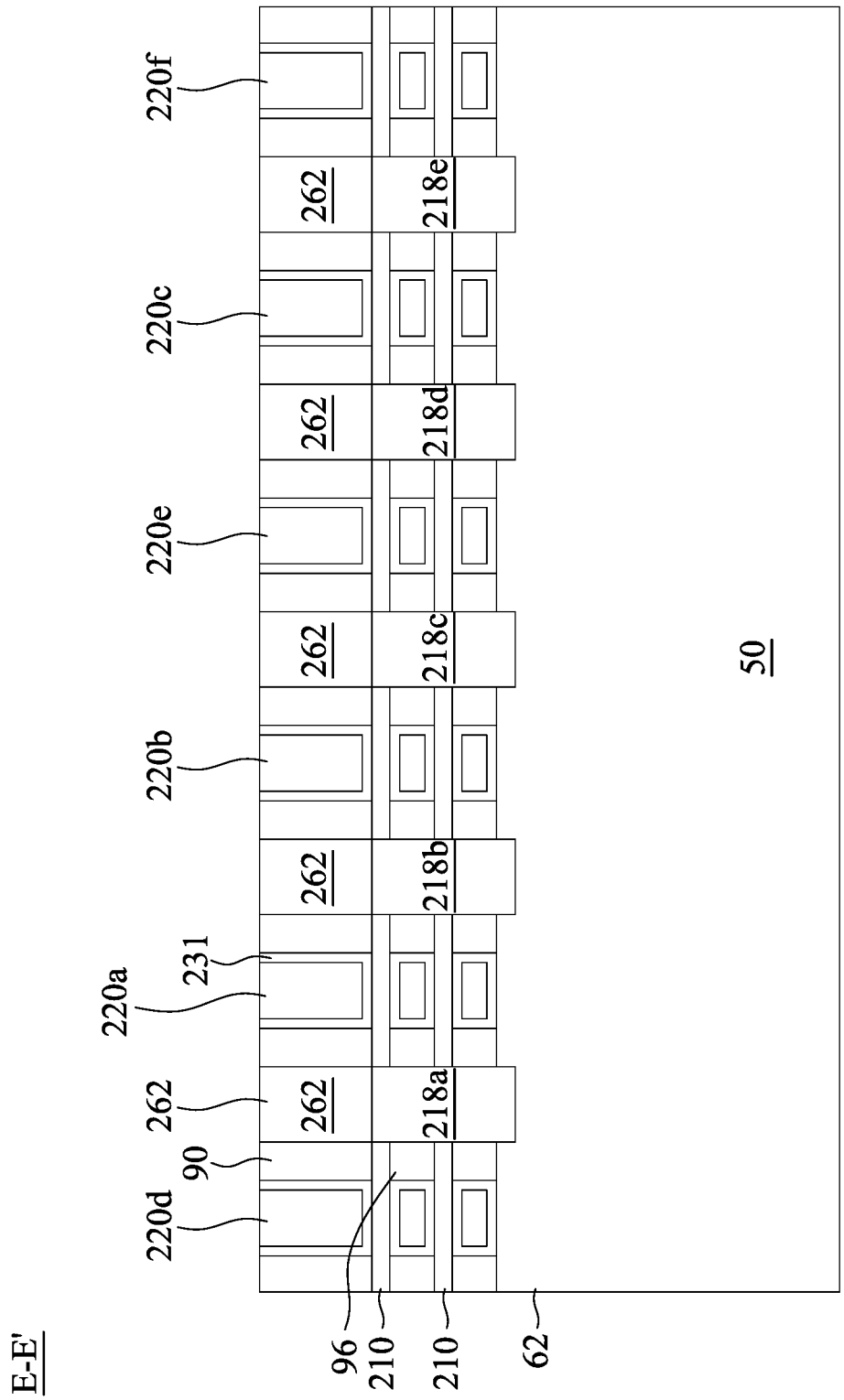

The gate dielectric layer 231 is disposed on the sidewalls and/or the top surfaces of the fins 62; on the top surfaces, the sidewalls, and the bottom surfaces of the second semiconductor sheets 210; and on the sidewalls of the gate spacers 90. The gate dielectric layer 231 may include an oxide such as silicon oxide or a metal oxide, a silicate such as a metal silicate, combinations thereof, multi-layers thereof, or the like. The gate dielectric layer 231 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 231 is illustrated in FIGS. 13C and 13D, as will be subsequently described in greater detail, the gate dielectric layer 231 may include any number of interfacial layers and any number of main layers.

The gate electrode layers 220a through 220f may include a metal-containing material such as titanium nitride, titanium oxide, tungsten, cobalt, ruthenium, aluminum, combinations thereof, multi layers thereof, or the like. Although a single-layered gate electrode layers 220a through 220f is illustrated in FIGS. 13C and 13D, as will be subsequently described in greater detail, the gate electrode layer 114 may include any number of work function tuning layers, any number of barrier layers, any number of glue layers, and a fill material. In some embodiments, the gate electrode layers 220a through 220f may be made of a material selected from a group including TiN, TaN, TiAl, TiAlN, TaAl, TaAlN, TaAlC, TaCN, WNC, Co, Ni, Pt, W, or combinations thereof.

The formation of the gate dielectric layers 231 in the first conductivity type device region 10C and the second conductivity type device region 10D may occur simultaneously such that the gate dielectric layers 112 in each region are formed of the same materials, and the formation of the gate electrode layers 220a through 220f may occur simultaneously such that the gate electrode layers 220a through 220f in each region are formed of the same materials. In some embodiments, the gate dielectric layers 231 in each region may be formed by distinct processes, such that the gate dielectric layers 231 may be different materials and/or have a different number of layers, and/or the gate electrode layers 220a through 220f in each region may be formed by distinct processes, such that the gate electrode layers 220a through 220f may be different materials and/or have a different number of layers. Various masking steps may be used to mask and expose appropriate regions when using distinct processes. In the following description at least portions of the gate electrode layers 220a through 220f in the first conductivity type device region 10C and the gate electrode layers 220a through 220f in the second conductivity type device region 10D are formed separately.

Subsequently, a removal process is performed to remove the excess portions of the materials of the gate dielectric layer 231 and the gate electrode layers 220a through 220f, which excess portions are over the top surfaces of the ILD layer 262 and the gate spacers 90, thereby forming gate dielectric layer 231 and gate electrode layers 220a through 220f. In some embodiments, a planarization process such as a chemical mechanical polish (CMP), an etch-back process, combinations thereof, or the like may be utilized. The gate dielectric layer 231, when planarized, has portions left in the recesses 106 (thus forming the gate dielectric layer 231). The gate electrode layers 220a through 220f, when planarized, has portions left in the recesses 106 (thus forming the gate electrode layers 220a through 220c). The top surfaces of the gate spacers 90; the CESL (not shown); the ILD layer 262; the gate dielectric layer 231, and the gate electrodes are coplanar (within process variations). The gate dielectric layer 231 and the gate electrode layers 220a through 220f form replacement gates of the resulting nano-FETs. Each respective pair of a gate dielectric layer 231 and a gate electrode layers 220a, 220b, 220c, 220d, 220e, or 220f may be collectively referred to as a "gate structure." The gate structures each extend along top surfaces, sidewalls, and bottom surfaces of a channel region of the second semiconductor sheet 210. In some embodiments, the gate electrode layers 220a through 220f each have a gate length in a range from about 6 nm to about 20 nm.

Reference is made to FIGS. 14A, 14B, 14C, and 14D. The gate electrode layers 220d through 220f and the gate dielectric layer 231 warping the gate electrode layers 220d through 220f are removed to form an isolation region separating the source/drain regions of neighboring semiconductor devices from each other and separate different semiconductor devices. The isolation region may be formed by using an etching process. In the etching process, the gate electrode layers 220d through 220f and the gate dielectric layer 231 warping the gate electrode layers 220d through 220f are etched anisotropically, until the underlying fins 62 are exposed. The etching may be stopped on the STI structures 251. In some embodiments, the fins 62 are then etched, and the etching continues down into the underlying substrate 50.

Figure 14A:
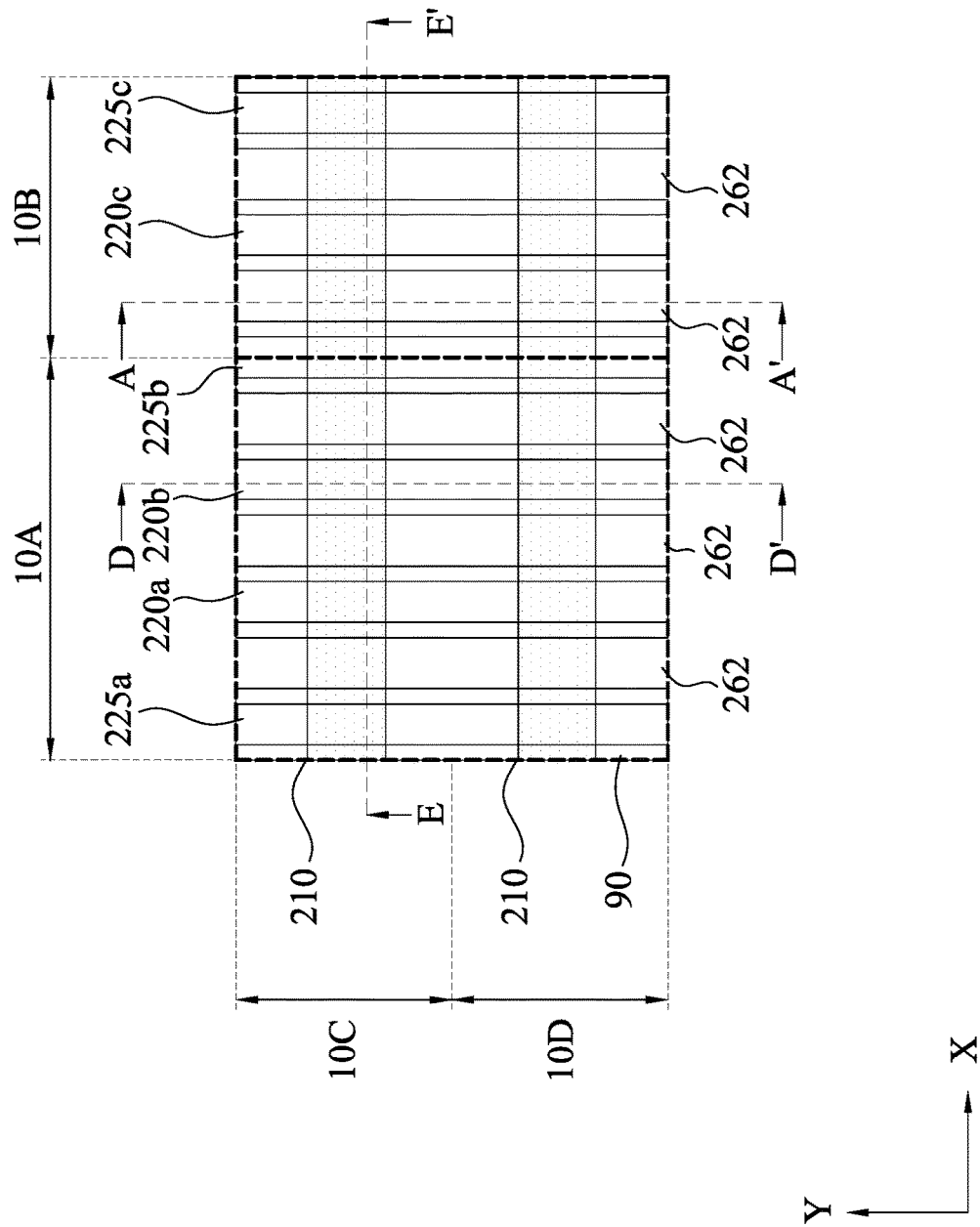
Figure 14B:
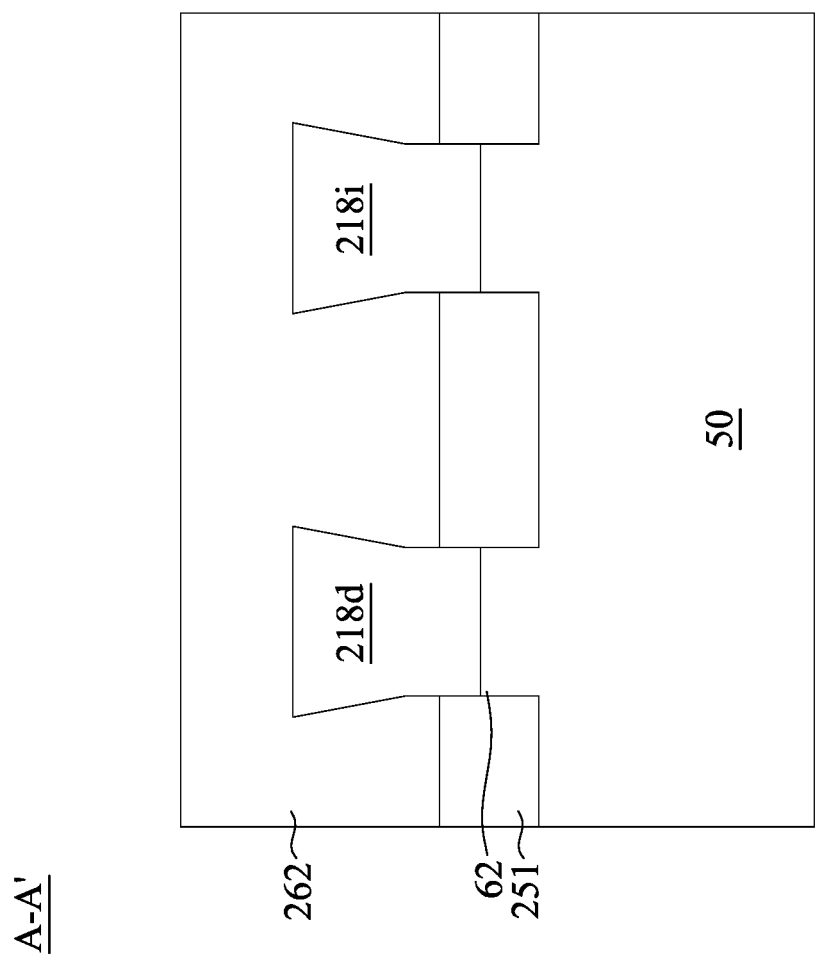
Figure 14C:
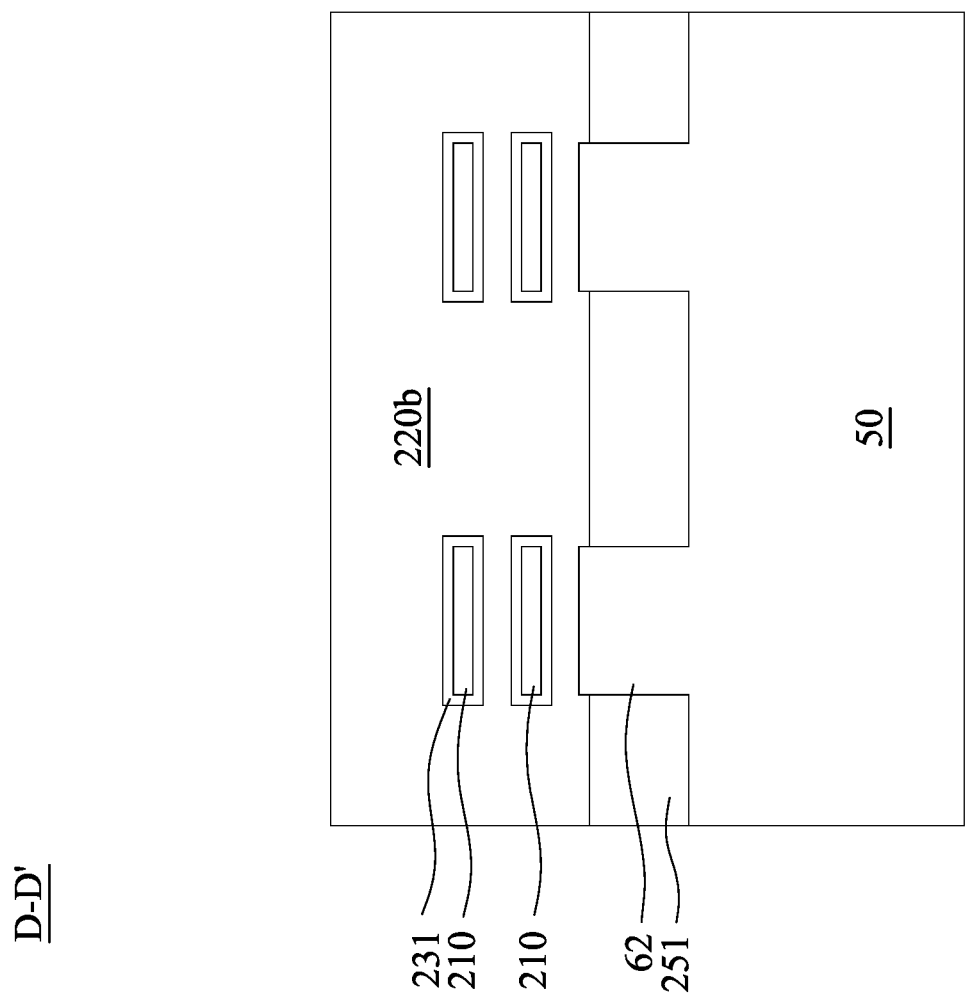
Figure 14D:
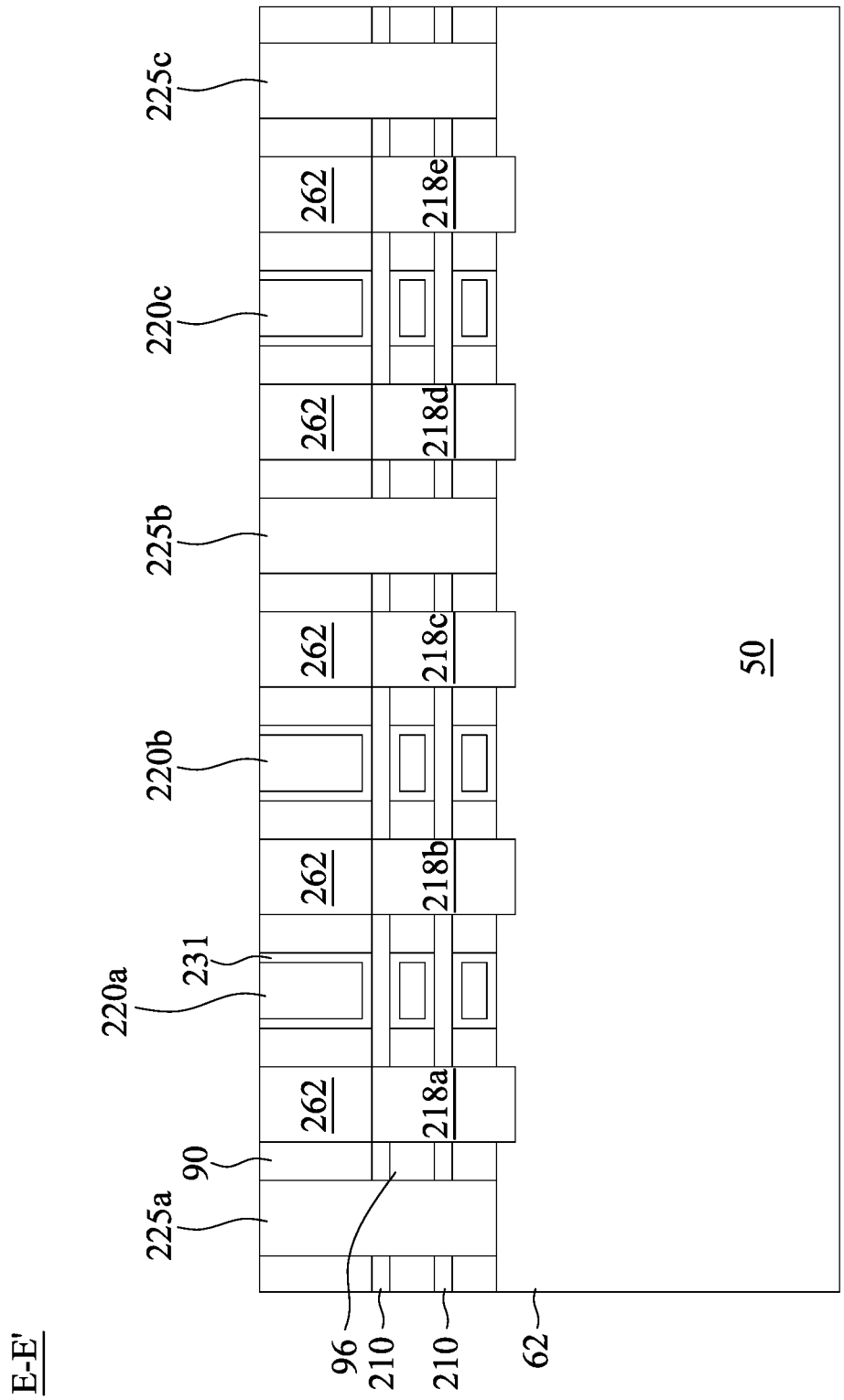
Figure 15A:
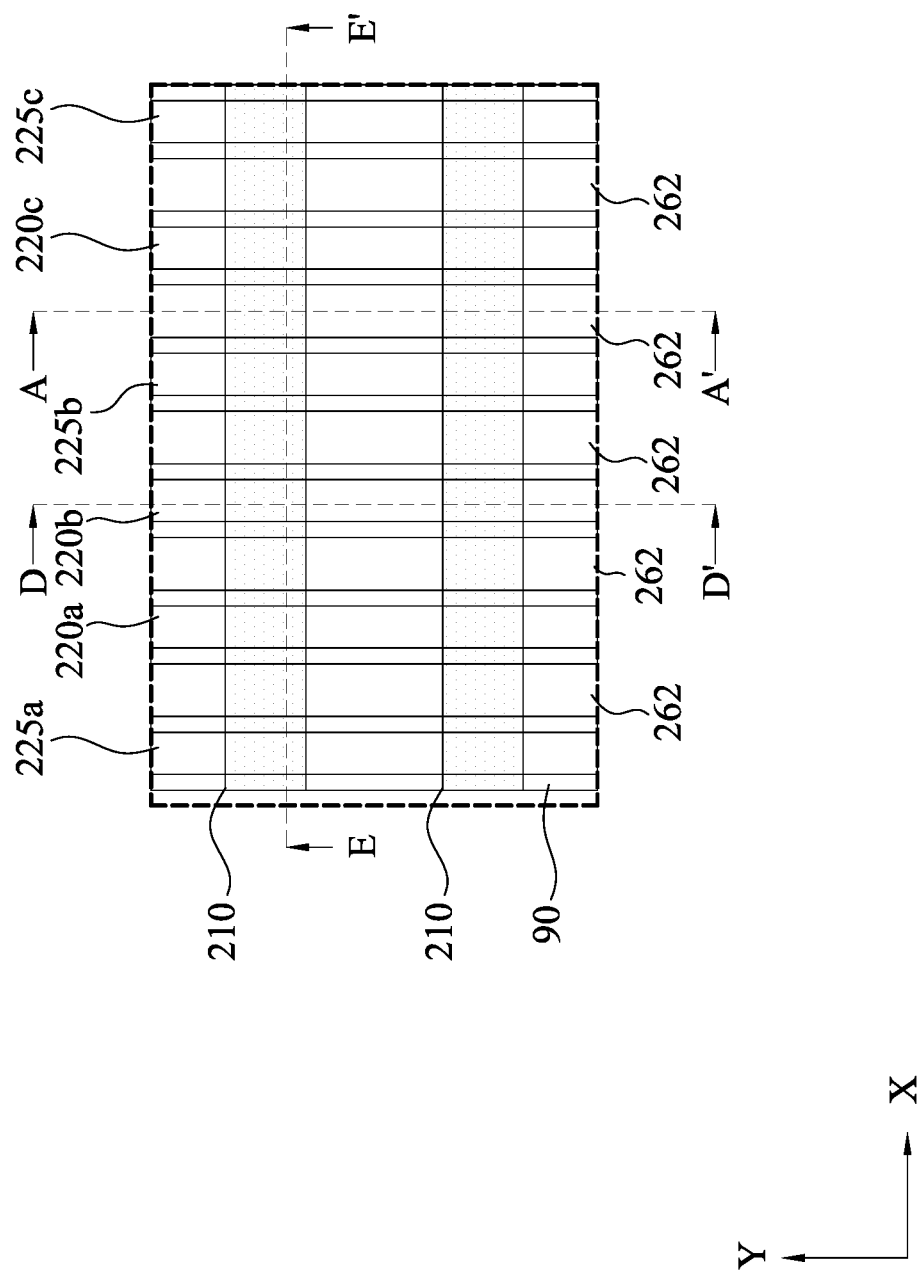
Figure 15B:
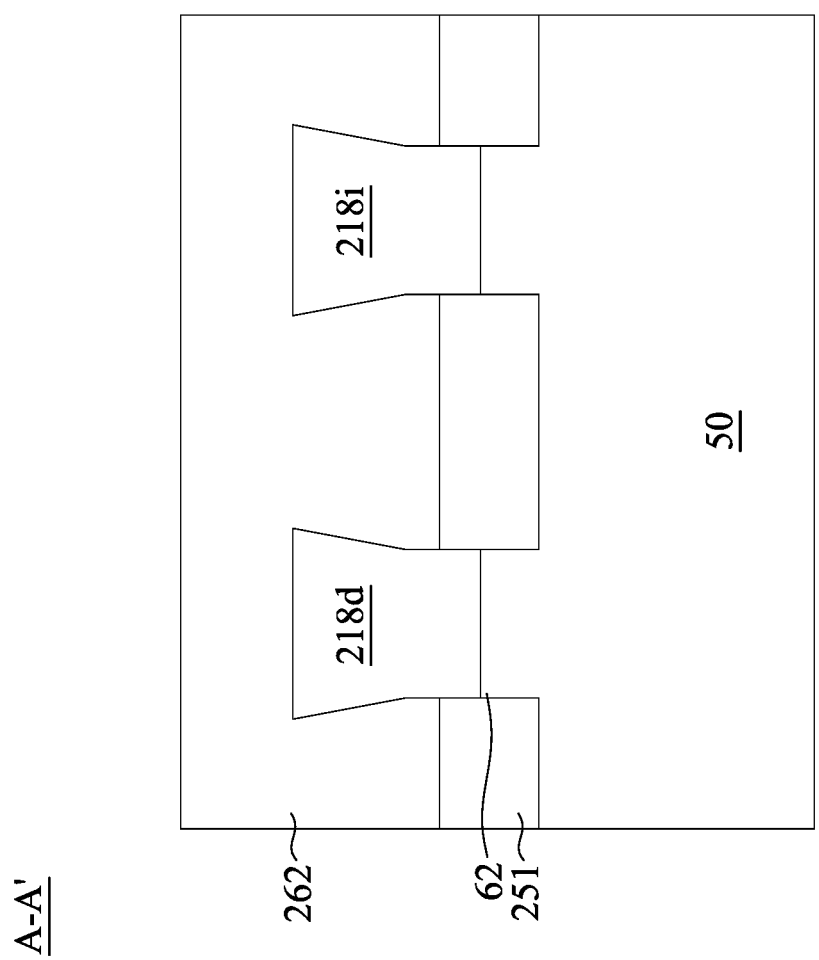
Figure 15D:
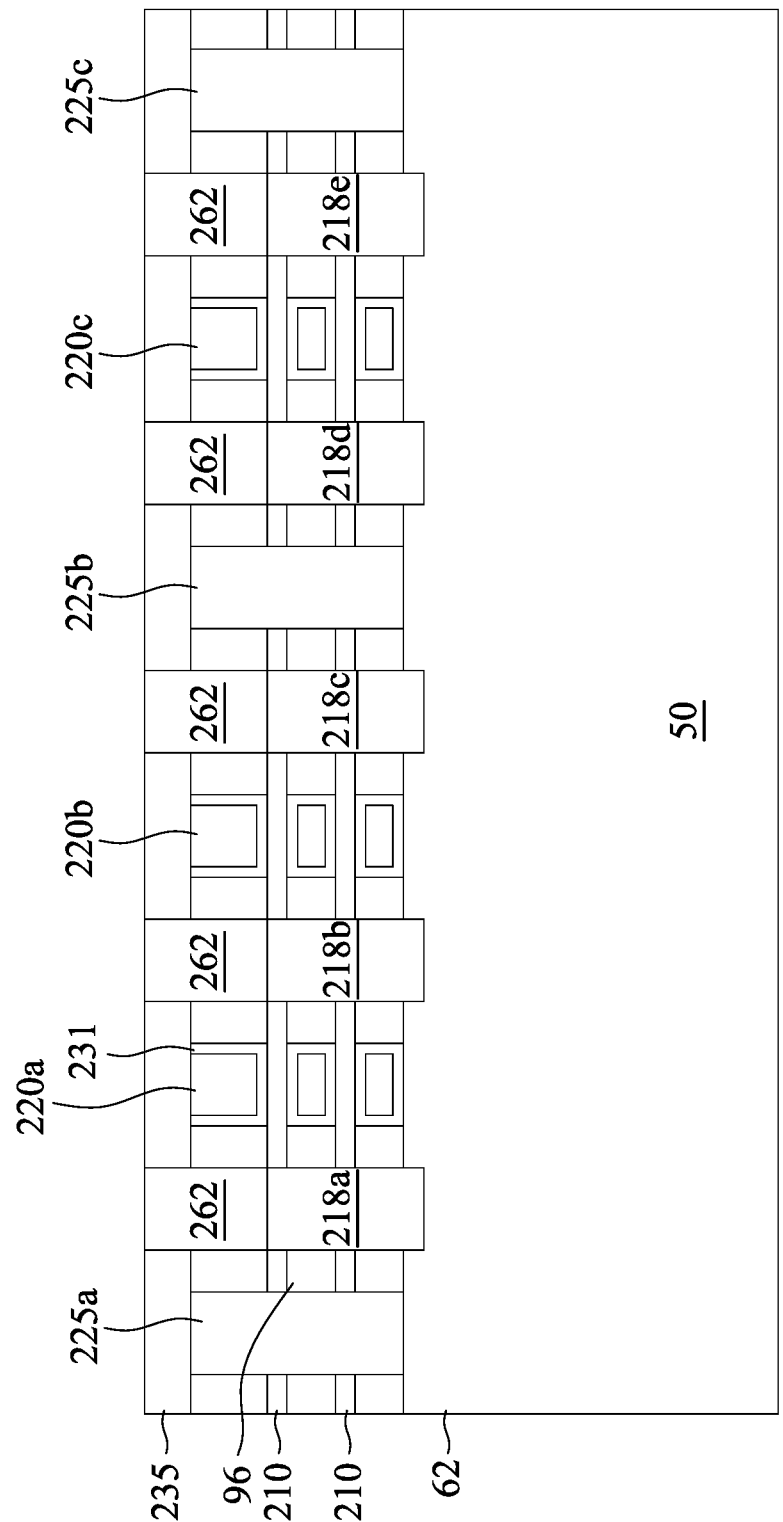
Figure 16A:
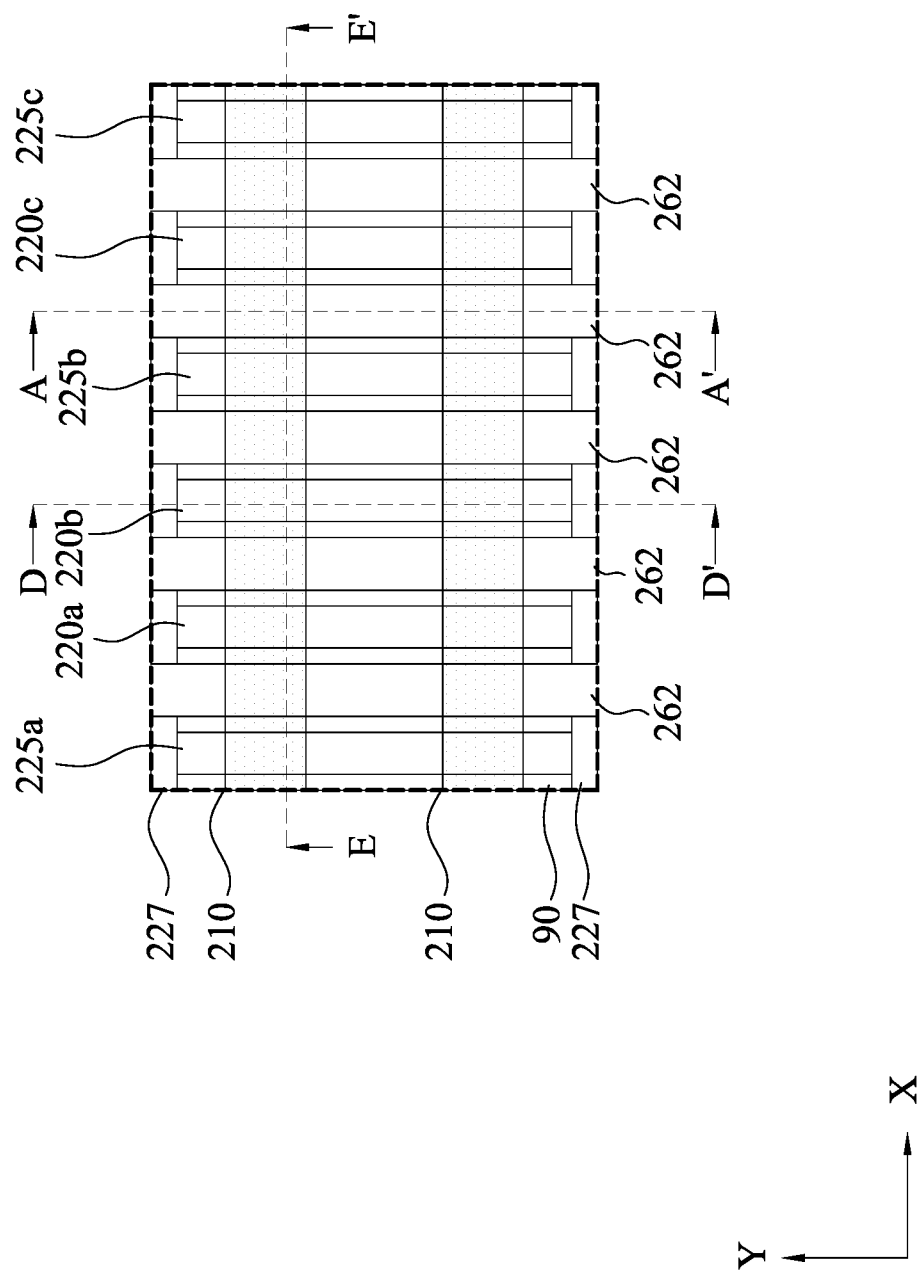
Figure 16B:
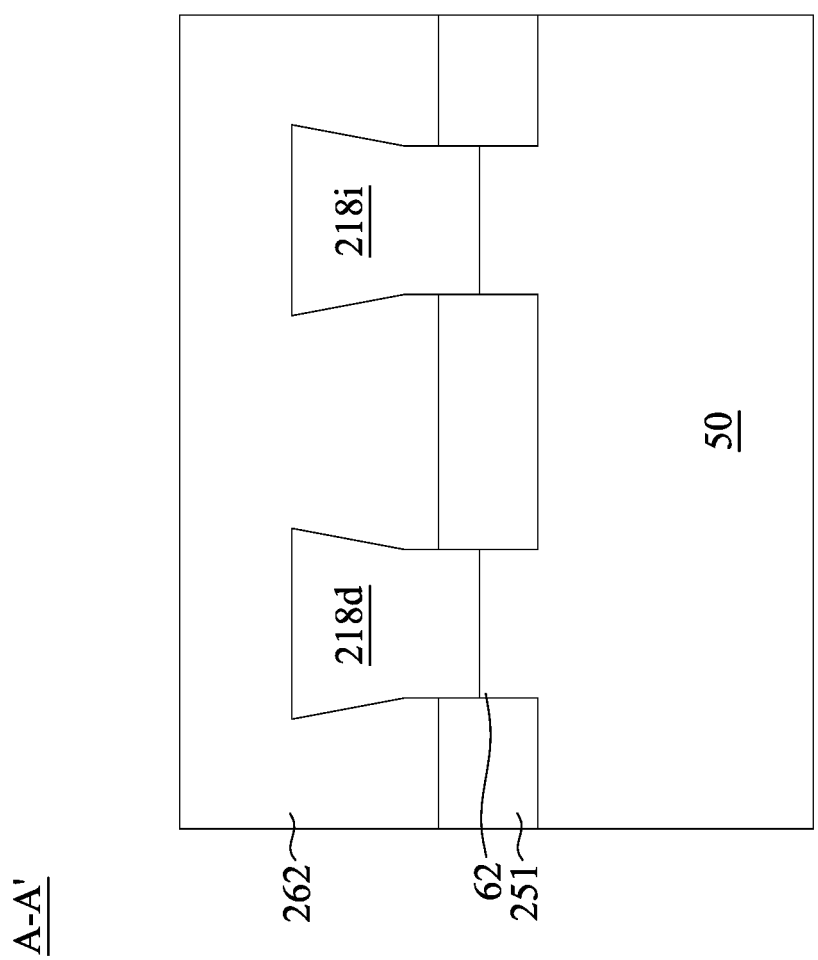
Figure 16C:
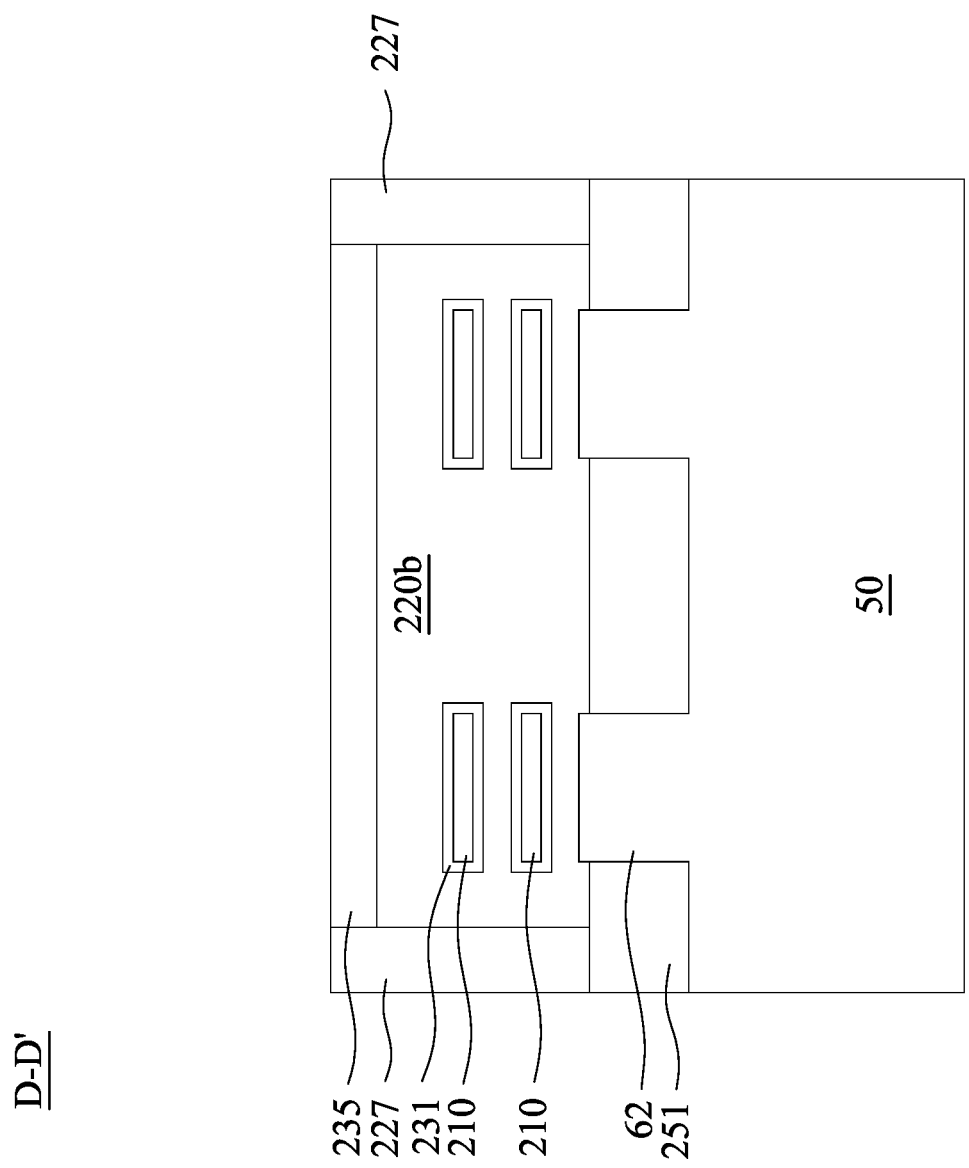
Figure 16D:
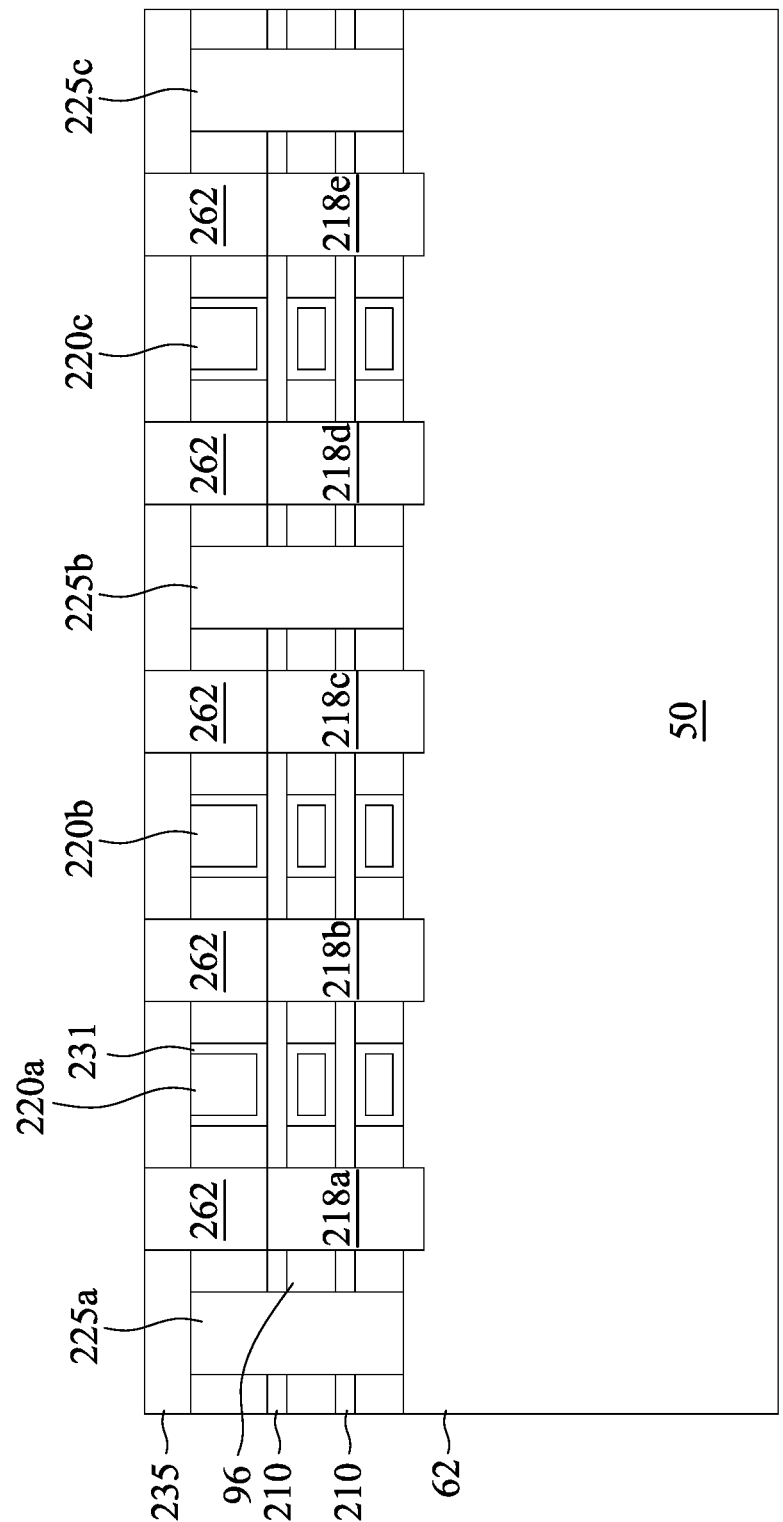

Subsequently, a dielectric material is filled in the isolation region (i.e., spaces originally occupied by the gate electrode layers 220d through 220f and the gate dielectric layer 231 warping the gate electrode layers 220d through 220f) to form dielectric-base gates 225a, 225b, and 225c. As shown in FIG. 14A, the dielectric-base gates 225a, 225b, and 225c extend in the Y-direction and being dummy gates. The gate electrodes 220a and 220b are arranged between the dielectric-base dummy gates 225a and 225b. The gate electrode 220c is arranged between the dielectric-base dummy gates 225b and 225c. In other words, the dielectric base dummy gates 225a and 225b are formed in the boundary of the first logic cell 10A. In other words, the dielectric-base dummy gates 225b and 225c are arranged in the boundary of the second logic cell 10B. The dielectric-base dummy gate 225b is shared by the first logic cell 10A and the second logic cell 10B, i.e., the first logic cell 10A and the second logic cell 10B in the same row are isolated (or separated) from each other by the dielectric-base dummy gate 225b. The material of the dielectric-base dummy gates 225a, 225b, and 225c are different from that of the gate electrodes 220a, 220b, and 220c. In some embodiments, the dielectric-base gates 225a, 225b, and 225c are made of silicon oxide ($SiO_x$), silicon nitride ($Si_xN_y$), silicon oxynitride (SiON), dielectric material (s), other suitable material, or a combination thereof. In some embodiments, the dielectric-base gates 225a, 225b, and 225c are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Reference is made to FIGS. 15A, 15B, 15C, and 15D. An etch back process is performed on the gate electrodes 220a through 220c and the dielectric-base gates 225a through 225c to scale down the gate electrodes 220a through 220c and the dielectric-base gates 225a through 225c. The etch back process may include a bias plasma etching step. The bias plasma etching step may be performed to remove portions of the gate electrodes 220a through 220c and the dielectric-base gates 225a through 225c. Portions of the gate trenches may reappear with shallower depth. Top surfaces of the gate electrodes 220a through 220c and the dielectric-base gates 225a through 225c may be no longer level with the ILD layer 262. Sidewalls of the gate spacers 90 are then exposed from the gate electrodes 220a through 220c and the dielectric-base gates 225a through 225c. In some embodiments, the bias plasma etching step may use a gas mixture of $Cl_2$, $O_2$, $BCl_3$, and Ar with a bias in a range from about 25V to about 1200V.

Subsequently, a hard mask layer 235 is formed over the gate electrodes 220a through 220c and the dielectric-base gates 225a through 225c using, for example, a deposition process to deposit a dielectric material over the substrate 50, followed by a CMP process to remove excess dielectric material above the spacers 90 and the ILD layer 262. In some embodiments, source drain contacts 240a through 240j formed subsequently are formed by a self-aligned contact process using the hard mask layer 235 as a contact etch protection layer. In some embodiments, the hard mask layer 235 may have a thickness in a range from about 2 nm to about 60 nm.

In some embodiments, the hard mask layer 235 may be made of a nitride-based material, such as $Si_3N_4$, SiON, or a carbon-based material, such as SiC, SiOC, SiOCN, or combinations thereof. In some embodiments, the hard mask layer 235 may include $SiO_x$, SiBN, SiCBN, other suitable dielectric materials, or combinations thereof. In some embodiments, the hard mask layer 235 may include a metal oxide, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The hard mask layer 235 has different etch selectivity than the spacers 90 and/or the ILD layer 262, so as to selective etch back the hard mask layer 235. By way of example, if the hard mask layer 235 is made of silicon nitride, the spacers 90 and/or the MD layer 262 may be made of a dielectric material different from silicon nitride. If the hard mask layer 235 is made of silicon carbide (SiC), the spacers 90 and/or the ILD layer 262 may be made of a dielectric material different from silicon carbide. Therefore, the hard mask layer 235 can be used to define self-aligned gate contact region and thus referred to as a self-aligned contact (SAC) structure or a SAC layer.

Reference is made to FIGS. 16A, 16B, 16C, and 16D. The dielectric regions 227 are formed on opposite ends of the gate electrodes 220a through 220c and the dielectric-base gates 225a through 225c. In some embodiments, each dielectric region 227 is a gate-cut structure for the gate structure corresponding to the dielectric-base gates 225a through 225c, and the gate-cut structure is formed by a cut metal gate (CMG) process. In some embodiments, the dielectric region 227 can be interchangeably referred to a gate end dielectric. Specifically, the opposite ends the gate electrodes 220a through 220c and the dielectric-base gates 225a through 225c are removed to form gate trenches with the gate spacers 90 as their sidewalls. The ends of the gate electrodes 220a through 220c and the dielectric-base gates 225a through 225c may be removed by dry etching, wet etching, or a combination of dry and wet etching. For example, a wet etching process may include exposure to a hydroxide containing solution (e.g., ammonium hydroxide), deionized water, and/or other suitable etchant solutions. Subsequently, a dielectric material is deposited into the gate trenches, followed by a planarization process to remove excess portions of the dielectric material. The remaining dielectric material forms the dielectric regions 227.

In some embodiments, the deposition of the dielectric material of the dielectric regions 227 is performed using a conformal deposition process such as ALD, which may be PEALD, thermal ALD, or the like. The dielectric material may be formed of or comprise $SiO_2$, SiOC, SiOCN, or the like, or combinations thereof. In some embodiments, the dielectric region 227 may be made of a nitride-based material, such as $Si_3N_4$, or a carbon-based material, such as SiOCN, or combinations thereof. In some embodiments, the dielectric region 227 may be made of a material having a dielectric constant greater than about 9 (e.g., high dielectric constant (high-k) material). For example, the dielectric region 227 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The dielectric regions 227 may be formed of a homogenous material, or may have a composite structure including more than one layer. The dielectric regions 227 may include dielectric liners, which may be formed of, for example, silicon oxide. In some embodiments, the dielectric material of the dielectric regions 227 comprises SiN, and the deposition is performed using process gases including dichlorosilane and ammonia. Hydrogen ($H_2$) may or may not be added.

Reference is made to FIGS. 17A, 17B, 17C, and 17D. Source/drain contacts 240b, 240c, 240g, and 240i are formed in the ILD layer 262 and on the source/drain regions 218b, 218c, 218g, and 218i, respectively. In some embodiments, the source/drain silicide regions 270b, 270c, and 270i are formed between the source/drain contacts 240b, 240c, and 240i and the source/drain regions 218b, 218c, and 218i, respectively. In some embodiments, the source/drain via 245a and 245h are formed in an ILD layer 260 to land on the source/drain contacts 240i and 240c, respectively. Subsequently, gate vias 250a through 250c formed to pass through the ILD layer 260 and the hard mask layer 235 and land on the gate electrodes 220a through 220c. The source/drain contacts 240b, 240c, 240g, and 240i, the source/drain via 245b, 245f, and 245h, and the gate via 250a through 250c may include a metal-containing material such as titanium nitride, titanium oxide, tungsten, cobalt, ruthenium, aluminum, copper, combinations thereof, multi-layers thereof, or the like. The ILD layer 260 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Subsequently, a front-side interconnect structure is formed over the front-side gate via and the front-side source/drain via. The interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure may include conductive lines 201 through 208 in a first metallization layer that is in the IMD layer 264. The conductive lines 202, 206, and 207 overlap and are electrically connected to the source/drain contacts 240c, 240g, and 240i through the source/drain vias 245b, 245f, and 245h, respectively. The conductive lines 204, 205, and 208 are electrically connected to the gate electrodes 220b, 220c, and 220a through the gate vias 250b, 250c, and 250a, respectively. The front-side interconnect structure further includes conductive vias 211 through 216. In some embodiments, the conductive vias 211 through 216 are connected between the first metallization layer and a second metallization layer over the first metallization layer. The front-side interconnect structure may further include conductive lines 221 through 225 in a second metallization that is in the IMD layer 264. The conductive lines 221, 223, 224, and 225 overlap and are electrically connected to the underlying conductive lines 204, 208, 207, and 205 through the conductive vias 212, 216, 215, and 213, respectively. The conductive line 222 overlaps and is electrically connected to the underlying conductive Lines 202 and 206 through the conductive vias 211 and 214. In some embodiments, materials of the conductive lines 201 through 208 and 221 through 225 and conductive vias 211 through 216 may include Cu, Co, Ru, Pt, Al, W, Ti, TaN, TiN, or any combinations thereof.

Figure 18A:
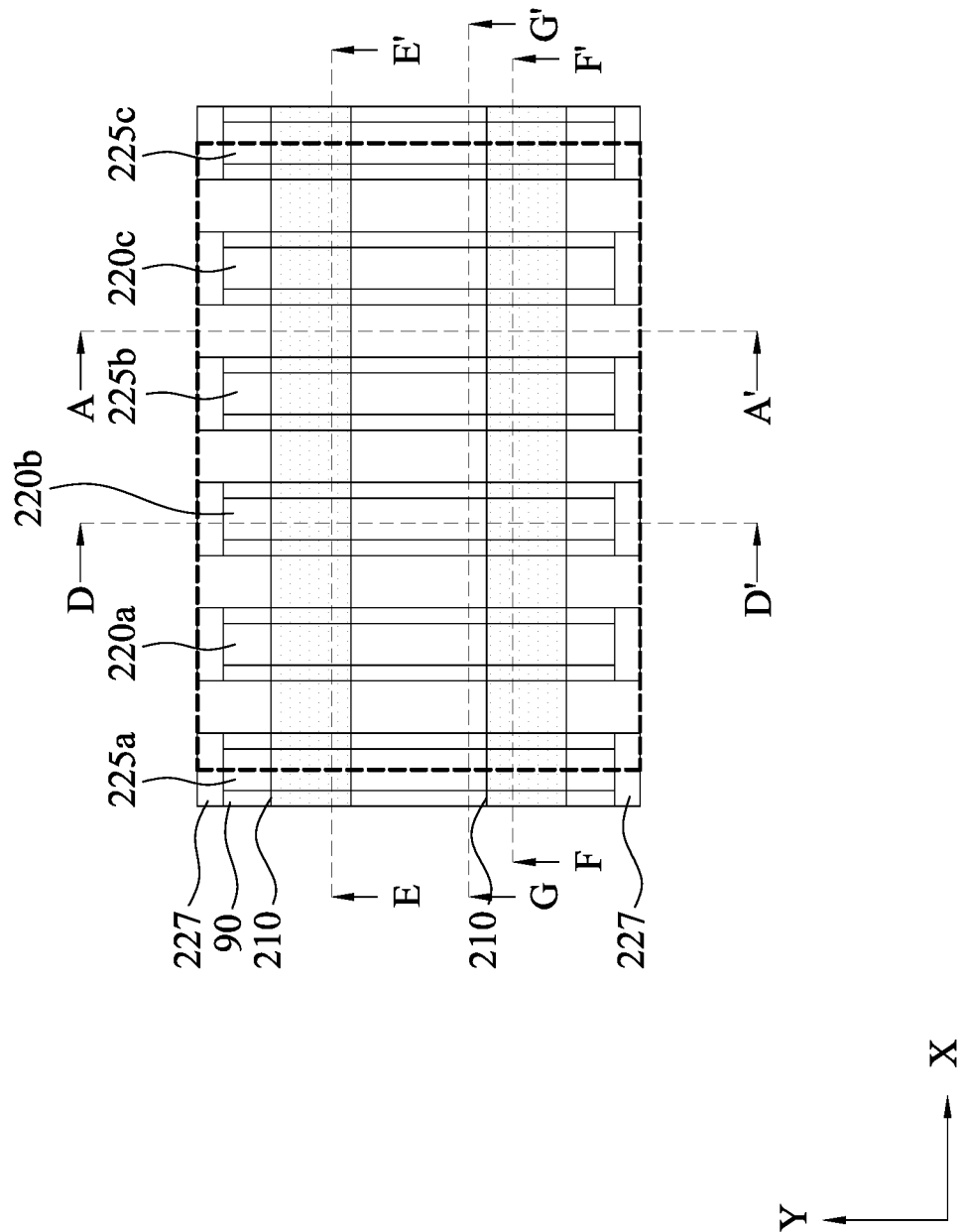
Figure 18B:
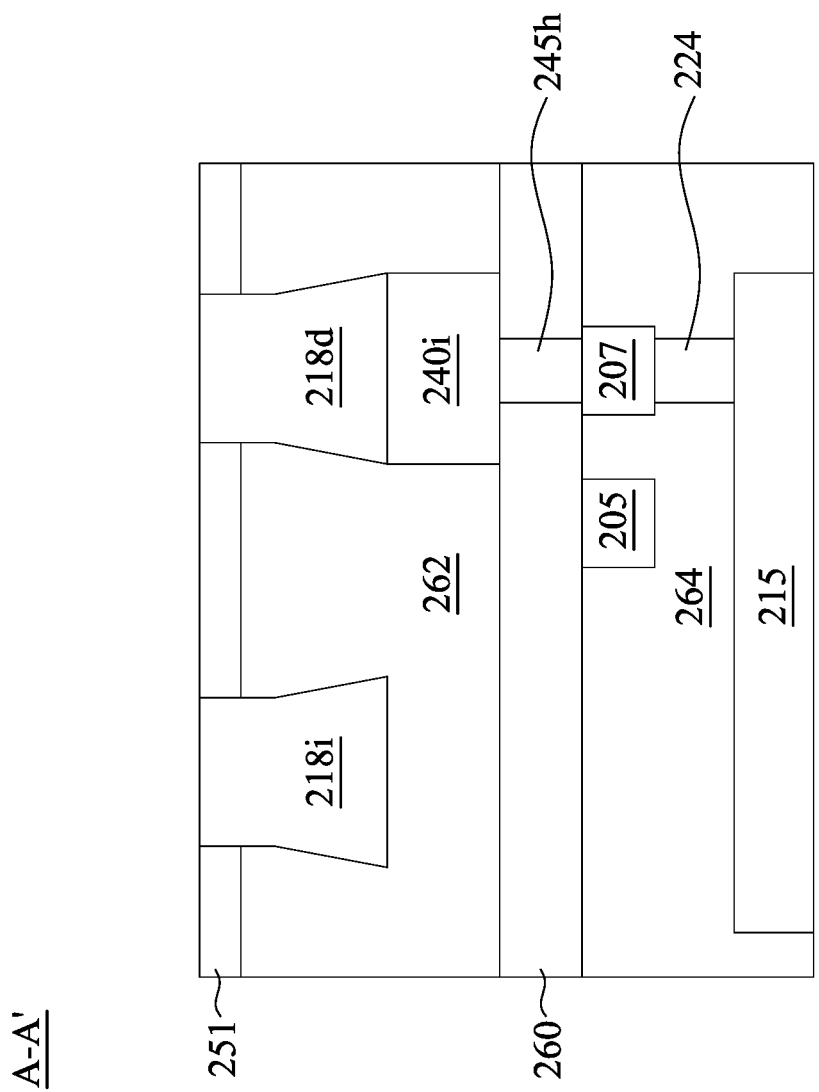
Figure 18C:
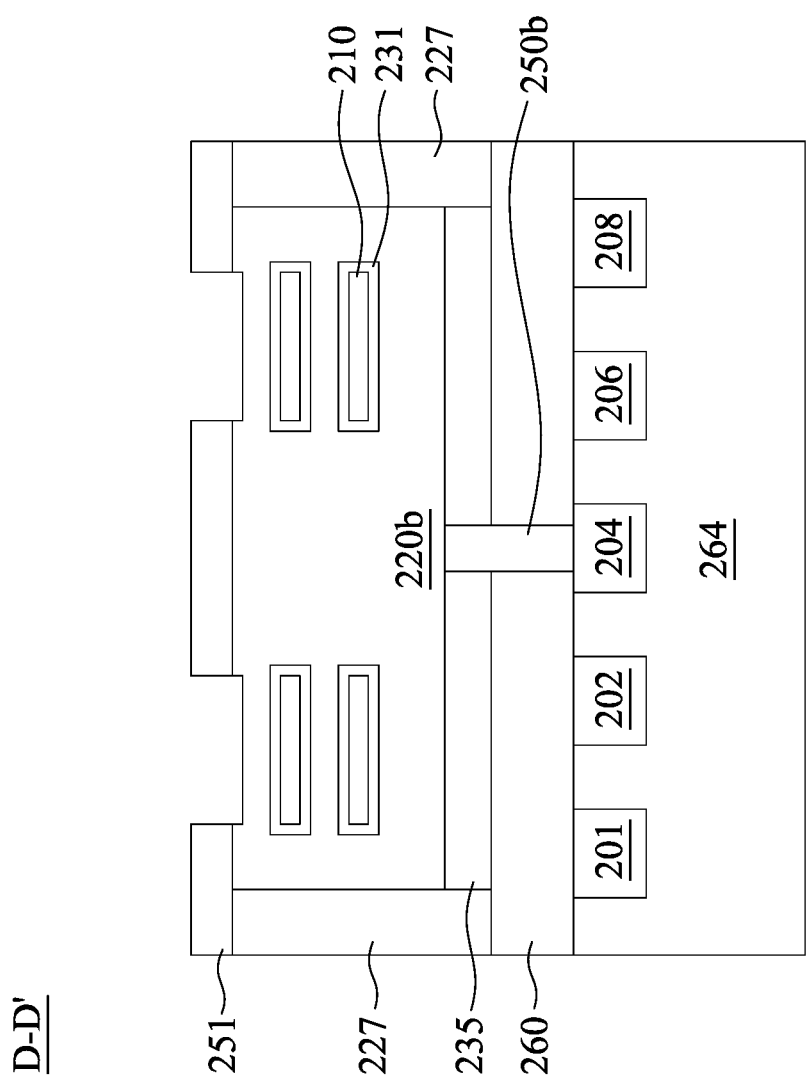
Figure 18D:
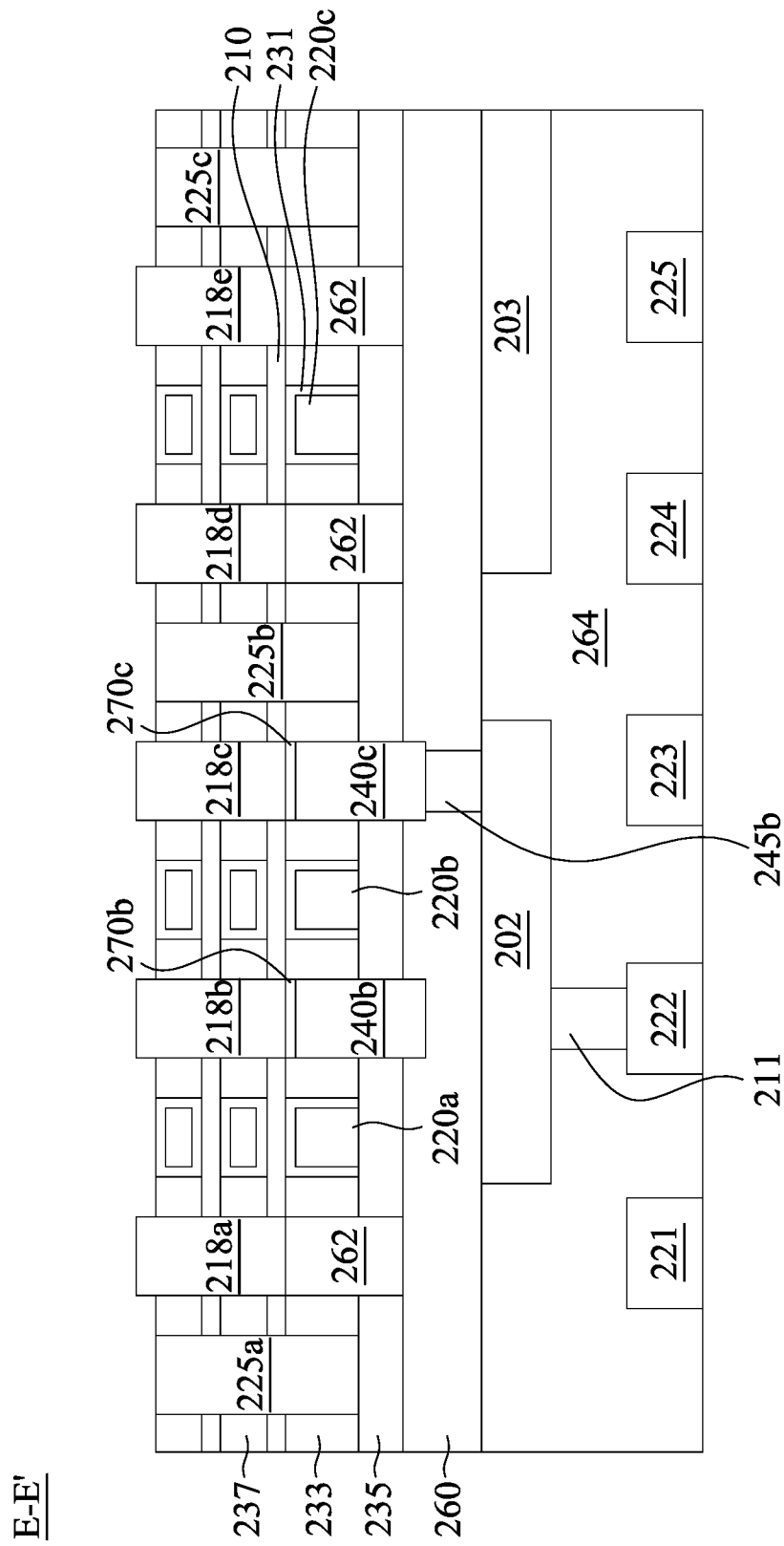
Figure 18E:
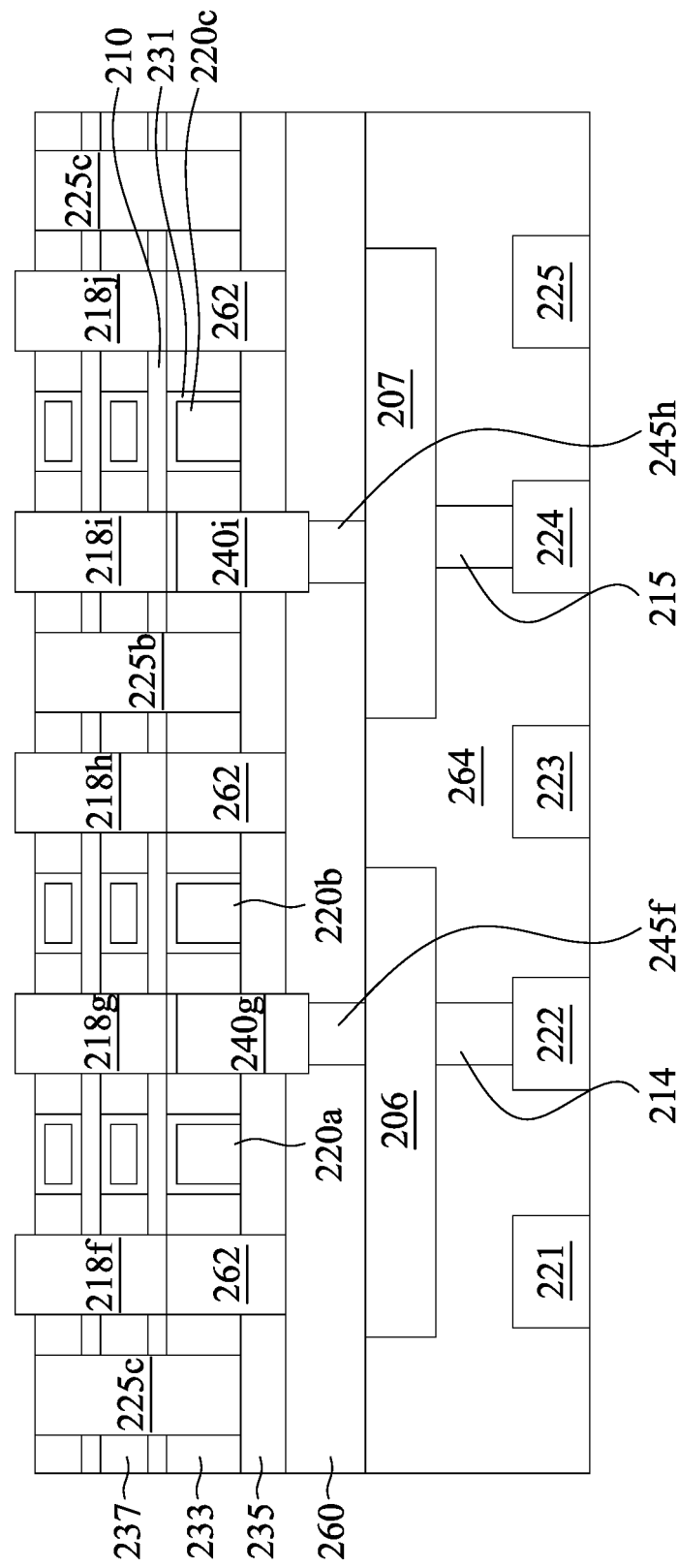
FIGS. 18E, 19E, and 20E illustrate cross-sectional views obtained from reference cross-section F-F' in FIGS. 18A, 19A, and 20A, respectively.
Figure 18F:
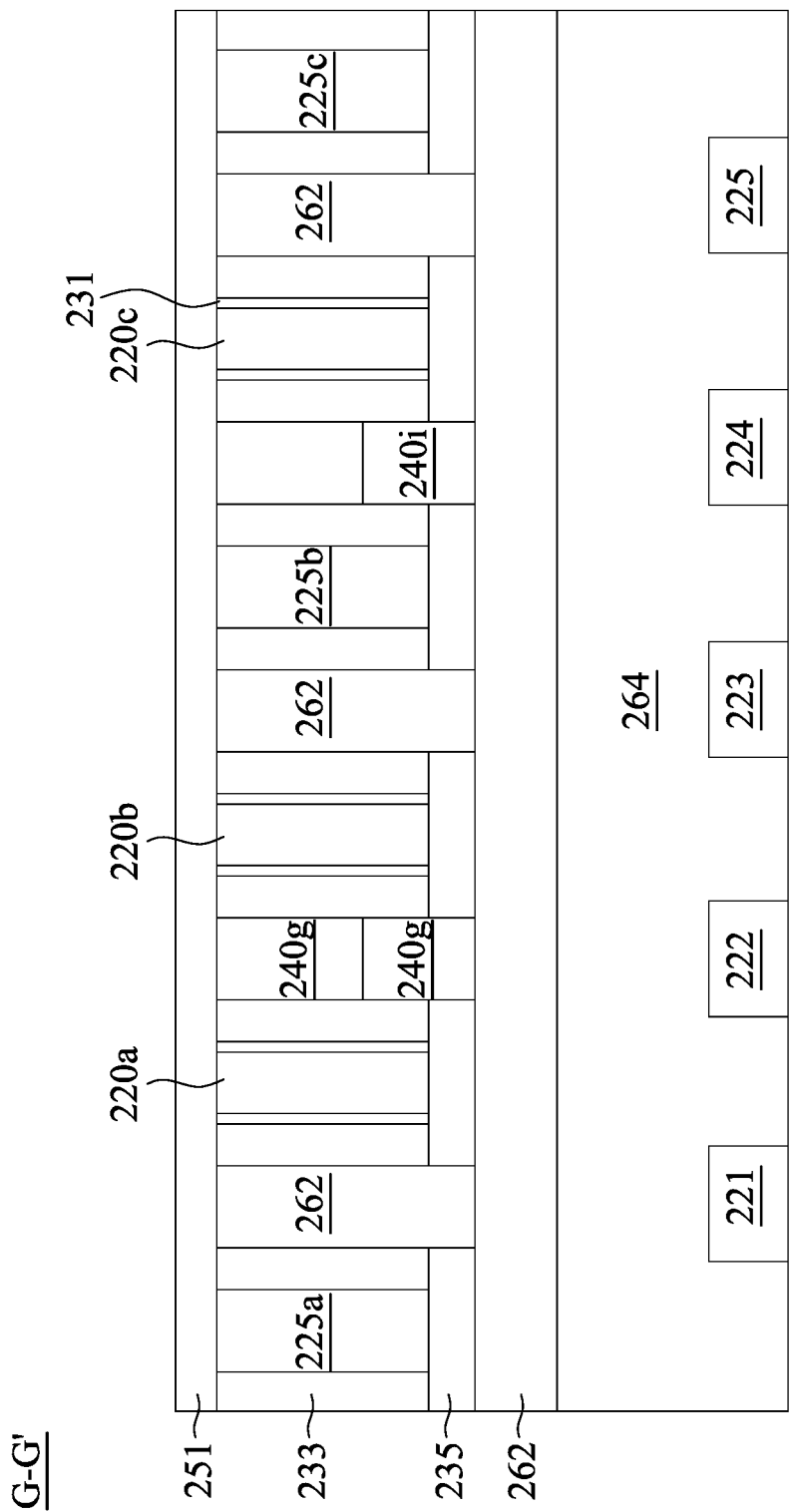
FIGS. 18F, 19F, and 20F illustrate cross-sectional views obtained from reference cross-section G-G' in FIGS. 18A, 19A, and 20A, respectively.

Reference is made to FIGS. 18A, 18B, 18C, 18D, 18E, and 18F. The structures of FIGS. 17B-17D are "flipped" upside down, and the substrate 50 and a portion of the STI structure 251 are removed. The substrate 50 and the portion of the STI structure 251 may be removed in a plurality of process operations, for example, CMP, HNA, and/or TMAH etching, which stops at the source/drain regions 218a through 218j. Subsequently, remainders of the fins 62 are removed. The remaining portions of the fins 62 can be removed by any acceptable etching process that selectively etches the material of the fins 62 at a faster rate than the material of the STI structures 251, the source/drain regions 218a through 218j, the inner spacers 96, the gate electrode layers 220a through 220c, and/or the dielectric-base gates 225a through 225c. The etching may be isotropic, such as a wet etch. After the removal process, the STI structures 251, the source/drain regions 218a through 218j, the inner spacers 96, the gate electrode layers 220a through 220c, and/or the dielectric-base gates 225a through 225c are exposed as shown in FIGS. 18B, 18C, and 18D.

Reference is made to FIGS. 19A, 19B, 19C, 19D, 19E, and 19F. A back-side dielectric 331 is formed over the STI structures 251, the source/drain regions 218a through 218j, the inner spacers 96, the gate electrode layers 220a through 220c, and/or the dielectric-base gates 225a through 225c. Subsequently, back-side source/drain contacts 240a, 240d, 240e, 240f, 240h, and 240j are formed in the back-side dielectric 331 and on the source/drain regions 218a, 218d, 218e, 2188f, 218h, and 218j. The back-side source/drain contacts 240a, 240d, 240e, 240f, 240h, and 240j may be made of a metal-containing material such as titanium nitride, titanium oxide, tungsten, cobalt, ruthenium, aluminum, copper, combinations thereof, multi-layers thereof, or the like. The back-side dielectric 331 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Reference is made to FIGS. 20A, 20B, 20C, 20D, 20E, and 20F. A back-side interconnect structure is formed over the back-side source/drain contact. The back-side interconnect structure includes a plurality of metallization Layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure may include conductive lines 301 and 302 in a first metallization layer that is in the IMD layer 332. The conductive line 301 overlaps and is electrically connected to the source/drain contacts 240a and 240e respectively through the source/drain vias 245a and 245d. The conductive line 302 overlaps and is electrically connected to the source/drain contacts 240f, 240h, and 240j respectively through the source drain vias 245f, 245g, and 245i. The back-side interconnect structure may further include conductive vias 311 and 312. In some embodiments, the conductive vias 311 and 312 are connected between the first metallization layer and a second metallization layer over the first metallization layer. The back-side interconnect structure may further include conductive lines 321 and 322 in a second metallization layer that is in the IMD layer 332. The conductive lines 321 and 322 overlap and are electrically connected to the conductive lines 301 and 302 through the conductive vias 311 and 312, respectively. In some embodiments, materials of the conductive lines 301, 302, 321, and 322 and conductive vias 311 and 312 on the back side of the semiconductor structure may include Cu, Co, Ru, Pt, Al, W, Ti, TiN, or any combinations thereof.

Figure 21:
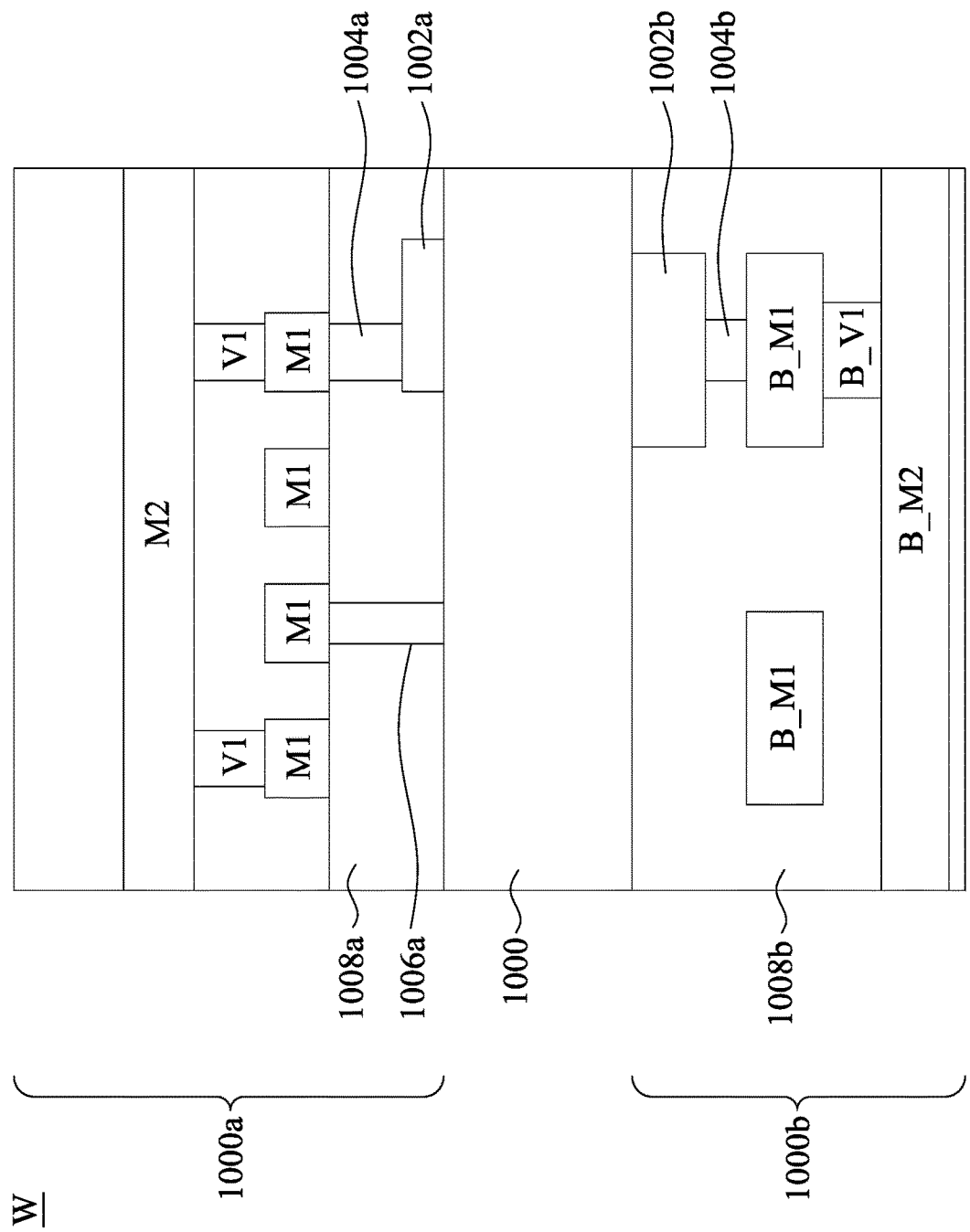
FIG. 21 is a schematic view of a wafer having a front-side interconnect structure, and a back-side interconnect structure on a device region thereof in accordance with some embodiments of the present disclosure.

Reference is made to FIG. 21. FIG. 21 is a schematic view of a wafer having a front-side interconnect structure, and a back-side interconnect structure on a device region thereof in accordance with some embodiments of the present disclosure. As shown in FIG. 21, a device region 1000 is provide in the wafer W and includes, such as gate, channel, and source/drain regions. A front-side interconnect structure 1000a is formed after the device region formation. Specifically, the front-side interconnect structure 1000a is formed over a front-side gate via 1006a, a front-side source/drain via 1004a, and a front-side contact 1002a. The front-side interconnect structure 1000a may include, for example, two metallization layers, labeled as M1 and M2, with one layer of metallization via or interconnect, labeled as V1. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure 1000a includes a full metallization stack, including a portion of each of metallization layers M1 and M2 connected by the interconnect V1, with the front-side gate via 1006a, the front-side source/drain via 1004a, and the front-side contact 1002a connecting the stack to the source/drain region and the gate of the transistor in the device region. Also included in the front-side interconnect structure 1000a is a front-side IMD layer 1008a. The front-side IMD layer 1008a may provide electrical insulation as welt as structural support for the various features of the front-side interconnect structure 1000a.

A back-side interconnect structure 1000b is formed after device region formation. Specifically, a back-side interconnect structure 1000b is formed over a back-side via 1004b and a back-side contact 1002b. The back-side interconnect structure 1000b may include, for example, two metallization layers, labeled as B_M1 and B_M2, with one layer of metallization via or interconnect, labeled as B_V1. Other embodiments may contain more or fewer metallization layers, and corresponding more or fewer number of vias. The metal line illustrated here just for an example, and the metal line may be otherwise oriented (rotated 90 degrees or at other orientations). The back-side interconnect structure includes a full metallization stack, including a portion of each of metallization layers B_M1 and B_M2 connected by interconnect B_V1, with the back-side via 1004b and the back-side contact 1002b connecting the stack to the source/drain region of the transistor in the device region 1000. Also included in the back-side interconnect structure 1000b is a back-side IMD layer 1008b. The back-side IMD layer 1008b may provide electrical insulation as well as structural support for the various features of the back-side interconnect structure 1000b.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a metal line routing method to improve the functional density and operation performance on the IC structure. That is, a part of metal layers is moved to the wafer back-side, so as to reduce the routing loading and improve the circuit density in a same chip area. In addition, the less metal tracks in the same chip area benefits the metal conductor RC performance. For example, the present disclosure provides a metal line routing method to move a common rectangular drain contact between two transistors from the wafer front-side to the wafer back-side and to have a drain contact on a single drain region among the two transistors on the front-side and further electrically connected to the front side metal layers to receive data/signal. Therefore, a lateral overlapping area between the contact on the drain region and the gate structure can be reduced, which in turn improves capacitance between the contact and the gate structure and reduces the circuit density in a same chip area, and thereby achieving both high functional density and high speed applications in the IC structure.

In some embodiments, a method includes forming a first transistor comprising a first channel region, a first gate structure surrounding the first channel region, and first source/drain regions on opposite sides of the first gate structure; forming a second transistor comprising a second channel region, a second gate structure surrounding the second channel region, and second source/drain regions on opposite sides of the second gate structure; forming a front-side contact on a top end of a first one of the first source/drain regions of the first transistor; forming a first back-side contact extending from a bottom end of the first one of the first source/drain regions of the first transistor to a bottom end of a first one of the second source/drain regions of the second transistor.

In some embodiments, the first back-side contact is in a position lower than the first and second gate structures of the first and second transistors. In some embodiments, the first back-side contact has a rectangular profile from a top view and having a longitudinal axis in parallel with a longitudinal axis of the first gate structure. In some embodiments, the method further includes forming a second back-side contact on a bottom end of a second one of the first source/drain regions of the first transistor. In some embodiments, the method further includes forming a first back-side via on a bottom end of the second back-side contact and having an elliptical profile from a top view. In some embodiments, the method further includes forming a first back-side metal line on a bottom end of the first back-side via and laterally extending in a first direction perpendicular to a lengthwise direction of the first gate structure of the first transistor. In some embodiments, the method further includes forming a second back-side via on a bottom surface of the first back-side metal line and a second back-side metal line on a bottom end of the second back-side via and laterally extending in a second direction in parallel with the lengthwise direction of the first gate structure of the first transistor. In some embodiments, the method further includes forming a second back-side contact on a bottom end of a second one of the second source/drain regions of the second transistor. In some embodiments, the first and second transistors have opposite conductivity types. In some embodiments, the first and second transistors form an inverter circuit.

In some embodiments, a method includes forming a plurality of first nanostructures arranged in a vertical direction; forming a gate strip surrounding each of the first nanostructures; growing a plurality of first epitaxial structures on either side of each of the first nanostructures; forming a first contact on a top end of a first one of the first epitaxial structures; forming a second contact on a bottom end of the first one of the first epitaxial structures. In some embodiments, the second contact having a longer length than the first contact in a lengthwise direction of the gate strip from a top view. In some embodiments, the method further includes forming a plurality second nanostructures arranged in the vertical direction and laterally spaced apart from the first nanostructures, wherein the gate strip further surrounds each of the second nanostructures; growing a plurality of second epitaxial structures on either side of each of the second nanostructures, wherein the second contact further laterally extends from the bottom end of the first one of the first epitaxial structures to a bottom end of one of the second epitaxial structures. In some embodiments, the first contact non-overlaps the one of the second epitaxial structures. In some embodiments, the method further includes forming a third contract on a bottom end of a second one of the first epitaxial structures. In some embodiments, the first nanostructures, the gate strip, and the first epitaxial structures form a P-type transistor. In some embodiments, the method further includes forming an upper gate spacer on a sidewall of the gate strip and over the first nanostructures; forming a lower gate spacer interposing the gate strip and the first epitaxial structures, the lower gate spacers having a higher dielectric constant than the upper gate spacer.

In some embodiments, a semiconductor device includes first semiconductor sheets, first semiconductor sheets, a gate pattern, a first source pattern, a first drain pattern, a second source pattern, a second drain pattern, a first back-side contact, and a second back-side contact. The first semiconductor sheets are arranged in a vertical direction. The second semiconductor sheets are arranged in the vertical direction and laterally spaced apart from the first semiconductor sheets. The gate pattern is across the first and second semiconductor sheets from a top view. The first source pattern and a first drain pattern are on opposite sides of the first semiconductor sheets. The second source pattern and a second drain pattern are on opposite sides of the second semiconductor sheets. The first back-side contact is on a bottom of the first source pattern from a first cross sectional view. The second back-side contact extends from a bottom of the first drain pattern to a bottom of the second drain pattern from a second cross sectional view. In some embodiments, the semiconductor device further includes a front-side contact on a top of the first drain pattern. In some embodiments, a third back-side contact on a bottom of the second source pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a first transistor comprising a first channel region, a first gate structure surrounding the first channel region, and first source/drain regions on opposite sides of the first gate structure, wherein forming the first transistor comprises:
  forming a first one of the first source/drain regions in a first dielectric layer such that a sidewall of the first one of the first source/drain regions is adjacent a sidewall of the first dielectric layer;
forming a second transistor comprising a second channel region, a second gate structure surrounding the second channel region, and second source/drain regions on opposite sides of the second gate structure;
forming a front-side contact on a top end of a first one of the first source/drain regions of the first transistor; and
forming a first back-side contact extending from a bottom end of the first one of the first source/drain regions of the first transistor to a bottom end of a first one of the second source/drain regions of the second transistor, wherein forming the first back-side contact comprises:
  forming the first back-side contact in a second dielectric layer, distinct from the first dielectric layer, such that a sidewall of the first back-side contact is adjacent a sidewall of the second dielectric layer and an upper surface of the first back-side contact is adjacent a bottom surface of the first dielectric layer.

2. The method of claim 1, wherein the first back-side contact is in a position lower than the first and second gate structures of the first and second transistors.

3. The method of claim 1, wherein the first back-side contact has a rectangular profile from a top view and having a longitudinal axis in parallel with a longitudinal axis of the first gate structure.

4. The method of claim 1, further comprising:
forming a second back-side contact on a bottom end of a second one of the first source/drain regions of the first transistor.

5. The method of claim 4, further comprising:
forming a first back-side via on a bottom end of the second back-side contact and having an elliptical profile from a top view.

6. The method of claim 5, further comprising:
forming a first back-side metal line on a bottom end of the first back-side via and laterally extending in a first direction perpendicular to a lengthwise direction of the first gate structure of the first transistor.

7. The method of claim 6, further comprising:
forming a second back-side via on a bottom surface of the first back-side metal line and a second back-side metal line on a bottom end of the second back-side via and laterally extending in a second direction in parallel with the lengthwise direction of the first gate structure of the first transistor.

8. The method of claim 1, further comprising:
forming a second back-side contact on a bottom end of a second one of the second source/drain regions of the second transistor.

9. The method of claim 1, wherein the first and second transistors have opposite conductivity types.

10. The method of claim 1, wherein the first and second transistors form an inverter circuit.

11. A method, comprising:
forming a first transistor comprising a first channel region, a first gate structure surrounding the first channel region, and first source/drain regions on opposite sides of the first gate structure;
forming a second transistor comprising a second channel region, a second gate structure surrounding the second channel region, and second source/drain regions on opposite sides of the second gate structure;
forming a first back-side contact extending from a bottom end of a first one of the first source/drain regions of the first transistor to a bottom end of a first one of the second source/drain regions of the second transistor, wherein forming the first back-side contact comprises:
  forming an opening that exposes the bottom end of the first one of the first source/drain regions and the bottom end of the first one of the second source/drain regions; and
  depositing material of the first back-side contact in the opening; and
forming a second back-side contact on a bottom end of a second one of the first source/drain regions of the first transistor, wherein from a top view, the first back-side contact has a longer length than the second back-side contact in a lengthwise direction of the first gate structure.

12. The method of claim 11, wherein the second back-side contact non-overlaps the second source/drain regions.

13. The method of claim 11, further comprising:
forming a third back-side contact on a bottom end of a second one of the second source/drain regions.

14. The method of claim 13, further comprising:
forming a front-side contact on a top end of the first one of the first source/drain regions.

15. The method of claim 11, further comprising:
forming a first back-side via on the second back-side contact, wherein from the top view, the first back-side via has a first dimension extending in the lengthwise direction of the first gate structure, and a second dimension extending in a direction perpendicular to the lengthwise direction of the first gate structure, and the first dimension is greater than the second dimension.

16. The method of claim 15, further comprising:
forming a back-side metal line on a bottom end of the first back-side via; and
forming a second back-side via on a bottom surface of the back-side metal line, wherein from the top view, the second back-side via has a longitudinal axis in parallel with the lengthwise direction of the first gate structure.

17. The method of claim 11, further comprising:
forming an upper gate spacer on a sidewall of the first gate structure and over the first channel region; and
forming a lower gate spacer interposing the first gate structure and the first one of the first source/drain regions, wherein the lower gate spacer has a higher dielectric constant than the upper gate spacer.

18. A method, comprising:
forming a first transistor comprising a first channel region, a first gate structure surrounding the first channel region, and first source/drain regions on opposite sides of the first gate structure;
forming a second transistor comprising a second channel region, a second gate structure surrounding the second channel region, and second source/drain regions on opposite sides of the second gate structure;
forming a first back-side contact extending from a bottom end of a first one of the first source/drain regions of the first transistor to a bottom end of a first one of the second source/drain regions of the second transistor, wherein forming the first back-side contact comprises:
  forming a sidewall of the first back-side contact to be contiguous with a sidewall of a first one of the first source/drain regions; and forming a second back-side contact on a bottom end of a second one of the second source/drain regions of the first second transistor, wherein from a top view, the second back-side contact non-overlaps the first source/drain regions.

19. The method of claim 18, further comprising:
forming a front-side contact on a top end of the first one of the first source/drain regions.

20. The method of claim 18, wherein the first transistor is a p-type metal-oxide-semiconductor (PMOS) transistor, and the second transistor is a n-type metal-oxide-semiconductor (NMOS) transistor.

* * * * *